(12) United States Patent
Seo et al.

(10) Patent No.: US 11,997,861 B2
(45) Date of Patent: *May 28, 2024

(54) LIGHT-EMITTING ELEMENT WITH FLUORESCENT MATERIAL, DISPLAY DEVICE, ELECTRONIC DEVICE, AND LIGHTING DEVICE

(71) Applicant: Semiconductor Energy Laboratory Co., Ltd., Atsugi (JP)

(72) Inventors: Satoshi Seo, Kanagawa (JP); Nobuharu Ohsawa, Kanagawa (JP); Shunsuke Hosoumi, Kanagawa (JP); Takahiro Ishisone, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/100,054

(22) Filed: Jan. 23, 2023

(65) Prior Publication Data

US 2023/0157042 A1    May 18, 2023

Related U.S. Application Data

(63) Continuation of application No. 16/923,526, filed on Jul. 8, 2020, now Pat. No. 11,563,191, which is a (Continued)

(30) Foreign Application Priority Data

Aug. 29, 2014 (JP) ................. 2014-175163
Nov. 28, 2014 (JP) ................. 2014-240985
May 28, 2015 (JP) ................. 2015-108786

(51) Int. Cl.
*H10K 50/11* (2023.01)
*H10K 101/10* (2023.01)
*H10K 101/30* (2023.01)

(52) U.S. Cl.
CPC ......... *H10K 50/11* (2023.02); *H10K 2101/10* (2023.02); *H10K 2101/30* (2023.02)

(58) Field of Classification Search
CPC . H10K 50/11; H10K 2101/10; H10K 2101/30
See application file for complete search history.

(56) References Cited

U.S. PATENT DOCUMENTS 6,310,360 B1   10/2001   Forrest et al.
7,175,922 B2    2/2007   Jarikov et al.
(Continued)

FOREIGN PATENT DOCUMENTS

CN   103378300 A   10/2013
CN   103579530 A   2/2014
(Continued)

OTHER PUBLICATIONS

Yershin.H et al., Highly Efficient OLEDs with Phosphorescent Materials, 2008, pp. 1-97,283-309, Wiley-VCH Verlag GmbH & Co.
(Continued)

*Primary Examiner* — Lex H Malsawma
(74) *Attorney, Agent, or Firm* — Fish & Richardson P.C.

(57) ABSTRACT

A light-emitting element having high emission efficiency which includes a fluorescent material as a light-emitting substance is provided. A light-emitting element includes a pair of electrodes and an EL layer between the pair of electrodes. The EL layer includes a light-emitting layer. The light-emitting layer includes a host material and a guest material. The host material has a difference of more than 0 eV and less than or equal to 0.2 eV between a singlet excitation energy level and a triplet excitation energy level. The guest material is capable of emitting fluorescence. The triplet excitation energy level of the host material is higher than a triplet excitation energy level of the guest material.

19 Claims, 27 Drawing Sheets

Related U.S. Application Data continuation of application No. 16/513,869, filed on Jul. 17, 2019, now Pat. No. 10,714,700, which is a continuation of application No. 15/874,950, filed on Jan. 19, 2018, now Pat. No. 10,693,095, which is a continuation of application No. 14/837,083, filed on Aug. 27, 2015, now Pat. No. 9,911,936.

(56) References Cited

U.S. PATENT DOCUMENTS

| | | |
|---|---|---|
| 7,183,010 B2 | 2/2007 | Jarikov |
| 7,332,857 B2 | 2/2008 | Seo et al. |
| 7,597,967 B2 | 10/2009 | Kondakova et al. |
| 7,803,468 B2 | 9/2010 | Nariyuki et al. |
| 7,993,760 B2 | 8/2011 | Komori et al. |
| 8,034,465 B2 | 10/2011 | Liao et al. |
| 8,247,575 B2 | 8/2012 | Nomura et al. |
| 8,274,214 B2 | 9/2012 | Ikeda et al. |
| 8,293,921 B2 | 10/2012 | Nomura et al. |
| 8,334,061 B2 | 12/2012 | Nomura et al. |
| 8,343,639 B2 | 1/2013 | Seo et al. |
| 8,530,658 B2 | 9/2013 | Nomura et al. |
| 8,563,740 B2 | 10/2013 | Kawata et al. |
| 8,653,553 B2 | 2/2014 | Yamazaki et al. |
| 8,736,157 B2 | 5/2014 | Seo et al. |
| 8,810,125 B2 | 8/2014 | Ikeda et al. |
| 8,853,680 B2 | 10/2014 | Yamazaki et al. |
| 8,889,858 B2 | 11/2014 | Inoue et al. |
| 8,916,897 B2 | 12/2014 | Yamazaki et al. |
| 8,963,127 B2 | 2/2015 | Pieh et al. |
| 8,969,579 B2 | 3/2015 | Kawata et al. |
| 8,969,854 B2 | 3/2015 | Takemura. et al. |
| 8,981,355 B2 | 3/2015 | Seo |
| 8,981,393 B2 | 3/2015 | Seo et al. |
| 8,993,129 B2 | 3/2015 | Endo et al. |
| 8,994,013 B2 | 3/2015 | Seo |
| 8,994,263 B2 | 3/2015 | Shitagaki et al. |
| 9,048,398 B2 | 6/2015 | Yamazaki et al. |
| 9,054,317 B2 | 6/2015 | Monkman et al. |
| 9,059,414 B2 | 6/2015 | Inoue et al. |
| 9,059,421 B2 | 6/2015 | Seo et al. |
| 9,059,430 B2 | 6/2015 | Seo et al. |
| 9,065,066 B2 | 6/2015 | Seo et al. |
| 9,076,976 B2 | 7/2015 | Seo et al. |
| 9,082,994 B2 | 7/2015 | Watabe et al. |
| 9,099,617 B2 | 8/2015 | Yamazaki et al. |
| 9,159,942 B2 | 10/2015 | Seo et al. |
| 9,175,213 B2 | 11/2015 | Seo et al. |
| 9,219,242 B2 | 12/2015 | Ogiwara et al. |
| 9,276,228 B2 * | 3/2016 | Seo .................. H10K 85/6572 |
| 9,299,944 B2 | 3/2016 | Seo et al. |
| 9,356,250 B2 | 5/2016 | Ohsawa et al. |
| 9,559,313 B2 | 1/2017 | Seo et al. |
| 9,604,928 B2 | 3/2017 | Shitagaki et al. |
| 9,608,209 B2 | 3/2017 | Ogiwara et al. |
| 9,783,734 B2 | 10/2017 | Adachi et al. |
| 9,905,782 B2 | 2/2018 | Inoue et al. |
| 9,911,936 B2 | 3/2018 | Seo et al. |
| 9,947,885 B2 | 4/2018 | Seo et al. |
| 10,032,998 B2 | 7/2018 | Ogiwara et al. |
| 10,177,329 B2 | 1/2019 | Kim et al. |
| 10,193,086 B2 | 1/2019 | Inoue et al. |
| 10,361,388 B2 | 7/2019 | Mitsumori et al. |
| 10,461,264 B2 | 10/2019 | Ogiwara et al. |
| 10,658,604 B2 | 5/2020 | Mitsumori et al. |
| 10,700,291 B2 | 6/2020 | Inoue et al. |
| 10,910,576 B2 | 2/2021 | Mitsumori et al. |
| 11,152,583 B2 | 10/2021 | Kim et al. |
| 11,462,702 B2 | 10/2022 | Mitsumori et al. |
| 11,600,789 B2 | 3/2023 | Inoue et al. |
| 11,690,238 B2 | 6/2023 | Ohsawa et al. |
| 2002/0055014 A1 | 5/2002 | Okada et al. |
| 2003/0175553 A1 | 9/2003 | Thompson et al. |
| 2005/0048310 A1 | 3/2005 | Cocchi et al. |
| 2005/0221116 A1 | 10/2005 | Cocchi et al. |
| 2006/0134464 A1 | 6/2006 | Nariyuki |
| 2006/0279204 A1 | 12/2006 | Forrest et al. |
| 2006/0280967 A1 * | 12/2006 | Tada ...................... C09K 11/06 313/506 |
| 2007/0090756 A1 | 4/2007 | Okada et al. |
| 2007/0134514 A1 | 6/2007 | Kondakov et al. |
| 2012/0119197 A1 | 5/2012 | Nishimura et al. |
| 2012/0205632 A1 | 8/2012 | Shitagaki et al. |
| 2012/0205687 A1 | 8/2012 | Yamazaki et al. |
| 2012/0217487 A1 | 8/2012 | Yamazaki et al. |
| 2012/0242219 A1 | 9/2012 | Seo et al. |
| 2012/0274201 A1 | 11/2012 | Seo et al. |
| 2012/0277427 A1 | 11/2012 | Inoue et al. |
| 2013/0048964 A1 | 2/2013 | Takeda et al. |
| 2013/0112961 A1 | 5/2013 | Seo et al. |
| 2013/0277656 A1 | 10/2013 | Seo et al. |
| 2013/0292656 A1 | 11/2013 | Seo et al. |
| 2013/0306945 A1 | 11/2013 | Seo |
| 2014/0034926 A1 | 2/2014 | Matsubara et al. |
| 2014/0034927 A1 | 2/2014 | Seo et al. |
| 2014/0034929 A1 | 2/2014 | Hamada et al. |
| 2014/0034930 A1 | 2/2014 | Seo et al. |
| 2014/0034931 A1 | 2/2014 | Inoue et al. |
| 2014/0034932 A1 | 2/2014 | Seo et al. |
| 2014/0042469 A1 | 2/2014 | Seo et al. |
| 2014/0061594 A1 | 3/2014 | Forrest et al. |
| 2014/0061604 A1 | 3/2014 | Seo et al. |
| 2014/0084274 A1 | 3/2014 | Yamazaki et al. |
| 2014/0191220 A1 | 7/2014 | Watabe et al. |
| 2014/0252338 A1 | 9/2014 | Seo et al. |
| 2014/0284578 A1 | 9/2014 | Takeda et al. |
| 2014/0319492 A1 | 10/2014 | Seo et al. |
| 2014/0340888 A1 | 11/2014 | Ishisone et al. |
| 2015/0001502 A1 | 1/2015 | Seo et al. |
| 2015/0021579 A1 | 1/2015 | Yamazaki et al. |
| 2015/0053958 A1 | 2/2015 | Ishisone et al. |
| 2015/0069352 A1 | 3/2015 | Kim et al. |
| 2015/0102331 A1 | 4/2015 | Seo et al. |
| 2015/0155510 A1 | 6/2015 | Kawata et al. |
| 2015/0155511 A1 | 6/2015 | Ohsawa et al. |
| 2015/0188068 A1 | 7/2015 | Seo et al. |
| 2015/0188070 A1 | 7/2015 | Ogiwara et al. |
| 2015/0188072 A1 | 7/2015 | Seo |
| 2015/0274762 A1 | 10/2015 | Li et al. |
| 2017/0025630 A1 | 1/2017 | Seo et al. |
| 2017/0194585 A1 | 7/2017 | Yan |
| 2017/0271610 A1 | 9/2017 | Takahashi |
| 2018/0226600 A1 | 8/2018 | Seo et al. |
| 2018/0309068 A1 | 10/2018 | Ogiwara et al. |
| 2019/0067615 A1 | 2/2019 | Seo et al. |
| 2019/0267564 A1 | 8/2019 | Seo et al. |
| 2020/0020868 A1 | 1/2020 | Ogiwara et al. |
| 2021/0408421 A1 | 12/2021 | Kim et al. |
| 2023/0109651 A1 | 4/2023 | Mitsumori et al. |
| 2023/0210005 A1 | 6/2023 | Inoue et al. |

FOREIGN PATENT DOCUMENTS

| | | |
|---|---|---|
| CN | 103985822 A | 8/2014 |
| EP | 1202608 A | 5/2002 |
| EP | 2876698 A | 5/2015 |
| EP | 3144997 A | 3/2017 |
| EP | 3249711 A | 11/2017 |
| JP | 2006-128636 A | 5/2006 |
| JP | 2008-288344 A | 11/2008 |
| JP | 2012-193352 A | 10/2012 |
| JP | 2013-236058 A | 11/2013 |
| JP | 2013-237662 A | 11/2013 |
| JP | 2013-258402 A | 12/2013 |
| JP | 2014-022666 A | 2/2014 |
| JP | 2014-045179 A | 3/2014 |
| JP | 2014-209611 A | 11/2014 |
| JP | 2017-519096 | 7/2017 |
| JP | 2017-168803 A | 9/2017 |
| JP | 2017-175128 A | 9/2017 |
| JP | 2017-212443 A | 11/2017 |
| JP | 2019-083314 A | 5/2019 |
| KR | 2013-0115027 A | 10/2013 |
| KR | 2013-0116185 A | 10/2013 |

(56) References Cited

FOREIGN PATENT DOCUMENTS

| | | |
|---|---|---|
| KR | 2014-0018133 A | 2/2014 |
| KR | 2016-0148663 A | 12/2016 |
| TW | 201347265 | 11/2013 |
| TW | 201417365 | 5/2014 |
| TW | 201735392 | 10/2017 |
| WO | WO-2012/133188 | 10/2012 |
| WO | WO-2013/154342 | 10/2013 |
| WO | WO-2014/013947 | 1/2014 |
| WO | WO-2014/157599 | 10/2014 |
| WO | WO-2015/022974 | 2/2015 |
| WO | WO-2015/180524 | 12/2015 |
| WO | WO-2017/013534 | 1/2017 |
| WO | WO-2017/158475 | 9/2017 |
| WO | WO-2017/199163 | 11/2017 |
| WO | WO-2019/082024 | 5/2019 |

OTHER PUBLICATIONS

Tokito.S et al., "Improvement in performance by doping", Organic EL Display, Aug. 20, 2004, pp. 67-99, Ohmsha.

Jeon.W et al., "Ideal host and guest system in phosphorescent OLEDs", Organic Electronics, 2009, vol. 10, pp. 240-246, Elsevier.

Su.S et al., "RGB Phosphorescent Organic Light-Emitting Diodes by Using Host Materials with Heterocyclic Cores:Effect of Nitrogen Atom Orientations", Chem. Mater. (Chemistry of Materials), 2011, vol. 23, No. 2, pp. 274-284.

Rausch.A et al., "Matrix Effects on the Triplet State of the OLED Emitter Ir(4,6-dFppy)2(pic)(Flrpic):Investigations by High-Resolution Optical Spectroscopy", Inorg. Chem. (Inorganic Chemistry), 2009, vol. 48, No. 5, pp. 1928-1937.

Gong.X et al., "Phosphorescence from iridium complexes doped into polymer blends", J. Appl. Phys. (Journal of Applied Physics), Feb. 1, 2004, vol. 95, No. 3, pp. 948-953.

Zhao.Q et al., "Synthesis and Photophysical, Electrochemical, and Electrophosphorescent Properties of a Series of Iridium(III) Complexes Based on Quinoline Derivatives and Different β-Diketonate Ligands", Organometallics, Jun. 14, 2006, vol. 25, No. 15, pp. 3631-3638.

Hino.Y et al., "Red Phosphorescent Organic Light-Emitting Diodes Using Mixture System of Small-Molecule and Polymer Host", Jpn. J. Appl. Phys. (Japanese Journal of Applied Physics), Apr. 21, 2005, vol. 44, No. 4B, pp. 2790-2794.

Tsuboyama.A et al.. "Homoleptic Cyclometalated Iridium Complexes with Highly Efficient Red Phosphorescence and Application to Organic Light-Emitting Diode", J. Am. Chem. Soc. (Journal of the American Chemical Society), 2003, vol. 125, No. 42, pp. 12971-12979.

Kondakova.M et al., "High-efficiency, low-voltage phosphorescent organic light-emitting diode devices with mixed host", J. Appl. Phys. (Journal of Applied Physics), Nov. 4, 2008, vol. 104, pp. 094501-1-094501-17.

Chen.F et al., "Triplet Exciton Confinement in Phosphorescent Polymer Light-Emitting Diodes", Appl. Phys. Lett. (Applied Physics Letters), Feb. 17, 2003, vol. 82, No. 7, pp. 1006-1008.

Lee.J et al., "Stabilizing the efficiency of phosphorescent organic light-emitting diodes", SPIE Newsroom, Apr. 21, 2008, pp. 1-3.

Tokito.S et al., "Confinement of Triplet Energy on Phosphorescent Molecules for Highly-Efficient Organic Blue-Light-Emitting Devices", Appl. Phys. Lett. (Applied Physics Letters), Jul. 21, 2003, vol. 83, No. 3, pp. 569-571.

Endo.A et al., "Efficient Up-Conversion of Triplet Excitons Into a Singlet State and Its Application for Organic Light Emitting Diodes", Appl. Phys. Lett. (Applied Physics Letters), Feb. 24, 2011, vol. 98, No. 8, pp. 083302-1-083302-3.

Itano.K et al., "Exciplex formation at the organic solid-state interface: Yellow emission in organic light-emitting diodes using green-fluorescent tris(8-quinolinolato)aluminum and hole-transporting molecular materials with low ionization potentials", Appl. Phys. Lett. (Applied Physics Letters), Feb. 9, 1998, vol. 72, No. 6, pp. 636-638.

Park.Y et al., "Efficient triplet harvesting by fluorescent molecules through exciplexes for high efficiency organic light-emitting diodes", Appl. Phys. Lett. (Applied Physics Letters), Apr. 18, 2013, vol. 102, No. 15, pp. 153306-1-153306-5.

Endo.A et al., "Thermally Activated Delayed Fluorescence from Sn4+-Porphyrin Complexes and Their Application to Organic Light Emitting Diodes—A Novel Mechanism for Electroluminescence", Adv. Mater. (Advanced Materials), Aug. 12, 2009, vol. 21, No. 47, pp. 4802-4806.

\* cited by examiner

LIGHT-EMITTING ELEMENT WITH FLUORESCENT MATERIAL, DISPLAY DEVICE, ELECTRONIC DEVICE, AND LIGHTING DEVICE

CROSS-REFERENCE TO RELATED APPLICATIONS

This application is a continuation of U.S. application Ser. No. 16/923,526, filed Jul. 8, 2020, now allowed, which is a continuation of U.S. application Ser. No. 16/513,869, filed Jul. 17, 2019, now U.S. Pat. No. 10,714,700, which is a continuation of U.S. application Ser. No. 15/874,950, filed Jan. 19, 2018, now U.S. Pat. No. 10,693,095, which is a continuation of U.S. application Ser. No. 14/837,083, filed Aug. 27, 2015, now U.S. Pat. No. 9,911,936, which claims the benefit of foreign priority applications filed in Japan as Serial No. 2014-175163 on Aug. 29, 2014, Serial No. 2014-240985 on Nov. 28, 2014, and Serial No. 2015-108786 on May 28, 2015, all of which are incorporated by reference.

BACKGROUND OF THE INVENTION

1. Field of the Invention

One embodiment of the present invention relates to a light-emitting element in which a light-emitting layer capable of providing light emission by application of an electric field is provided between a pair of electrodes, and also relates to a display device, an electronic device, and a lighting device including the light-emitting element.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

2. Description of the Related Art

In recent years, research and development have been extensively conducted on light-emitting elements utilizing electroluminescence (EL). In a basic structure of these light-emitting elements, a layer containing a light-emitting substance (an EL layer) is provided between a pair of electrodes. By application of a voltage between the electrodes of this element, light emission from the light-emitting substance can be obtained.

Since the above light-emitting element is a self-luminous type, a display device using this light-emitting element has advantages such as high visibility, no necessity of a backlight, and low power consumption. The display device using the light-emitting element also has advantages in that it can be manufactured to be thin and lightweight and has high response speed.

A variety of studies have been conducted to improve the emission efficiency of light-emitting elements. For example, a method has been proposed for a light-emitting element including a thermally activated delayed fluorescence (TADF) material and a material which emits fluorescence (hereinafter also referred to as a fluorescent material) to transfer energy from the $S_1$ of the TADF material to the $S_1$ of the fluorescent material (see Patent Document 1).

REFERENCE

[Patent Document 1] Japanese Published Patent Application No. 2014-45179

SUMMARY OF THE INVENTION

In order to increase the emission efficiency of a light-emitting element including a fluorescent material as a light-emitting substance, it is important not only to generate a singlet excited state from a triplet excited state but also to obtain light emission efficiently from the singlet excited state, that is, to increase fluorescence quantum efficiency.

An object of one embodiment of the present invention is to provide a light-emitting element having high emission efficiency which includes a fluorescent material as a light-emitting substance. Another object of one embodiment of the present invention is to provide a novel light-emitting element. Another object of one embodiment of the present invention is to provide a novel light-emitting element with high emission efficiency and low power consumption. Another object is to provide a novel display device.

Note that the descriptions of the above objects do not disturb the existence of other objects. In one embodiment of the present invention, there is no need to achieve all the objects. Other objects will be apparent from and can be derived from the descriptions of the specification and the like.

One embodiment of the present invention is a light-emitting element which includes a pair of electrodes and an EL layer between the pair of electrodes. The EL layer includes a light-emitting layer. The light-emitting layer includes a host material and a guest material. The host material has a difference of more than 0 eV and less than or equal to 0.2 eV between a singlet excitation energy level and a triplet excitation energy level. The guest material is capable of emitting fluorescence. The triplet excitation energy level of the host material is higher than a triplet excitation energy level of the guest material.

Another embodiment of the present invention is a light-emitting element which includes a pair of electrodes and an EL layer between the pair of electrodes. The EL layer includes a light-emitting layer. The light-emitting layer includes a host material and a guest material. The host material is capable of exhibiting thermally activated delayed fluorescence at room temperature. The guest material is capable of emitting fluorescence. A thermally activated delayed fluorescence emission energy of the host material is higher than a phosphorescence emission energy of the guest material.

Another embodiment of the present invention is a light-emitting element which includes a pair of electrodes and an EL layer between the pair of electrodes. The EL layer includes a light-emitting layer. The light-emitting layer includes a host material and a guest material. The host material includes a first organic compound and a second organic compound. A combination of the first organic compound and the second organic compound forms an exciplex. The exciplex has a difference of more than 0 eV and less than or equal to 0.2 eV between a singlet excitation energy level and a triplet excitation energy level. The guest material is capable of emitting fluorescence. The triplet excitation energy level of the exciplex is higher than a triplet excitation energy level of the guest material.

Another embodiment of the present invention is a light-emitting element which includes a pair of electrodes and an EL layer between the pair of electrodes. The EL layer includes a light-emitting layer. The light-emitting layer includes a host material and a guest material. The host material includes a first organic compound and a second organic compound. A combination of the first organic compound and the second organic compound forms an exciplex. The exciplex is capable of exhibiting thermally activated delayed fluorescence at room temperature. The guest material is capable of emitting fluorescence. A thermally activated delayed fluorescence emission energy of the exciplex is higher than a phosphorescence emission energy of the guest material.

Another embodiment of the present invention is a light-emitting element which includes a pair of electrodes and an EL layer between the pair of electrodes. The EL layer includes a light-emitting layer. The light-emitting layer includes a host material and a guest material. The host material includes a first organic compound and a second organic compound. A combination of the first organic compound and the second organic compound forms an exciplex. The exciplex has a difference of more than 0 eV and less than or equal to 0.2 eV between a singlet excitation energy level and a triplet excitation energy level. The guest material is capable of emitting fluorescence. The triplet excitation energy level of each of the first organic compound and the second organic compound is higher than the triplet excitation energy level of the exciplex.

Another embodiment of the present invention is a light-emitting element which includes a pair of electrodes and an EL layer between the pair of electrodes. The EL layer includes a light-emitting layer. The light-emitting layer includes a host material and a guest material. The host material includes a first organic compound and a second organic compound. A combination of the first organic compound and the second organic compound forms an exciplex. The exciplex is capable of exhibiting thermally activated delayed fluorescence. The guest material is capable of emitting fluorescence. A phosphorescence emission energy of each of the first organic compound and the second organic compound is higher than a thermally activated delayed fluorescence emission energy of the exciplex.

Another embodiment of the present invention is a light-emitting element which includes a pair of electrodes and an EL layer between the pair of electrodes. The EL layer includes a light-emitting layer. The light-emitting layer includes a host material and a guest material. The host material includes a first organic compound and a second organic compound. A combination of the first organic compound and the second organic compound forms an exciplex. The exciplex has a difference of more than 0 eV and less than or equal to 0.2 eV between a singlet excitation energy level and a triplet excitation energy level. The guest material is capable of emitting fluorescence. The triplet excitation energy level of the exciplex is higher than a triplet excitation energy level of the guest material. The triplet excitation energy level of each of the first organic compound and the second organic compound is higher than the triplet excitation energy level of the exciplex.

Another embodiment of the present invention is a light-emitting element which includes a pair of electrodes and an EL layer between the pair of electrodes. The EL layer includes a light-emitting layer. The light-emitting layer includes a host material and a guest material. The host material includes a first organic compound and a second organic compound. A combination of the first organic compound and the second organic compound forms an exciplex. The exciplex is capable of exhibiting thermally activated delayed fluorescence. The guest material is capable of emitting fluorescence. A thermally activated delayed fluorescence emission energy of the exciplex is higher than a phosphorescence emission energy of the guest material. The phosphorescence emission energy of each of the first organic compound and the second organic compound is higher than the thermally activated delayed fluorescence emission energy of the exciplex.

In the above embodiment, it is preferable that the weight ratio of the guest material to the host material be more than 0 and less than or equal to 0.05.

In the above embodiment, it is preferable that the difference between the triplet excitation energy level of the first organic compound and the triplet excitation energy level of the second organic compound be less than 0.4 eV.

In the above embodiment, it is preferable that one of the first organic compound and the second organic compound have a condensed heterocyclic skeleton and that the condensed heterocyclic skeleton have a diazine skeleton. Alternatively, it is preferable that one of the first organic compound and the second organic compound have a carbazole skeleton and a condensed heterocyclic skeleton and that the condensed heterocyclic skeleton have a diazine skeleton. Alternatively, it is preferable that one of the first organic compound and the second organic compound have a carbazole skeleton and a condensed heterocyclic skeleton, that the condensed heterocyclic skeleton have a diazine skeleton, and that the carbazole skeleton and the condensed heterocyclic skeleton be bonded to each other through an arylene group. It is more preferable that the 9-position of the carbazole skeleton and the condensed heterocyclic skeleton be bonded to each other through an arylene group. Alternatively, it is preferable that one of the first organic compound and the second organic compound have a carbazole skeleton and a benzofuropyrimidine skeleton and that the 9-position of the carbazole skeleton and the benzofuropyrimidine skeleton be bonded to each other through an arylene group.

In the above embodiment, it is preferable that one of the first organic compound and the second organic compound have a carbazole skeleton and an aromatic amine skeleton and that the 9-position of the carbazole skeleton and the aromatic amine skeleton be bonded to each other or be bonded to each other through an arylene group.

In the above embodiment, it is preferable that the EL layer further include one selected from a hole-injection layer, a hole-transport layer, an electron-transport layer, and an electron-injection layer.

Another embodiment of the present invention is a display device which includes the light-emitting element in the above embodiment and a color filter. Another embodiment of the present invention is an electronic device which includes the display device and a housing or a touch sensor. Another embodiment of the present invention is a lighting device which includes the light-emitting element in the above embodiment and a housing or a touch sensor.

In one embodiment of the present invention, a light-emitting element having high emission efficiency which includes a fluorescent material as a light-emitting substance can be provided. In another embodiment of the present invention, a novel light-emitting element can be provided. In another embodiment of the present invention, a novel light-emitting element with high emission efficiency and low power consumption can be provided. In another embodiment of the present invention, a novel display device can be provided.

Note that the descriptions of these effects do not disturb the existence of other effects. In one embodiment of the present invention, there is no need to achieve all the above effects. Other effects will be apparent from and can be derived from the descriptions of the specification, the drawings, the claims, and the like.

DETAILED DESCRIPTION OF THE INVENTION

Figure 1A:
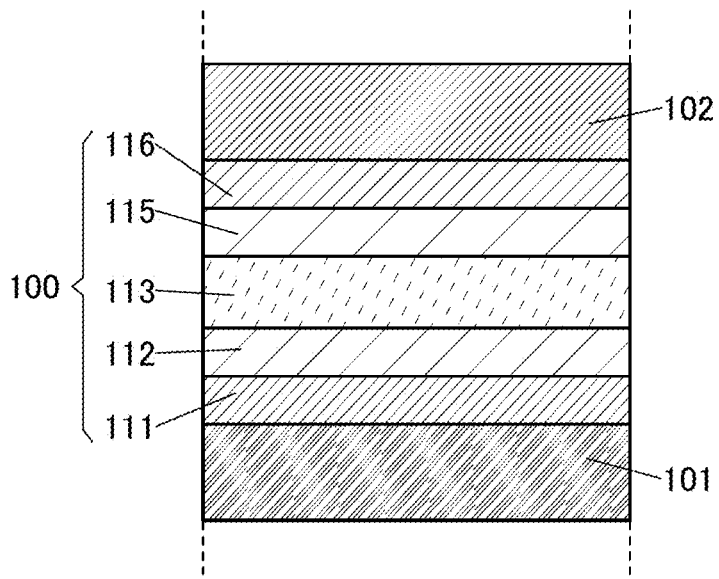
FIGS. 1A to 1C are a schematic cross-sectional view of a light-emitting element, a schematic cross-sectional view of a light-emitting layer, and a schematic diagram illustrating the correlation of energy levels.

Embodiments of the present invention will be described below with reference to the drawings. Note that the present invention is not limited to the following description, and various changes and modifications can be made without departing from the spirit and scope of the present invention. Therefore, the present invention should not be construed as being limited to the description in the following embodiments.

Note that the position, size, range, or the like of each component illustrated in drawings and the like is not accurately represented in some cases for easy understanding. Therefore, the disclosed invention is not necessarily limited to the position, size, range, or the like disclosed in the drawings and the like.

Ordinal numbers such as "first" and "second" in this specification and the like are used for convenience and do not denote the order of steps or the stacking order of layers in some cases. Therefore, for example, the term "first" can be replaced with the term "second", "third", or the like as appropriate. In addition, the ordinal numbers in this specification and the like are not necessarily the same as the ordinal numbers used to specify one embodiment of the present invention.

In the description of modes of the present invention in this specification and the like with reference to the drawings, the same components in different diagrams are commonly denoted by the same reference numeral in some cases.

In this specification and the like, the terms "film" and "layer" can be interchanged with each other. For example, the term "conductive layer" can be changed into the term "conductive film" in some cases, and the term "insulating film" can be changed into the term "insulating layer" in some cases.

In this specification and the like, a fluorescent material refers to a material that emits light in the visible light region when the level of the lowest singlet excited state ($S_1$ level) relaxes to the ground state. A phosphorescent material refers to a material that emits light in the visible light region at room temperature when the level of the lowest triplet excited state ($T_1$ level) relaxes to the ground state. That is, a phosphorescent material refers to a material that can convert triplet excitation energy into visible light.

In this specification and the like, a thermally activated delayed fluorescence emission energy refers to an emission peak (including a shoulder) on the shortest wavelength side of thermally activated delayed fluorescence. In this specification and the like, a phosphorescence emission energy or a triplet excitation energy refers to a phosphorescence emission peak (including a shoulder) on the shortest wavelength side of phosphorescence emission. Note that the phosphorescence emission can be observed by time-resolved photoluminescence in a low-temperature (e.g., 10 K) environment.

Note that in this specification and the like, room temperature refers to a temperature in the range from 0° C. to 40° C.

Embodiment 1

In this embodiment, a light-emitting element according to one embodiment of the present invention will be described below with reference to FIGS. 1A to 1C, FIGS. 2A and 2B, FIGS. 3A and 3B, and FIGS. 4A and 4B.

1. Structure Example 1 of Light-Emitting Element

First, a structure of a light-emitting element of one embodiment of the present invention will be described below with reference to FIGS. 1A to 1C.

FIG. 1A is a schematic cross-sectional view of a light-emitting element 150 of one embodiment of the present invention.

The light-emitting element 150 includes an EL layer 100 between a pair of electrodes (an electrode 101 and an electrode 102). The EL layer 100 includes at least a light-emitting layer 113. Although description is made in this embodiment assuming that the electrode 101 is an anode and the electrode 102 is a cathode, the electrodes may be interchanged in the light-emitting element 150.

The EL layer 100 illustrated in FIG. 1A includes a hole-injection layer 111, a hole-transport layer 112, an electron-transport layer 115, and an electron-injection layer 116 in addition to the light-emitting layer 113. Note that the structure of the EL layer 100 is not limited to the structure illustrated in FIG. 1A, and at least one selected from the hole-injection layer 111, the hole-transport layer 112, the electron-transport layer 115, and the electron-injection layer 116 is included. Alternatively, the EL layer 100 may include a functional layer which is capable of lowering a carrier injection barrier, improving a carrier-transport property, or suppressing the occurrence of quenching due to the electrode.

Figure 1B:
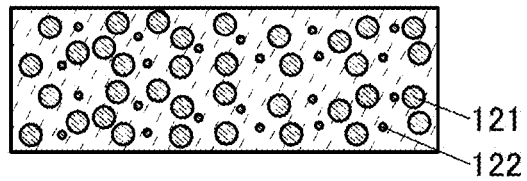

FIG. 1B is a schematic cross-sectional view of an example of the light-emitting layer 113 in FIG. 1A. The light-emitting layer 113 in FIG. 1B includes a host material 121 and a guest material 122.

It is preferable that the host material 121 have a difference of more than 0 eV and less than or equal to 0.2 eV between a singlet excitation energy level and a triplet excitation energy level. It is particularly preferable that the host material 121 be a substance which exhibits thermally activated delayed fluorescence at room temperature. Note that the host material 121 may be composed of a single material or may include a plurality of materials. The guest material 122 may be a light-emitting organic compound, and the light-emitting organic compound is preferably a substance capable of emitting fluorescence (hereinafter also referred to as a fluorescent material).

An example in which a fluorescent material is used as the guest material 122 will be described below. Note that the guest material 122 may be read as the fluorescent material.

1-1. Emission Mechanism of Light-Emitting Element

First, an emission mechanism of the light-emitting element 150 will be described below.

In the light-emitting element 150 of one embodiment of the present invention, voltage application between a pair of electrodes (the electrodes 101 and 102) causes electrons and holes to be injected from the cathode and the anode, respectively, into the EL layer 100 and thus current flows. By recombination of the injected electrons and holes, the guest material 122 in the light-emitting layer 113 of the EL layer 100 is brought into an excited state to provide light emission.

Note that light emission from the guest material 122 can be obtained through the following two processes:
(α) direct recombination process; and
(β) energy transfer process.

1-2. (α) Direct Recombination Process

Carriers (electrons and holes) are recombined in the guest material 122, and the guest material 122 is brought into an excited state. In the case where the excited state of the guest material 122 is a singlet excited state, fluorescence is obtained. In contrast, in the case where the excited state of the guest material 122 is a triplet excited state, thermal deactivation occurs.

In (α) direct recombination process, high emission efficiency can be obtained when the fluorescence quantum efficiency of the guest material 122 is high.

1-3. (β) Energy Transfer Process

Carriers are recombined in the host material 121, and the host material 121 is brought into an excited state. In the case where the excited state of the host material 121 is a singlet excited state and the singlet excitation energy level of the host material 121 is higher than the singlet excitation energy level of the guest material 122, excitation energy is transferred from the host material 121 to the guest material 122, and thus the guest material 122 is brought into a singlet excited state. Fluorescence is obtained from the guest material 122 in the singlet excited state. Therefore, the singlet excitation energy level of the host material 121 is preferably higher than the singlet excitation energy level of the guest material 122.

Note that since direct transition of the guest material 122 from a singlet ground state to a triplet excited state is forbidden, energy transfer from the host material 121 in the singlet excited state to the guest material 122 in the triplet excited state is unlikely to be a main energy transfer process; therefore, a description thereof is omitted here. In other words, energy transfer from the host material 121 in the singlet excited state to the guest material 122 in the singlet excited state is important as represented by the following general formula (G1).

$$^{1}H^{*}+{}^{1}G\rightarrow{}^{1}H+{}^{1}G^{*} \quad\quad (G1)$$

Note that in the general formula (G1), $^{1}H^{*}$ represents the singlet excited state of the host material 121; $^{1}G$ represents the singlet ground state of the guest material 122; $^{1}H$ represents the singlet ground state of the host material 121; and $^1G^*$ represents the singlet excited state of the guest material 122.

Figure 1C:
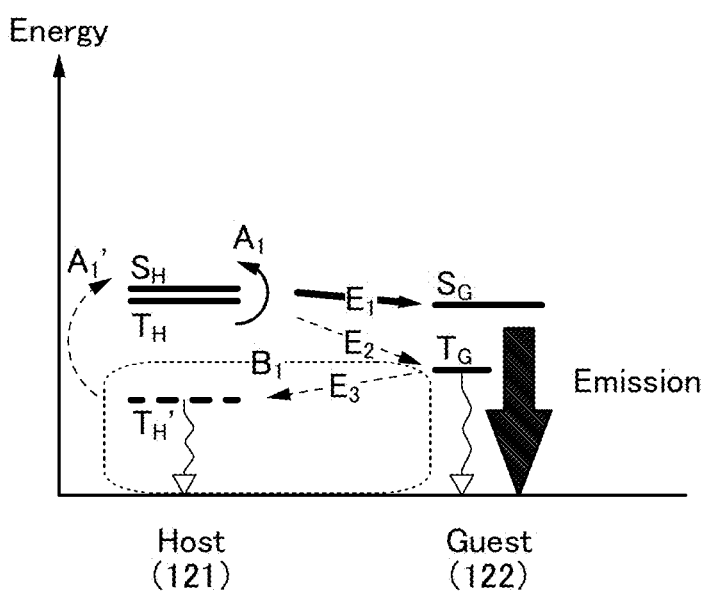

Next, in order to describe the energy transfer process of the host material 121 and the guest material 122, a schematic diagram illustrating the correlation of energy levels is shown in FIG. 1C. The following explains what terms and signs in FIG. 1C represent:

Host (121): the host material 121;
Guest (122): the guest material 122 (fluorescent material);
$S_H$: the level of the lowest singlet excitation energy of the host material 121;
$T_H$: the level of the lowest triplet excitation energy of the host material 121;
$S_G$: the level of the lowest singlet excitation energy of the guest material 122 (fluorescent material); and
$T_G$: the level of the lowest triplet excitation energy of the guest material 122 (fluorescent material).

Even in the case where the exited state of the host material 121 is the triplet excited state, when the $S_H$ of the host material 121 is higher than the $S_G$ of the guest material 122, fluorescence is obtained through the following two processes.

The host material 121 has a small energy difference of less than or equal to 0.2 eV between the singlet excitation energy level and the triplet excitation energy level. Therefore, as for a first process, excitation energy is transferred from the $T_H$ to the $S_H$ of the host material 121 by reverse intersystem crossing (upconversion) as shown by a route $A_1$ in FIG. 1C.

As for a subsequent second process, excitation energy is transferred from the $S_H$ of the host material 121 to the $S_G$ of the guest material 122 as shown by a route $E_1$ in FIG. 1C, whereby the guest material 122 is brought into the singlet excited state. Fluorescence is obtained from the guest material 122 in the singlet excited state.

The above-described first and second processes are represented by the following general formula (G2).

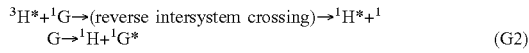

$$^3H^* + {}^1G \rightarrow \text{(reverse intersystem crossing)} \rightarrow {}^1H^* + {}^1G \rightarrow {}^1H + {}^1G^* \quad (G2)$$

Note that in the general formula (G2), $^3H^*$ represents the triplet excited state of the host material 121; $^1G$ represents the singlet ground state of the guest material 122; $^1H^*$ represents the singlet excited state of the host material 121; $^1H$ represents the singlet ground state of the host material 121; and $^1G^*$ represents the singlet excited state of the guest material 122.

As represented by the general formula (G2), the singlet excited state ($^1H^*$) of the host material 121 is generated from the triplet excited state ($^3H^*$) of the host material 121 by reverse intersystem crossing, and then energy is transferred to the guest material 122 in the singlet excited state ($^1G^*$).

When all the energy transfer processes described above in (β) energy transfer process occur efficiently, both the triplet excitation energy and the singlet excitation energy of the host material 121 are efficiently converted into the singlet excited state ($^1G^*$) of the guest material 122. Thus, high-efficiency light emission is possible.

However, when the host material 121 is deactivated by emitting excitation energy as light or heat before the excitation energy is transferred from the singlet excited state and the triplet excited state of the host material 121 to the singlet excited state of the guest material 122, the emission efficiency of the light-emitting element 150 is decreased. For example, in the case where the level of the lowest triplet excitation energy of the host material 121 is lower than the $T_G$ of the guest material 122 as indicated by broken line $B_1$ in FIG. 1C (shown as "$T_H$'" in FIG. 1C), the excitation energy of the guest material 122 is transferred from the $T_G$ of the guest material 122 to the $T_H$' of the host material 121 as shown by a route $E_3$ in FIG. 1C. In that case, since there is a large energy difference between $T_H$' and $S_H$, reverse intersystem crossing shown by the route $A_1$' in FIG. 1C and the subsequent energy transfer process shown by the route $E_1$, are unlikely to occur, resulting in thermal deactivation of the excitation energy of the guest material 122. Therefore, the generation efficiency of the singlet excited state of the guest material 122 is decreased. Thus, it is preferable that the $T_H$ of the host material 121 be higher than the $T_G$ of the guest material 122. That is, in the case where the host material 121 is a substance which exhibits thermally activated delayed fluorescence, it is preferable that the thermally activated delayed fluorescence emission energy of the host material 121 be higher than the phosphorescence emission energy of the guest material 122.

In the case where excitation energy is transferred from the $T_H$ of the host material 121 to the $T_G$ of the guest material 122 as shown by a route $E_2$ in FIG. 1C, the excitation energy is also thermally deactivated. Therefore, it is preferable that the energy transfer process shown by the route $E_2$ in FIG. 1C be less likely to occur because the generation efficiency of the triplet excited state of the guest material 122 can be decreased and the occurrence of thermal deactivation can be reduced. To achieve this, it is preferable that the weight ratio of the guest material 122 to the host material 121 be low. Specifically, the weight ratio of the guest material 122 to the host material 121 is preferably more than 0 and less than or equal to 0.05, more preferably more than 0 and less than or equal to 0.03.

Note that when the direct recombination process in the guest material 122 is dominant, a large number of triplet excited states of the guest material 122 are generated in the light-emitting layer, resulting in a decreased emission efficiency due to thermal deactivation. That is, it is preferable that the probability of (β) energy transfer process be higher than that of (α) direct recombination process because the occurrence of thermal deactivation when the excited state of the guest material 122 is a triplet excited state can be reduced. To achieve this, it is again preferable that the weight ratio of the guest material 122 to the host material 121 be low. Specifically, the weight ratio of the guest material 122 to the host material 121 is preferably more than 0 and less than or equal to 0.05, more preferably more than 0 and less than or equal to 0.03.

Next, factors controlling the above-described processes of intermolecular energy transfer between the host material 121 and the guest material 122 will be described. As mechanisms of the intermolecular energy transfer, two mechanisms, i.e., Förster mechanism (dipole-dipole interaction) and Dexter mechanism (electron exchange interaction), have been proposed.

1-4. Förster mechanism

In Förster mechanism, energy transfer does not require direct contact between molecules and energy is transferred through a resonant phenomenon of dipolar oscillation between the host material 121 and the guest material 122. By the resonant phenomenon of dipolar oscillation, the host material 121 provides energy to the guest material 122, and thus, the host material 121 in an excited state is put in a ground state and the guest material 122 in a ground state is put in an excited state. Note that the rate constant $k_{h^* \rightarrow g}$ of Förster mechanism is expressed by Formula (1).

[Formula 1]

$$k_{h^* \to g} = \frac{9000c^4 K^2 \phi \ln 10}{128\pi^5 n^4 N \tau R^6} \int \frac{f'_h(v)\varepsilon_g(v)}{v^4} dv \quad (1)$$

In Formula (1), v denotes a frequency, $f'_h(v)$ denotes a normalized emission spectrum of the host material 121 (a fluorescent spectrum in energy transfer from a singlet excited state, and a phosphorescent spectrum in energy transfer from a triplet excited state), $\varepsilon_g(v)$ denotes a molar absorption coefficient of the guest material 122, N denotes Avogadro's number, n denotes a refractive index of a medium, R denotes an intermolecular distance between the host material 121 and the guest material 122, τ denotes a measured lifetime of an excited state (fluorescence lifetime or phosphorescence lifetime), c denotes the speed of light, ϕ denotes a luminescence quantum yield (a fluorescence quantum yield in energy transfer from a singlet excited state, and a phosphorescence quantum yield in energy transfer from a triplet excited state), and $K^2$ denotes a coefficient (0 to 4) of orientation of a transition dipole moment between the host material 121 and the guest material 122. Note that $K^2=\frac{2}{3}$ in random orientation.

1-5. Dexter Mechanism

In Dexter mechanism, the host material 121 and the guest material 122 are close to a contact effective range where their orbitals overlap, and the host material 121 in an excited state and the guest material 122 in a ground state exchange their electrons, which leads to energy transfer. Note that the rate constant $k_{h^* \to g}$ of Dexter mechanism is expressed by Formula (2).

[Formula 2]

$$k_{h^* \to g} = \left(\frac{2\pi}{h}\right) K^2 \exp\left(-\frac{2R}{L}\right) \int f'_h(v)\varepsilon'_g(v) dv \quad (2)$$

In Formula (2), h denotes a Planck constant, K denotes a constant having an energy dimension, v denotes a frequency, $f'_h(v)$ denotes a normalized emission spectrum of the host material 121 (a fluorescent spectrum in energy transfer from a singlet excited state, and a phosphorescent spectrum in energy transfer from a triplet excited state), $\varepsilon'_g(v)$ denotes a normalized absorption spectrum of the guest material 122, L denotes an effective molecular radius, and R denotes an intermolecular distance between the host material 121 and the guest material 122.

Here, the efficiency of energy transfer from the host material 121 to the guest material 122 (energy transfer efficiency $\phi_{ET}$) is expressed by Formula (3). In the formula, $k_r$ denotes a rate constant of a light-emission process (fluorescence in energy transfer from a singlet excited state, and phosphorescence in energy transfer from a triplet excited state) of the host material 121, $k_n$ denotes a rate constant of a non-light-emission process (thermal deactivation or intersystem crossing) of the host material 121, and ti denotes a measured lifetime of an excited state of the host material 121.

[Formula 3]

$$\phi_{ET} = \frac{k_{h^* \to g}}{k_r + k_n + k_{h^* \to g}} = \frac{k_{h^* \to g}}{\left(\frac{1}{\tau}\right) + k_{h^* \to g}} \quad (3)$$

According to Formula (3), it is found that the energy transfer efficiency $\phi_{ET}$ can be increased by increasing the rate constant $k_{h^* \to g}$ of energy transfer so that another competing rate constant $k_r+k_n(=1/\tau)$ becomes relatively small.

1-6. Concept for Promoting Energy Transfer

In both the energy transfer processes of the general formulae (G1) and (G2), since energy is transferred from the singlet excited state ($^1H^*$) of the host material 121 to the singlet excited state ($^1G^*$) of the guest material 122, energy transfers by both Forster mechanism (Formula (1)) and Dexter mechanism (Formula (2)) occur.

First, an energy transfer by Forster mechanism is considered. When τ is eliminated from Formula (1) and Formula (3), it can be said that the energy transfer efficiency $\phi_{ET}$ is higher when the quantum yield ϕ (here, a fluorescence quantum yield because energy transfer from a singlet excited state is discussed) is higher. However, in practice, a more important factor is that the emission spectrum of the host material 121 (here, a fluorescent spectrum because energy transfer from a singlet excited state is discussed) largely overlaps with the absorption spectrum of the guest material 122 (absorption corresponding to the transition from the singlet ground state to the singlet excited state). Note that it is preferable that the molar absorption coefficient of the guest material 122 be also high. This means that the emission spectrum of the host material 121 overlaps with the absorption band of the guest material 122 which is on the longest wavelength side.

Next, an energy transfer by Dexter mechanism is considered. According to Formula (2), in order to increase the rate constant $k_{h^* \to g}$, it is preferable that an emission spectrum of the host material 121 (here, a fluorescent spectrum because energy transfer from a singlet excited state is discussed) largely overlap with an absorption spectrum of the guest material 122 (absorption corresponding to transition from a singlet ground state to a singlet excited state).

The above description suggests that the energy transfer efficiency can be optimized by making the emission spectrum of the host material 121 overlap with the absorption band of the guest material 122 which is on the longest wavelength side.

In view of this, one embodiment of the present invention provides a light-emitting element which includes the host material 121 having a function as an energy donor capable of efficiently transferring energy to the guest material 122. A feature of the host material 121 is that the singlet excitation energy level and the triplet excitation energy level are close to each other. Specifically, it is preferable that the host material 121 have a difference of more than 0 eV and less than or equal to 0.2 eV between the singlet excitation energy level and the triplet excitation energy level. This enables transition (reverse intersystem crossing) of the host material 121 from the triplet excited state to the singlet excited state to be likely to occur. Therefore, the generation efficiency of the singlet excited state of the host material 121 can be increased. Furthermore, in order to facilitate energy transfer from the singlet excited state of the host material 121 to the singlet excited state of the guest material 122 having a function as an energy acceptor, it is preferable that the emission spectrum of the host material 121 (here, the emission spectrum of a substance having a function of exhibiting thermally activated delayed fluorescence) overlap with the absorption band of the guest material 122 which is on the longest wavelength side. Thus, the generation efficiency of the singlet excited state of the guest material 122 can be increased.

Since the triplet excitation energy level of the host material 121 is higher than the triplet excitation energy level of the guest material 122 in the light-emitting element 150 of one embodiment of the present invention, transition of the host material 121 from the triplet excited state to the singlet excited state and energy transfer from the singlet excited state of the host material 121 to the singlet excited state of the guest material 122 are likely to occur. For this reason, thermal deactivation is less likely to occur in the light-emitting element 150; thus, the emission efficiency of the light-emitting element 150 can be increased. In the case where the host material 121 is a substance which exhibits thermally activated delayed fluorescence at room temperature, since the thermally activated delayed fluorescence emission energy is higher than the phosphorescence emission energy of the guest material 122, transition of the host material 121 from the triplet excited state to the singlet excited state and energy transfer from the host material 121 in the singlet excited state to the guest material 122 in the singlet excited state occur efficiently. For this reason, thermal deactivation is less likely to occur in the light-emitting element 150; thus, the emission efficiency of the light-emitting element 150 can be increased.

1-7. Material

In the light-emitting layer 113, the host material 121 may be composed of one kind of material or may include a plurality of materials. For example, in the case where the host material 121 is composed of one kind of material, any of the following materials can be used.

First, a fullerene, a derivative thereof, an acridine derivative such as proflavine, eosin, or the like can be given. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$(OEP)), which are shown in the following structural formulae.

[Chemical Formula 1]

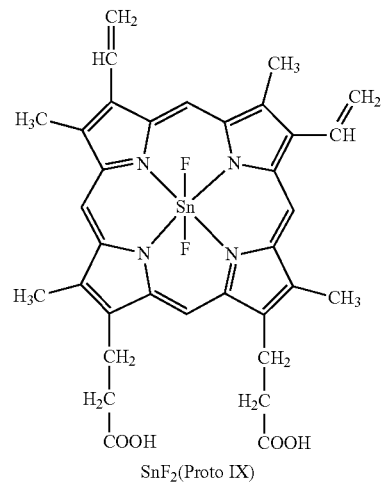

$SnF_2$(Proto IX)

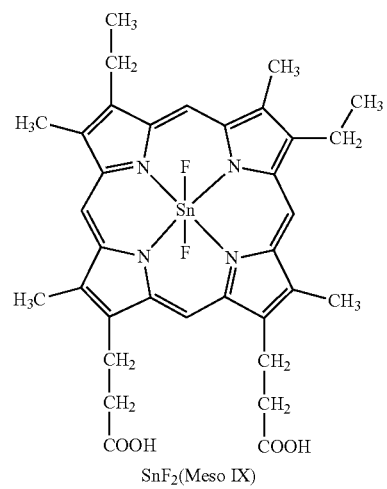

$SnF_2$(Meso IX)

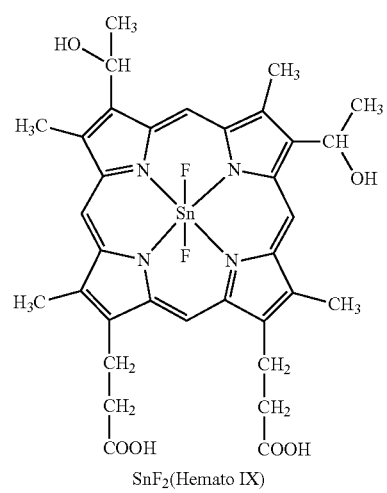

$SnF_2$(Hemato IX)

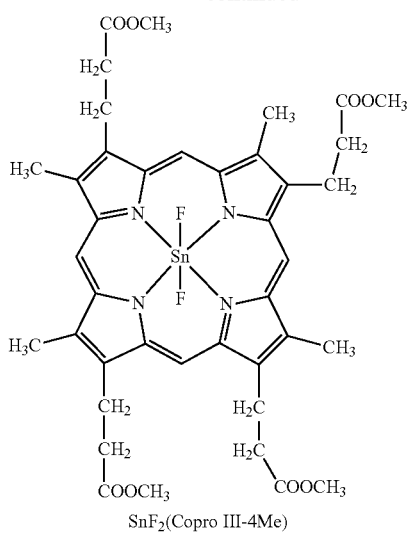

SnF₂(Copro III-4Me)

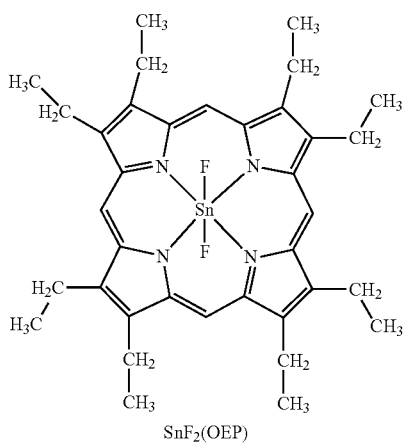

SnF₂(OEP)

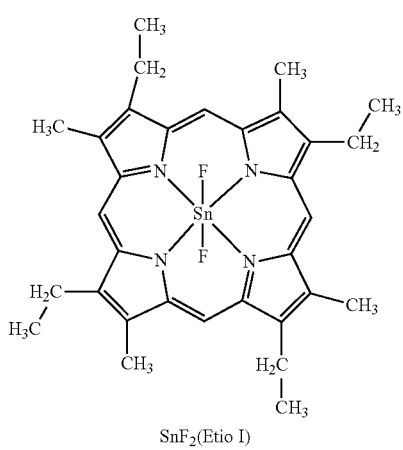

SnF₂(Etio I)

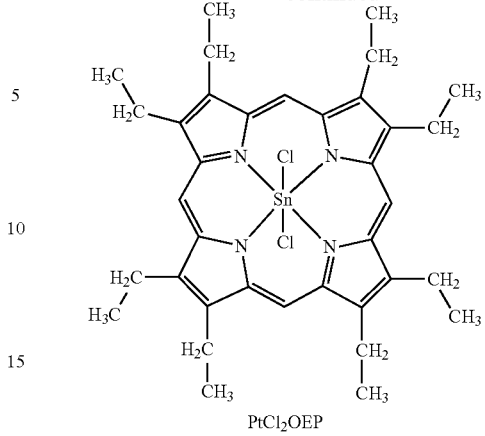

PtCl₂OEP

Alternatively, a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) shown in the following structural formulae, can be used as the host material 121 composed of one kind of material. The heterocyclic compound is preferably used because of the π-electron rich heteroaromatic ring and the π-electron deficient heteroaromatic ring, for which the electron-transport property and the hole-transport property are high. Note that a substance in which the π-electron rich heteroaromatic ring is directly bonded to the π-electron deficient heteroaromatic ring is particularly preferably used because the donor property of the π-electron rich heteroaromatic ring and the acceptor property of the π-electron deficient heteroaromatic ring are both increased and the difference between the level of the singlet excited state and the level of the triplet excited state becomes small.

[Chemical Formula 2]

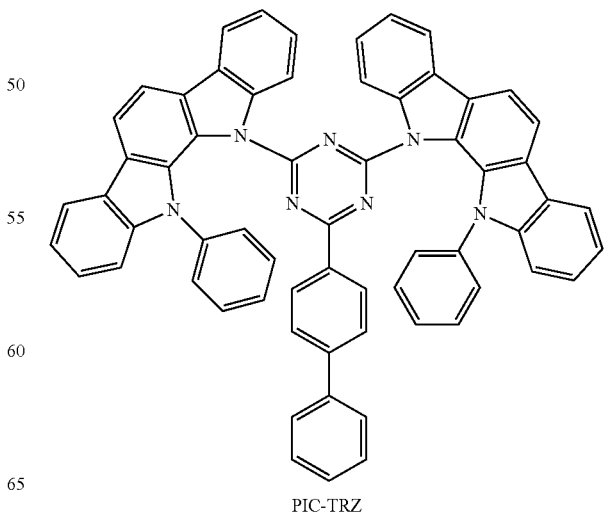

PIC-TRZ

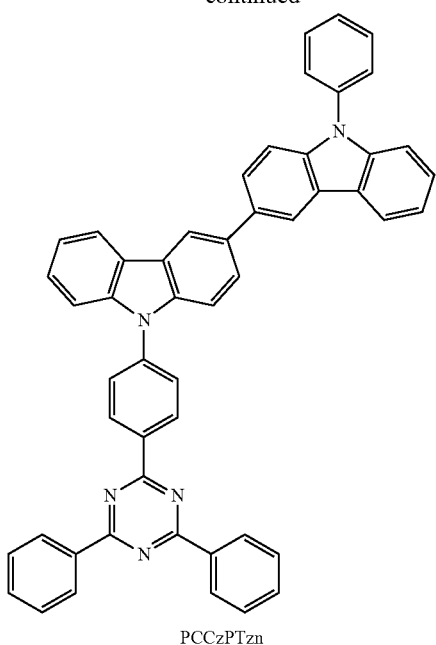

PCCzPTzn

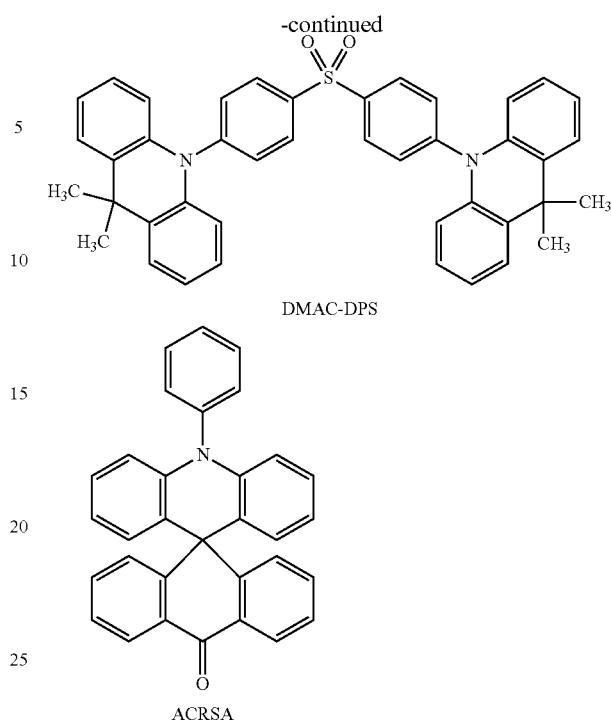

DMAC-DPS

ACRSA

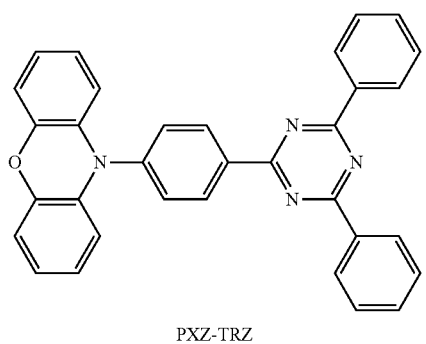

PXZ-TRZ

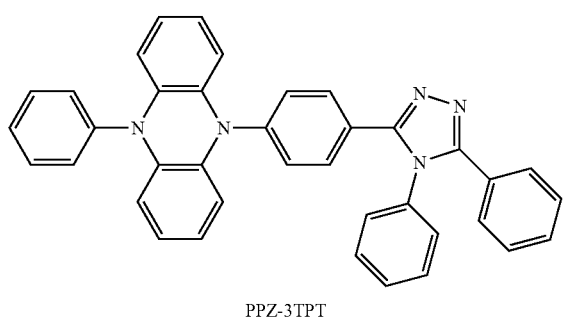

PPZ-3TPT

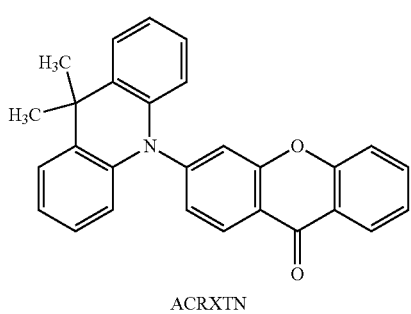

ACRXTN

In the light-emitting layer 113, the guest material 122 is preferably, but not particularly limited to, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like, and for example, any of the following materials can be used.

The examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9-phenyl-9H-fluoren-9-yl)phenyl]-N,N'-diphenyl-pyrene-1,6-diamine (abbreviation: 1,6FLPAPrn), N-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenyl amine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N"-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-triphenyl-1,4-phenylenediamine (abbreviation: 2DPAPPA), N,N,N',N',N",N",N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9, 10-bis(1,1'-biphenyl-2-yl)-2-anthryl]-N,N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 6, coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[i,j]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-α]fluoranthene-3,10-diamine (abbreviation: p-mPhAFD), 2-{2-isopropyl-6-[2-(1,1,7,7-tetramethyl-2,3,6,7-tetrahydro-1H,5H-benzo[y]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[i,j]quinolizin yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{12,6-bis[2-(8-methoxy-1,1,7,7-tetramethyl-2,3,6,7-tetrahydro-1H,5H-benzo[i,j]quinolizin yl)ethenyl]-4H-pyran-4-ylidene}propanedinitrile (abbreviation: BisDCJTM), and 5,10,15,20-tetraphenylbisbenzo[5,6]indeno[1,2,3-cd:1',2',3'-lm]perylene.

Note that the light-emitting layer 113 can be formed by an evaporation method (including a vacuum evaporation method), an inkjet method, a coating method, gravure printing, or the like.

2. Structure Example 2 of Light-Emitting Element

Next, a structure different from the structure illustrated in FIGS. 1B and 1C will be described below with reference to FIGS. 2A and 2B.

Figure 2A:
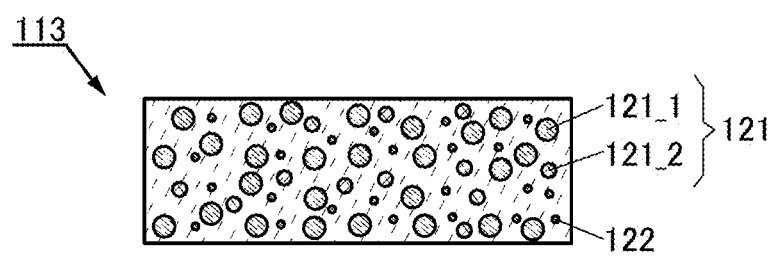
FIGS. 2A and 2B are a schematic cross-sectional view of a light-emitting layer and a schematic diagram illustrating the correlation of energy levels.

FIG. 2A is a schematic cross-sectional view of an example of the light-emitting layer 113 in FIG. 1A. The light-emitting layer 113 in FIG. 2A includes the host material 121 and the guest material 122. The host material 121 includes an organic compound 121_1 and an organic compound 121_2.

It is preferable that a combination of the organic compound 121_1 and the organic compound 121_2 form an exciplex (also referred to as an excited complex). An exciplex tends to have a very small difference between the singlet excitation energy level and the triplet excitation energy level, and thus transition (reverse intersystem crossing) from the triplet excited state to the singlet excited state is likely to occur. One of the organic compounds 121_1 and 121_2 serves as a host material for the light-emitting layer 113, and the other of the organic compounds 121_1 and 121_2 serves as an assist material for the light-emitting layer 113. Note that the organic compound 121_1 serves as the host material and the organic compound 121_2 serves as the assist material in the following description.

Note that also in the case of using a host material which allows a combination of the organic compound 121_1 and the organic compound 121_2 to form an exciplex, light emission from the guest material 122 can be obtained through the following two processes:

(α) direct recombination process; and
(β) energy transfer process.

Note that (α) direct recombination process is not described here because it is similar to the process described above in the subsection 1-2.

2-1. Emission Mechanism Through (β) Energy Transfer Process

Although there is no limitation on the combination of the organic compound 121_1 and the organic compound 121_2 in the light-emitting layer 113 as long as an exciplex can be formed, it is preferred that one organic compound be a material having a hole-transport property and the other organic compound be a material having an electron-transport property. In that case, a donor-acceptor excited state is formed easily, which allows an exciplex to be formed efficiently. In the case where the combination of the organic compound 121_1 and the organic compound 121_2 is a combination of the material having a hole-transport property and the material having an electron-transport property, the carrier balance can be easily controlled depending on the mixture ratio. Specifically, the weight ratio of the material having a hole-transport property to the material having an electron-transport property is preferably within the range of 1:9 to 9:1. Since the carrier balance can be easily controlled in the structure, a recombination region can also be easily adjusted.

It is preferable that the exciplex formed by the organic compound 121_1 and the organic compound 121_2 have a difference of more than 0 eV and less than or equal to 0.2 eV between the singlet excitation energy level and the triplet excitation energy level. This enables transition (reverse intersystem crossing) of the exciplex from the triplet excitation energy level to the singlet excitation energy level to be likely to occur. Therefore, the generation efficiency of the singlet excited state of the exciplex, i.e., the host material 121, can be increased.

Furthermore, it is preferable that the emission spectrum of the host material 121 (here, the emission spectrum of the exciplex formed by the organic compound 121_1 and the organic compound 121_2) overlap with the absorption band of the guest material 122 which is on the longest wavelength side. This facilitates energy transfer from the singlet excited state of the host material 121 to the singlet excited state of the guest material 122. Therefore, the generation efficiency of the singlet excited state of the guest material 122 can be increased; thus, emission efficiency can be increased.

Figure 2B:
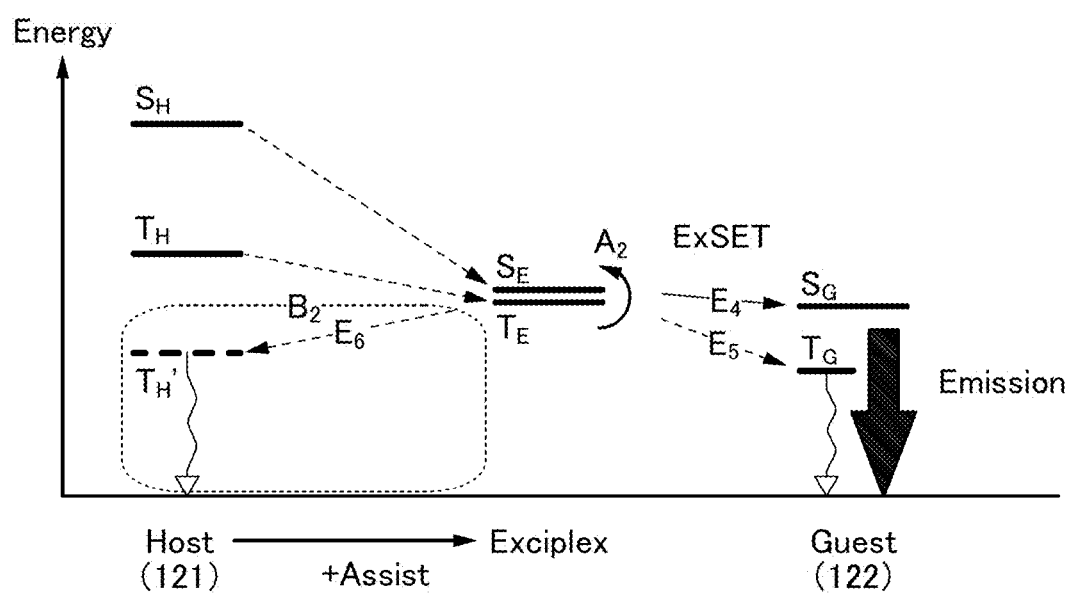

Here, in order to describe the energy transfer process of the exciplex, a schematic diagram illustrating the correlation of energy levels is shown in FIG. 2B. The following explains what terms and signs in FIG. 2B represent:

Host (121): the host material (organic compound 121_1);
Guest (122): the guest material 122 (fluorescent material);
Assist: the host material (organic compound 121_2);
$S_H$: the level of the lowest singlet excitation energy of the host material (organic compound 121_1);
$T_H$: the level of the lowest triplet excitation energy of the host material (organic compound 121_1);
$S_E$: the level of the lowest singlet excitation energy of the exciplex;
$T_E$: the level of the lowest triplet excitation energy of the exciplex;
$S_G$: the level of the lowest singlet excitation energy of the guest material 122 (fluorescent material); and
$T_G$: the level of the lowest triplet excitation energy of the guest material 122 (fluorescent material).

When carriers (holes and electrons) are transported to the light-emitting layer 113 and one of the organic compounds 121_1 and 121_2 receiving holes and the other receiving electrons come close to each other, the exciplex is formed at once. Alternatively, when one compound is brought into an excited state, the one immediately interacts with the other compound to form the exciplex. Therefore, most excitons in the light-emitting layer 113 exist as the exciplexes. The band gap of the exciplex is narrower than that of each of the organic compounds 121_1 and 121_2; therefore, the driving voltage can be lowered when the exciplex is formed.

Since the organic compounds 121_1 and 121_2 can form a donor-acceptor excited state, the $S_E$ and the $T_E$ of the exciplex are close to each other.

In the case where the excited state of the exciplex is a single excited state, excitation energy is transferred from the $S_E$ of the exciplex to the $S_G$ of the guest material 122 as shown by a route $E_4$ in FIG. 2B, whereby the guest material 122 is brought into the singlet excited state. Fluorescence is obtained from the guest material 122 in the singlet excited state. In other words, energy transfer occurs from the exciplex in the singlet excited state to the guest material 122 in the singlet excited state as represented by the following general formula (G3).

$$^1[H\text{-}A]^* + {}^1G \rightarrow {}^1H + {}^1A + {}^1G^* \quad (G3)$$

Note that in the general formula (G3), $^1[H\text{-}A]^*$ represents the singlet excited state of the exciplex formed by the organic compound 121_1 and the organic compound 121_2; $^1G$ represents the singlet ground state of the guest material 122; $^1H$ represents the singlet ground state of the organic compound 121_1; $^1A$ represents the singlet ground state of the organic compound 121_2; and $^1G^*$ represents the singlet excited state of the guest material 122.

Even in the case where the exited state of the exciplex is the triplet excited state, when the $S_E$ of the exciplex is higher than the $S_G$ of the guest material 122, fluorescence is obtained through the following two processes.

As for a first process, excitation energy is transferred from the $T_E$ to the $S_E$ of the exciplex by reverse intersystem crossing (upconversion) as shown by a route $A_2$ in FIG. 2B.

As for a subsequent second process, excitation energy is transferred from the $S_E$ of the exciplex to the $S_G$ of the guest material 122 as shown by a route $E_4$ in FIG. 2B, whereby the guest material 122 is brought into the singlet excited state. Fluorescence is obtained from the guest material 122 in the singlet excited state.

The above-described processes through the route $A_2$ and the route $E_4$ may be referred to as exciplex-singlet energy transfer (ExSET) or exciplex-enhanced fluorescence (ExEF) in this specification and the like.

The above-described first and second processes are represented by the following general formula (G4).

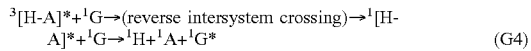

$$^3[H\text{-}A]^* + {}^1G \rightarrow (\text{reverse intersystem crossing}) \rightarrow {}^1[H\text{-}A]^* + {}^1G \rightarrow {}^1H + {}^1A + {}^1G^* \quad (G4)$$

Note that in the general formula (G4), $^3[H\text{-}A]^*$ represents the triplet excited state of the exciplex formed by the organic compound 121_1 and the organic compound 121_2; $^1G$ represents the singlet ground state of the guest material 122; $^1[H\text{-}A]^*$ represents the singlet excited state of the exciplex formed by the organic compound 121_1 and the organic compound 121_2; represents the singlet ground state of the organic compound 121_1; $^1A$ represents the singlet ground state of the organic compound 121_2; and $^1G^*$ represents the singlet excited state of the guest material 122.

As represented by the general formula (G4), the singlet excited state ($^1[H\text{-}A]^*$) of the exciplex is generated from the triplet excited state ($^3[H\text{-}A]^*$) of the exciplex by reverse intersystem crossing, and then energy is transferred to the guest material 122 in the singlet excited state ($^1G^*$).

When the host material 121 has the above structure, (β) energy transfer process occurs efficiently, and both the singlet excitation energy and the triplet excitation energy of the exciplex are efficiently converted into the singlet excited state of the guest material 122. Thus, light emission can be efficiently obtained from the guest material 122 (fluorescent material) of the light-emitting layer 113.

However, when the exciplex is deactivated by emitting the excitation energy as light or heat before excitation energy is transferred from the exciplex to the guest material 122, the emission efficiency may be decreased. For example, in the case where excitation energy is transferred from the $T_E$ of the exciplex to the $T_G$ of the guest material 122 as shown by a route $E_5$ in FIG. 2B, the excitation energy is thermally deactivated. Therefore, the weight ratio of the guest material 122 to the host material 121 is preferably more than 0 and less than or equal to 0.05, more preferably more than 0 and less than or equal to 0.03.

In the case where the $T_H$ of the host material 121, i.e., the triplet excitation energy level of the organic compound 121_1 or 121_2, is lower than the $T_E$ of the exciplex as indicated by broken line $B_2$ in FIG. 2B (shown as "$T_H$'" in FIG. 2C), the excitation energy is transferred from the $T_E$ of the exciplex to the $T_H$' of the host material 121 as shown by a route $E_6$ in FIG. 2B and is then thermally deactivated. Thus, it is preferable that the triplet excitation energy level of each of the organic compounds 121_1 and 121_2 be higher than the $T_E$ of the exciplex. In that case, reverse intersystem crossing occurs efficiently in the exciplex.

Since the $S_E$ and $T_E$ of the exciplex are close to each other, in the case where the $T_E$ is lower than the $T_G$ of the guest material 122, the energy level of $S_E$ is significantly lowered to the vicinity of $T_G$ or lower than $T_G$. As a result, energy transfer from $S_E$ to the $S_G$ of the guest material 122 (route $E_4$) is unlikely to occur, and fluorescence is not easily obtained from the guest material 122. Thus, it is preferable that the $T_E$ of the exciplex be higher than the $T_G$ of the guest material 122.

Accordingly, in the case where the exciplex exhibits thermally activated delayed fluorescence at room temperature, it is preferable that the phosphorescence emission energy of each of the organic compounds 121_1 and 121_2 be higher than the thermally activated delayed fluorescence emission energy of the exciplex. It is also preferable that the thermally activated delayed fluorescence emission energy of the exciplex be higher than the phosphorescence emission energy of the guest material 122.

2-2. Material

In the case where the host material 121 in the light-emitting layer 113 includes the organic compounds 121_1 and 121_2, i.e., two kinds of materials, any of the following materials can be used.

Note that as the organic compounds 121_1 and 121_2, a combination of two kinds of organic compounds which form an exciplex is preferably used. In this case, a variety of carrier-transport materials can be used as appropriate. In order to form an exciplex efficiently, it is particularly preferable to combine a material which easily accepts electrons (a material having an electron-transport property) and a material which easily accepts holes (a material having a hole-transport property).

This is because in the case where the combination of a material having an electron-transport property and a material having a hole-transport property which form an exciplex is used as a host material, the carrier balance between holes and electrons in the light-emitting layer can be easily optimized by adjustment of the mixture ratio of the material having an electron-transport property and the material having a hole-transport property. The optimization of the carrier balance between holes and electrons in the light-emitting layer can prevent a region in which electrons and holes are recombined from existing on one side in the light-emitting layer. By preventing the region in which electrons and holes are recombined from existing on one side, the reliability of the light-emitting element can be improved.

As the material which easily accepts electrons (the material having an electron-transport property), a π-electron deficient heteroaromatic compound, a metal complex, or the like can be used. Specific examples include a metal complex such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound having an azole skeleton such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]carbazole (abbreviation: CO11), 2,2',2''-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II); a heterocyclic compound having a diazine skeleton such as 2-[3-(dibenzothiophen yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), or 4,6-bis[3-(4-dibenzothienyl)phenyl]pyrimidine (abbreviation: 4,6mDBTP2Pm-II); a heterocyclic compound having a triazine skeleton such as 2-{4-[3-(N-phenyl-9H-carbazol-3-yl)-9H-carbazol-9-yl]phenyl}-4,6-diphenyl-1,3,5-triazine (abbreviation: PCCzPTzn); and a heterocyclic compound having a pyridine skeleton such as 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB). Among the above materials, heterocyclic compounds having diazine skeletons and triazine skeletons and heterocyclic compounds having pyridine skeletons have high reliability and are thus preferable. Heterocyclic compounds having diazine (pyrimidine or pyrazine) skeletons and triazine skeletons have a high electron-transport property and contribute to a decrease in drive voltage. In order to obtain high reliability and a high triplet excitation energy level, it is preferable that a condensed heterocyclic skeleton be included and that the condensed heterocyclic skeleton have a diazine skeleton. Alternatively, it is preferable that a carbazole skeleton and a condensed heterocyclic skeleton be included and that the condensed heterocyclic skeleton have a diazine skeleton. Alternatively, it is preferable that a carbazole skeleton and a condensed heterocyclic skeleton be included, that the condensed heterocyclic skeleton have a diazine skeleton, and that the carbazole skeleton and the condensed heterocyclic skeleton can be bonded to each other through an arylene group, and it is particularly preferable that the 9-position of the carbazole skeleton and the condensed heterocyclic skeleton can be bonded to each other through an arylene group. The condensed heterocyclic skeleton having a diazine skeleton is preferably a quinoxaline skeleton, a quinazoline skeleton, a benzoquinoxaline skeleton, a benzoquinazoline skeleton, a dibenzoquinoxaline skeleton, a dibenzoquinazoline skeleton, a benzofuropyrimidine skeleton, or the like.

As the material which easily accepts holes (the material having a hole-transport property), a π-electron rich heteroaromatic compound, an aromatic amine compound, or the like can be favorably used. Specific examples include a compound having an aromatic amine skeleton such as 2-[N-(9-phenylcarbazol-3-yl)-N-phenylamino]spiro-9,9'-bifluorene (abbreviation: PCASF), 4,4'-bis[N-(1-naphthyl)-N-phenyl amino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenyl amine (abbreviation: PCBBi1BP), 4-(1-naphthyl)-4'-(9-phenyl-9H-carbazol-3-yl)triphenyl amine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), N-(1,1'-biphenyl-4-yl)-N-[4-(9-phenyl-9H-carbazol-3-yl)phenyl]-9,9-dimethyl-9H-fluoren-2-amine (abbreviation: PCBBiF); a compound having a carbazole skeleton such as 1,3-bis(N-carbazolyl) benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 9-phenyl-9H-3-(9-phenyl-9H-carbazol-3-yl)carbazole (abbreviation: PCCP); a compound having a thiophene skeleton such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton such as 4,4',4''-(benzene-1,3,5-triyl) tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II).

Among the above materials, compounds having aromatic amine skeletons and compounds having carbazole skeletons are preferable because these compounds are highly reliable and have high hole-transport properties to contribute to a reduction in drive voltage. In order to obtain a high triplet excitation energy level, it is preferable that a carbazole skeleton be included. Alternatively, it is preferable that one aromatic amine skeleton be included. Alternatively, it is preferable that a carbazole skeleton and an aromatic amine skeleton be included and that the 9-position of the carbazole skeleton and the aromatic amine skeleton can be bonded to each other, and it is particularly preferable that the 9-position of the carbazole skeleton and the aromatic amine skeleton can be bonded to each other through an arylene group.

The organic compounds 121_1 and 121_2 are not limited to the above-described compounds, as long as they can transport carriers, the combination can form an exciplex, and light emission of the exciplex overlaps with an absorption band on the longest wavelength side in an absorption spectrum of a light-emitting substance (an absorption corresponding to the transition of the light-emitting substance from the singlet ground state to the singlet excited state), and other materials may be used.

Note that a material which can be used as the guest material 122 in the light-emitting layer 113 illustrated in FIG. 2A is similar to the guest material 122 described in the subsection 1-7 and is therefore not described here.

2-3. Relationship Between Emission Energy of Exciplex and Triplet Energy Level of Host Material Combinations of organic compounds which can form an exciplex of one embodiment of the present invention and the relationship between the emission energy of the exciplex and the triplet energy level of a host material will be described in detail below.

Figure 3A:
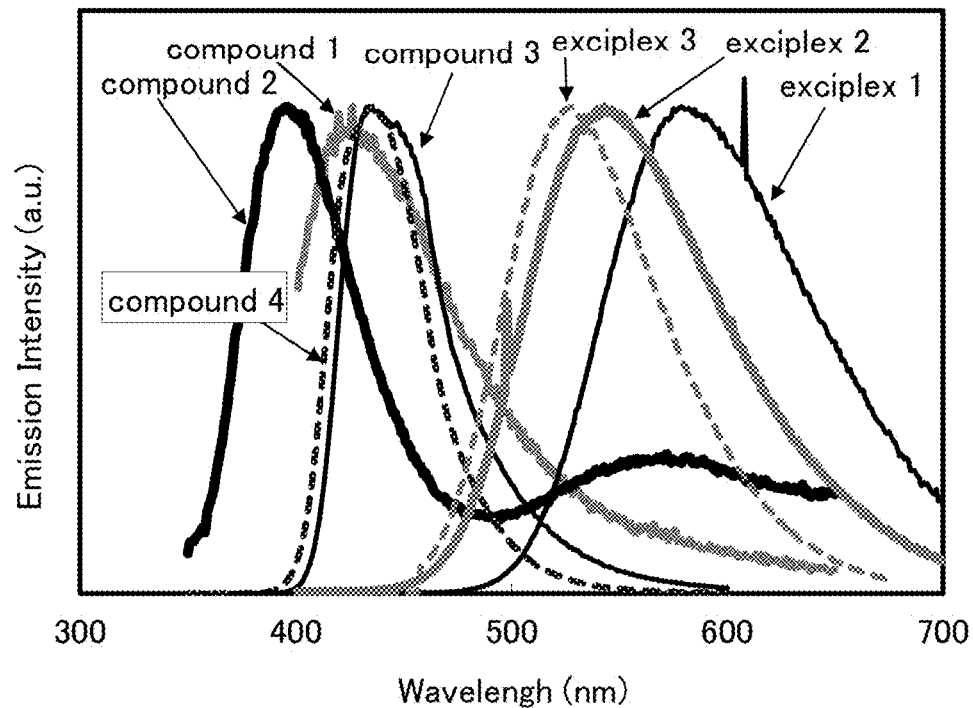
FIGS. 3A and 3B illustrate emission spectra according to one embodiment.
Figure 3B:
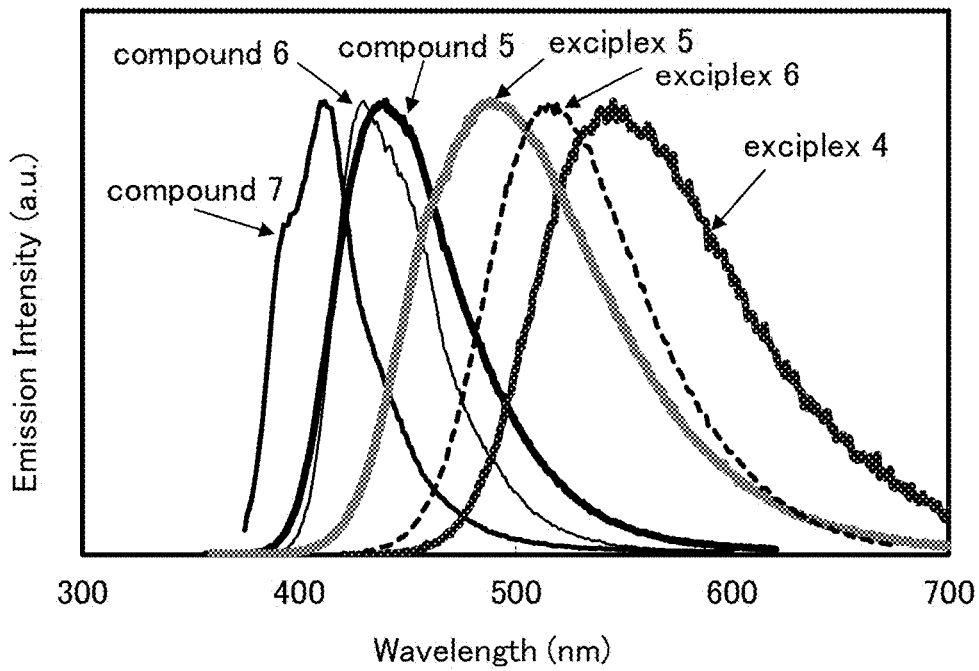

FIGS. 3A and 3B show the emission spectra of thin films of individual organic compounds and the emission spectra of mixed films each including a combination of two different kinds of organic compounds. Note that FIG. 3A shows the emission spectra of compounds 1 to 4 and exciplexes 1 to 3, and FIG. 3B shows the emission spectra of compounds 5 to 7 and exciplexes 4 to 6.

FIGS. 3A and 3B show the emission spectra of thin films of 2-[3-(dibenzothiophen-4-yl)phenyl]dibenzo[f,h]quinoxaline (abbreviation: 2mDBTPDBq-II) as the compound 1,4,6-bis[3-(4-dibenzothienyl)phenyl]pyrimidine (abbreviation: 4,6mDBTP2Pm-II) as the compound 2,2,7-bis[N-(4-diphenylaminophenyl)-N-phenylamino]-spiro-9,9'-bifluorene (abbreviation: DPA2SF) as the compound 3,2-[N-(9-phenylcarbazol-3-yl)-N-phenylamino]spiro-9,9'-bifluorene (abbreviation: PCASF) as the compound 4, 4,6-bis[3-(9H-carbazol-9-yl)phenyl]pyrimidine (abbreviation: 4,6mCzP2Pm) as the compound 5, N-(4-biphenyl)-N-(9,9-dimethyl-9H-fluoren-2-yl)-9-phenyl-9H-carabzol-3-amine (abbreviation: PCBiF) as the compound 6, 9-phenyl-9H-3-(9-phenyl-9H-carbazol-3-yl)carbazole (abbreviation: PCCP) as the compound 7, and 4,4'-bis[N-(1-naphthyl)-N-phenylamino]biphenyl (abbreviation: NPB) as a compound 8. Structural formulae and abbreviations of the compounds 1 to 8 are shown below.

[Chemical Formula 3]

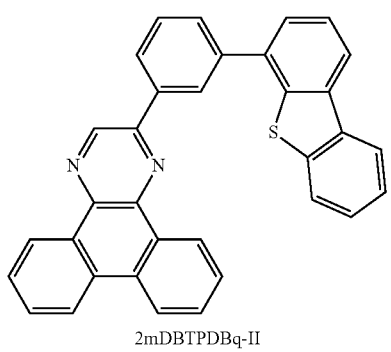

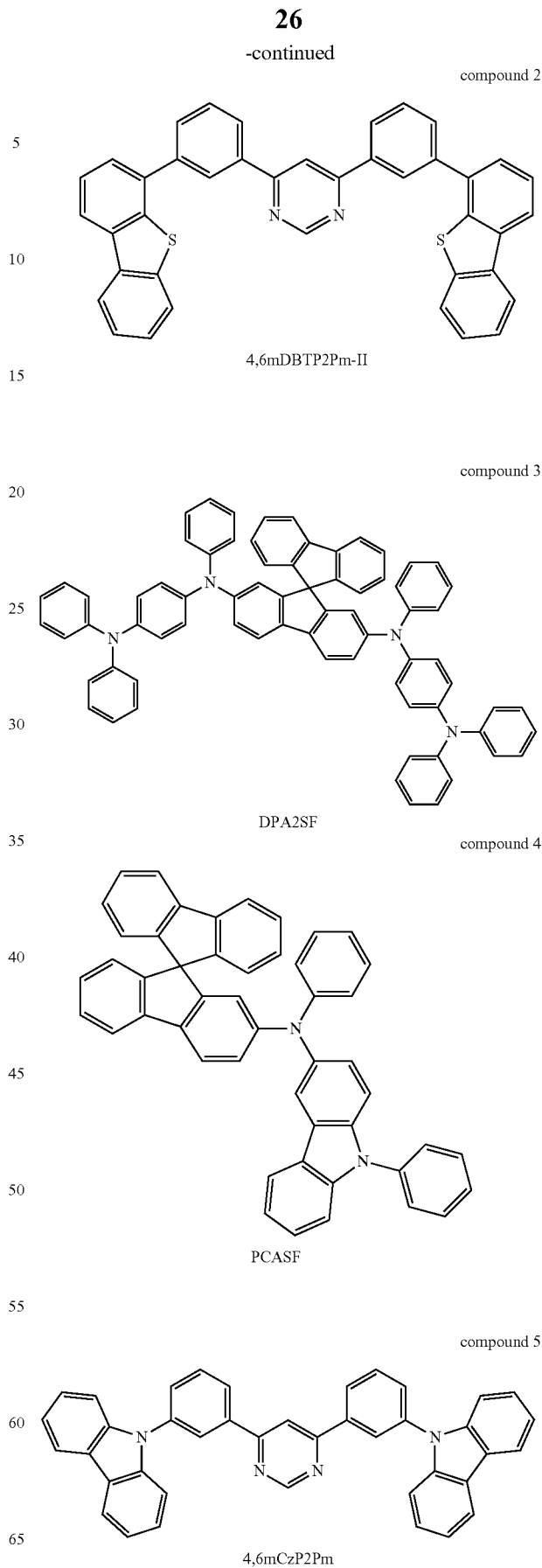

-continued

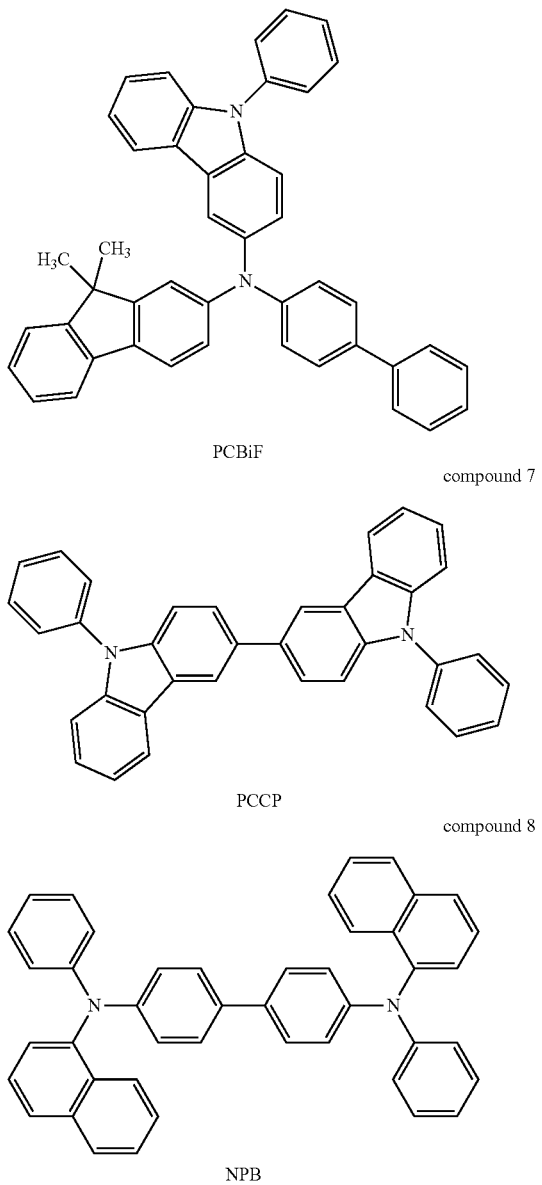

compound 6
PCBiF compound 7
PCCP compound 8
NPB

The emission spectrum of the exciplex 1 in FIG. 3A is a result of measuring light emission from a mixed film of the compounds 1 and 3. That is, one of the compounds 1 and 3 corresponds to the organic compound 121_1, and the other corresponds to the organic compound 121_2.

Similarly, the emission spectra of the exciplexes 2 and 3 are results of measuring light emissions from a mixed film of the compounds 1 and 4 and a mixed film of the compounds 2 and 4, respectively. Note that the emission spectra correspond to measured light emissions obtained by ultraviolet light irradiation of thin films of individual compounds and mixed films each including two compounds. Note that the emission spectra were measured with a PL-EL measurement apparatus (manufactured by Hamamatsu Photonics K.K.). The thin films were formed by vacuum evaporation of the individual compounds to a thickness of 50 nm onto a quartz substrate. Note that the mixed films were formed by an evaporation method (co-evaporation) where two different compounds are concurrently evaporated from respective evaporation sources.

For each of the exciplexes 1 and 2, the compound 1 is used, and the other compound for exciplex formation differs between the exciplexes 1 and 2. Therefore, although there is little difference between the emission spectrum peaks of the compounds 3 and 4, the wavelength at the emission spectrum peak of the exciplex 1 is 579 nm and the wavelength at the emission spectrum peak of the exciplex 2 is 543 nm; there is a difference of 30 nm or more between these peaks. This is because the exciplexes 1 and 2 are donor-acceptor exciplexes. That is, the singlet excitation energy of an exciplex corresponds to the energy difference between a higher highest occupied molecular orbital (also referred to as HOMO) of HOMOs of two organic compounds and a lower lowest unoccupied molecular orbital (also referred to as LUMO) of LUMOs of the two organic compounds. Therefore, when one of the compounds is different, the energy level of the HOMO or LUMO for exciplex formation is changed and thus the emission wavelength of an exciplex can also be changed.

For each of the exciplexes 2 and 3, the compound 4 is used, and the other compound for exciplex formation differs between the exciplexes 2 and 3. The wavelength at the emission spectrum peak of the exciplex 3 is 528 nm; there is a difference of 15 nm between the emission spectrum peaks of the exciplexes 2 and 3. In this manner, the emission wavelength of an exciplex can be easily changed simply by changing one of compounds which form the exciplex.

Note that since the wavelength at the emission spectrum peak of the exciplex 1 is 579 nm, the exciplex 1 is preferably mixed with a light-emitting material having a function of emitting yellow to red light as the guest material 122 for use in a light-emitting element. Furthermore, since the wavelengths at the emission spectrum peaks of the exciplexes 2 and 3 are 543 nm and 528 nm, respectively, the exciplex 2 or 3 is preferably mixed with a light-emitting material having a function of emitting green to red light as the guest material 122 for use in a light-emitting element.

The emission spectrum of the exciplex 4 in FIG. 3B is a result of measuring light emission from a mixed film of the compounds 5 and 6. That is, one of the compounds 5 and 6 corresponds to the organic compound 121_1, and the other corresponds to the organic compound 121_2. Similarly, the emission spectra of the exciplexes 5 and 6 are results of measuring light emissions from a mixed film of the compounds 5 and 7 and a mixed film of the compounds 5 and 8, respectively. Note that the emission spectra correspond to measured light emissions obtained by ultraviolet light irradiation of thin films of individual compounds and mixed films each including two compounds.

For each of the exciplexes 4 to 6, the compound 5 is used, and the other compound for exciplex formation differs between the exciplexes 4 to 6. Therefore, there are differences between the emission spectrum peaks of the exciplexes 4 to 6. In this manner, the emission wavelength of an exciplex can be easily changed simply by changing one of compounds which form the exciplex.

Note that since the wavelengths at the emission spectrum peaks of the exciplexes 4 and 6 are 545 nm and 516 nm, respectively, the exciplex 4 or 6 is preferably mixed with a light-emitting material having a function of emitting green to red light as the guest material 122 for use in a light-emitting element. Furthermore, since the wavelength at the emission spectrum peak of the exciplex 5 is 488 nm, the exciplex 5 is preferably mixed with a light-emitting material having a function of emitting blue to red light as the guest material 122 for use in a light-emitting element.

Figure 4A:
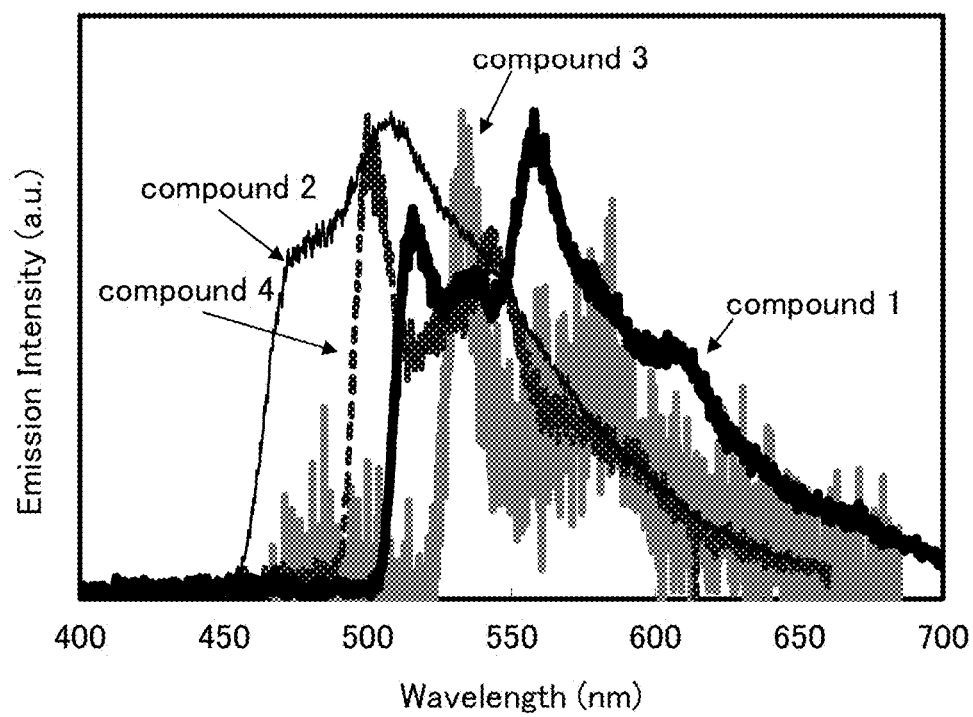
FIGS. 4A and 4B illustrate phosphorescence spectra according to one embodiment.
Figure 4B:
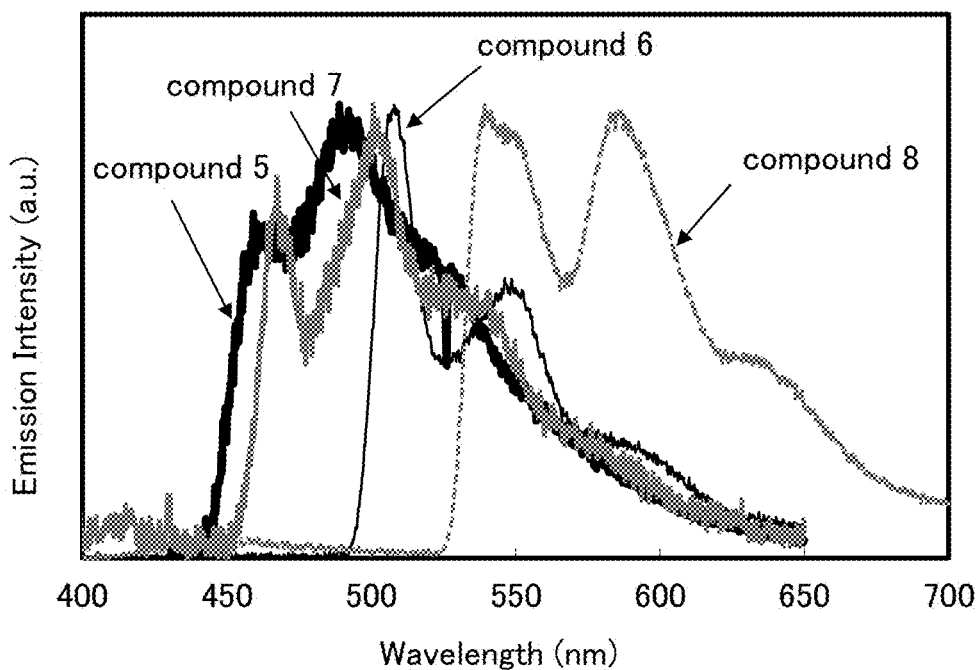

Next, phosphorescence spectra of the compounds 1 to 8 are shown in FIGS. 4A and 4B. The phosphorescence spectra shown in FIGS. 4A and 4B are obtained as a result of irradiation of thin films of the individual compounds using an ultraviolet laser (He—Cd laser) with an emission wavelength of 325 nm and measurement by time-resolved photoluminescence in a low-temperature (10 K) environment. Note that the measurement was performed by using a PL microscope, LabRAM HR-PL, produced by HORIBA, Ltd., and a CCD detector. The thin films were formed by vacuum evaporation of the individual compounds to a thickness of 50 nm onto a quartz substrate.

Tables 1 and 2 show phosphorescence emission energies obtained from phosphorescence emission peaks (including shoulders) on the shortest wavelength side of phosphorescence spectra. Note that a triplet excitation energy level and a singlet excitation energy level are close to each other in an exciplex; therefore, it is difficult to separate a phosphorescence spectrum and a fluorescence spectrum (thermally activated delayed fluorescence spectrum) from each other. Accordingly, the phosphorescence emission energies of the exciplexes in Tables 1 and 2 were obtained from the peaks of emission spectra assuming that the emission spectrum peaks (thermally activated delayed fluorescence spectrum peaks) of the exciplexes are the same as the phosphorescence spectrum peaks. That is, it is assumed that the thermally activated delayed fluorescence emission energy and the phosphorescence emission energy of the exciplex are substantially equal.

TABLE 1

|  | Phosphorescence emission energy (eV) |
| --- | --- |
| Compound 1 | 2.40 |
| Compound 2 | 2.62 |
| Compound 3 | 2.32 |
| Compound 4 | 2.48 |
| Exciplex 1 (Compounds 1 & 3) | 2.14 |
| Exciplex 2 (Compounds 1 & 4) | 2.28 |
| Exciplex 3 (Compounds 2 & 4) | 2.35 |

TABLE 2

|  | Phosphorescence emission energy (eV) |
| --- | --- |
| Compound 5 | 2.70 |
| Compound 6 | 2.45 |
| Compound 7 | 2.65 |
| Compound 8 | 2.30 |
| Exciplex 4 (Compounds 5 & 6) | 2.27 |
| Exciplex 5 (Compounds 5 & 7) | 2.54 |
| Exciplex 6 (Compounds 5 & 8) | 2.40 |

The phosphorescence emission energy (thermally activated delayed fluorescence emission energy) of each of the exciplexes 1 to 5 in Tables 1 and 2 is lower than the phosphorescence emission energy of each of the compounds which form the exciplexes. That is, the phosphorescence emission energy of each of the compounds 1 and 3 is higher than the phosphorescence emission energy (thermally activated delayed fluorescence emission energy) of the exciplex 1. The phosphorescence emission energy of each of the compounds 1 and 4 is higher than the phosphorescence emission energy (thermally activated delayed fluorescence emission energy) of the exciplex 2. The phosphorescence emission energy of each of the compounds 2 and 4 is higher than the phosphorescence emission energy (thermally activated delayed fluorescence emission energy) of the exciplex 3. The phosphorescence emission energy of each of the compounds 5 and 6 is higher than the phosphorescence emission energy (thermally activated delayed fluorescence emission energy) of the exciplex 4. The phosphorescence emission energy of each of the compounds 5 and 7 is higher than the phosphorescence emission energy (thermally activated delayed fluorescence emission energy) of the exciplex 5.

In other words, the triplet energy level of each of the compounds which form the exciplexes 1 to 5 is higher than the triplet energy level of the corresponding exciplex. Therefore, no energy transfer from the triplet excitation energy level of the exciplex to the triplet excitation energy levels of the organic compounds 121_1 and 121_2 which form the exciplex occurs through the energy transfer process indicated by $E_6$ in FIG. 2B; thermal deactivation of the triplet excited state of the exciplex can be suppressed.

Therefore, the excitation energy of the triplet excited state of the exciplex can be efficiently transferred to the singlet excited state of the guest material 122 through the singlet excited state of the exciplex generated by reverse intersystem crossing. For this reason, light emission can be efficiently obtained from the guest material 122.

On the other hand, the phosphorescence emission energy of the exciplex 6 shown in Table 2 is higher than the phosphorescence emission energy of the compound 8, which is one of the compounds which form the exciplex. That is, the triplet energy level of the compound 8, which is one of the compounds which form the exciplex is lower than the triplet energy level of the exciplex 6. Thus, the energy transfer from the triplet excitation energy level of the exciplex to the triplet excitation energy level of one of the organic compounds 121_1 and 121_2 which form the exciplex through the energy transfer process indicated by $E_6$ in FIG. 2B might occur, resulting in thermal deactivation of the triplet excited state of the exciplex. In order to prevent this, it is preferable that the triplet excitation energy level of each of the organic compounds 121_1 and 121_2 which form the exciplex be higher than the triplet excitation energy of the exciplex. Therefore, it is preferable that the difference between the triplet excitation energy levels of the organic compounds 121_1 and 121_2 which form the exciplex be less than 0.4 eV.

Table 3 shows the level of the lowest triplet excitation energy of the guest material 122.

TABLE 3

|  | Triplet excitation energy (eV) |
| --- | --- |
| 1,6mMemFLPAPrn | 1.73 |
| TBP | 1.50 |
| DCM1 | 1.65 |
| DCM2 | 1.61 |
| Coumarin 6 | 1.88 |
| DPQd | 1.93 |
| Rubrene | 0.95 |

In order to obtain the level of the lowest triplet excitation energy in Table 3, the most stable structure in the lowest triplet excited state of the guest material 122 and the most stable structure in the singlet ground state were calculated using density functional theory (DFT). In addition, vibration analysis was conducted on each of the most stable structures, and the level of the lowest triplet excitation energy was obtained by calculation of the difference between the lowest vibrational energies in the lowest triplet excited state and the singlet ground state. Note that Gaussian 09 was used as a quantum chemical calculation program. As a basis function, 6-311G(d,p) was used, and as a functional, B3LYP was used. A high performance computer (ICE X manufactured by SGI Japan, Ltd.) was used for the calculation.

Each of the triplet excitation energy levels of the compounds in Table 3 is lower than each of the triplet excitation energy levels of the exciplexes 1 to 5 in Tables 1 and 2. Therefore, when the compound in Table 3 is used as the guest material 122 and the above-described compounds which form the exciplexes 1 to 5 are used as the host material 121, the energy transfer indicated by the routes $A_2$ and $E_4$ in FIG. 2B is likely to occur, and excitation energy can be efficiently transferred from the exciplex to the guest material 122.

Therefore, it is preferable that the triplet excitation energy level of each of compounds which form an exciplex be higher than the triplet excitation energy level of the exciplex. That is, it is preferable that the triplet excitation energy level of each of the organic compounds 121_1 and 121_2 be higher than the triplet excitation energy level of the exciplex formed by the organic compounds 121_1 and 121_2. It is also preferable that the triplet excitation energy level of the exciplex be higher than the triplet excitation energy level of the guest material 122. In the case where the exciplex exhibits thermally activated delayed fluorescence at room temperature, it is preferable that the phosphorescence emission energy of each of the organic compounds 121_1 and 121_2 be higher than the thermally activated delayed fluorescence emission energy of the exciplex formed by the organic compounds 121_1 and 121_2. It is also preferable that the thermally activated delayed fluorescence emission energy of the exciplex be higher than the phosphorescence emission energy of the guest material 122.

As described above, when the singlet excitation energy levels and the triplet excitation energy levels of the host material 121 and the guest material 122 in the light-emitting layer are set as described above in one embodiment of the present invention, a light-emitting element with high emission efficiency can be provided.

3. Components of Light-Emitting Element

Next, details of other components of the light-emitting element 150 in FIG. 1A will be described below.

3-1. Pair of Electrodes

The electrode 101 and the electrode 102 have functions of injecting holes and electrons into the light-emitting layer 113. The electrodes 101 and 102 can be formed using a metal, an alloy, or a conductive compound, or a mixture or a stack thereof, for example A typical example of the metal is aluminum (Al); besides, a transition metal such as silver (Ag), tungsten (W), chromium (Cr), molybdenum (Mo), copper (Cu), or titanium (Ti), an alkali metal such as lithium (Li), sodium (Na), or cesium (Cs), or a Group 2 metal such as calcium (Ca) or magnesium (Mg) can be used. As the transition metal, a rare earth metal such as ytterbium (Yb) may be used. An alloy containing any of the above metals can be used as the alloy, and MgAg and AlLi can be given as examples. As the conductive compound, a metal oxide such as indium oxide-tin oxide (indium tin oxide) can be given. It is also possible to use an inorganic carbon-based material such as graphene as the conductive compound. As described above, the electrode 101 and/or the electrode 102 may be formed by stacking two or more of these materials.

Light emitted from the light-emitting layer 113 is extracted through the electrode 101 and/or the electrode 102. Therefore, at least one of the electrodes 101 and 102 transmits visible light. In the case where the electrode through which light is extracted is formed using a material with low light transmittance, such as metal or alloy, the electrode 101 and/or the electrode 102 is formed to a thickness that is thin enough to transmit visible light (e.g., a thickness of 1 nm to 10 nm).

3-2. Hole-Injection Layer

The hole-injection layer 111 has a function of reducing a barrier for hole injection from the electrode 101 to promote hole injection and is formed using a transition metal oxide, a phthalocyanine derivative, or an aromatic amine, for example. As the transition metal oxide, molybdenum oxide, vanadium oxide, ruthenium oxide, tungsten oxide, manganese oxide, or the like can be given. As the phthalocyanine derivative, phthalocyanine, metal phthalocyanine, or the like can be given. As the aromatic amine, a benzidine derivative, a phenylenediamine derivative, or the like can be given. It is also possible to use a high molecular compound such as polythiophene or polyaniline; a typical example thereof is poly(ethylenedioxythiophene)/poly(styrenesulfonic acid), which is self-doped polythiophene.

As the hole-injection layer 111, a layer containing a composite material of a hole-transport material and a material having a property of accepting electrons from the hole-transport material can also be used. Alternatively, a stack of a layer containing a material having an electron accepting property and a layer containing a hole-transport material may also be used. In a steady state or in the presence of an electric field, electric charge can be transferred between these materials. As examples of the material having an electron-accepting property, organic acceptors such as a quinodimethane derivative, a chloranil derivative, and a hexaazatriphenylene derivative can be given. A specific example is a compound having an electron-withdrawing group (a halogen group or a cyano group), such as 7,7,8,8-tetracyano-2,3,5,6-tetrafluoroquinodimethane (abbreviation: $F_4$-TCNQ), chloranil, or 2,3,6,7,10,11-hexacyano-1,4,5,8,9,12-hexaazatriphenylene (abbreviation: HAT-CN). Alternatively, a transition metal oxide such as an oxide of a metal from Group 4 to Group 8 can also be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1\times10^{-6}$ cm$^2$/Vs or higher is preferable. Specifically, an aromatic amine, a carbazole derivative, an aromatic hydrocarbon, a stilbene derivative, or the like can be used. Furthermore, the hole-transport material may be a high molecular compound.

3-3. Hole-Transport Layer

The hole-transport layer 112 is a layer containing a hole-transport material and can be formed using any of the materials given as examples of the material of the hole-injection layer 111. In order that the hole-transport layer 112 has a function of transporting holes injected into the hole-injection layer 111 to the light-emitting layer 113, the HOMO level of the hole-transport layer 112 is preferably equal or close to the HOMO level of the hole-injection layer 111.

3-4. Electron-Transport Layer

The electron-transport layer 115 has a function of transporting, to the light-emitting layer 113, electrons injected from the electrode 102 through the electron-injection layer 116. A material having a property of transporting more electrons than holes can be used as an electron-transport material, and a material having an electron mobility of $1 \times 10^{-6}$ cm$^2$/Vs or higher is preferable. Specific examples include a metal complex having a quinoline ligand, a benzoquinoline ligand, an oxazole ligand, or a thiazole ligand; an oxadiazole derivative; a triazole derivative; a phenanthroline derivative; a pyridine derivative; and a bipyridine derivative.

3-5. Electron-Injection Layer

The electron-injection layer 116 has a function of reducing a barrier for electron injection from the electrode 102 to promote electron injection and can be formed using a Group 1 metal or a Group 2 metal, or an oxide, a halide, or a carbonate of any of the metals, for example. Alternatively, a composite material containing an electron-transport material (described above) and a material having a property of donating electrons to the electron-transport material can also be used. As the material having an electron-donating property, a Group 1 metal, a Group 2 metal, an oxide of any of the metals, or the like can be given.

Note that the hole-injection layer 111, the hole-transport layer 112, the electron-transport layer 115, and the electron-injection layer 116 described above can each be formed by an evaporation method (including a vacuum evaporation method), an inkjet method, a coating method, a gravure printing method, or the like.

Besides the above-mentioned materials, an inorganic compound or a high molecular compound (e.g., an oligomer, a dendrimer, or a polymer) may be used for the hole-injection layer 111, the hole-transport layer 112, the light-emitting layer 113, the electron-transport layer 115, and the electron-injection layer 116.

3-6. Substrate

The light-emitting element 150 is fabricated over a substrate of glass, plastic, or the like. As the way of stacking layers over the substrate, layers may be sequentially stacked from the electrode 101 side or sequentially stacked from the electrode 102 side.

Note that, for example, glass, quartz, plastic, or the like can be used for the substrate over which the light-emitting element 150 can be formed. Alternatively, a flexible substrate can be used. The flexible substrate is a substrate that can be bent, such as a plastic substrate made of polycarbonate or polyarylate, for example A film, an inorganic film formed by evaporation, or the like can also be used. Note that materials other than these can be used as long as they can function as a support in a manufacturing process of the light-emitting element and an optical element or as long as they have a function of protecting the light-emitting element and the optical element.

The light-emitting element 150 can be formed using a variety of substrates, for example. The type of substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. Examples of the glass substrate include a barium borosilicate glass substrate, an aluminoborosilicate glass substrate, and a soda lime glass substrate. Examples of the flexible substrate, the attachment film, the base film, and the like are substrates of plastics typified by polyethylene terephthalate (PET), polyethylene naphthalate (PEN), polyether sulfone (PES), and polytetrafluoroethylene (PTFE). Another example is a resin such as acrylic. Other examples are polypropylene, polyester, polyvinyl fluoride, polyvinyl chloride, and the like. Other examples are polyamide, polyimide, aramid, epoxy, an inorganic film formed by evaporation, paper, and the like.

Alternatively, a flexible substrate may be used as the substrate, and the light-emitting element may be provided directly on the flexible substrate. Alternatively, a separation layer may be provided between the substrate and the light-emitting element. The separation layer can be used when part or the whole of the light-emitting element formed over the separation layer is completed, separated from the substrate, and transferred to another substrate. In such a case, the light-emitting element can be transferred to a substrate having low heat resistance or a flexible substrate as well. For the above separation layer, a stack including inorganic films, which are a tungsten film and a silicon oxide film, or a resin film of polyimide or the like formed over a substrate can be used, for example.

In other words, after the light-emitting element is formed using a substrate, the light-emitting element may be transferred to another substrate. Examples of a substrate to which the light-emitting element is transferred include, in addition to the above-described substrates, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester, or the like), a leather substrate, and a rubber substrate. By using such a substrate, a light-emitting element with high durability, a light-emitting element with high heat resistance, a lightweight light-emitting element, or a thin light-emitting element can be obtained.

The light-emitting element 150 may be formed over an electrode electrically connected to a field-effect transistor (FET), for example, which is formed over the above-mentioned substrate, so that an active matrix display device in which the FET controls the drive of the light-emitting element 150 can be manufactured.

In this embodiment, one embodiment of the present invention has been described. Embodiments of the present invention are described in other embodiments. Note that one embodiment of the present invention is not limited to the above examples. For example, one embodiment of the present invention is not limited to the above example in which the host material has a difference of more than 0 eV and less than or equal to 0.2 eV between the singlet excitation energy level and the triplet excitation energy level. Depending on circumstances or conditions, the host material in one embodiment of the present invention does not necessarily have a difference of more than 0 eV and less than or equal to 0.2 eV between the singlet excitation energy level and the triplet excitation energy level, for example. Alternatively, one embodiment of the present invention is not limited to the above example in which the host material is a substance which exhibits thermally activated delayed fluorescence at room temperature. Depending on circumstances or conditions, the host material in one embodiment of the present invention may include a substance other than the substance which exhibits thermally activated delayed fluorescence at room temperature, for example. Alternatively, depending on circumstances or conditions, the host material in one embodiment of the present invention does not necessarily include the substance which exhibits thermally activated delayed fluorescence at room temperature, for example. Alternatively, one embodiment of the present invention is not limited to the above example in which the triplet excitation energy level of the host material is higher than the triplet excitation energy level of the guest material. Depending on circumstances or conditions, the triplet excitation energy level of the host material in one embodiment of the present invention is not necessarily higher than the triplet excitation energy level of the guest material, for example.

The structure described above in this embodiment can be combined with any of the structures described in the other embodiments as appropriate.

Embodiment 2

In this embodiment, a light-emitting element having a structure different from that described in Embodiment 1 and an emission mechanism of the light-emitting element will be described below with reference to FIGS. 5A and 5B.

Structure Example of Light-Emitting Element

Figure 5A:
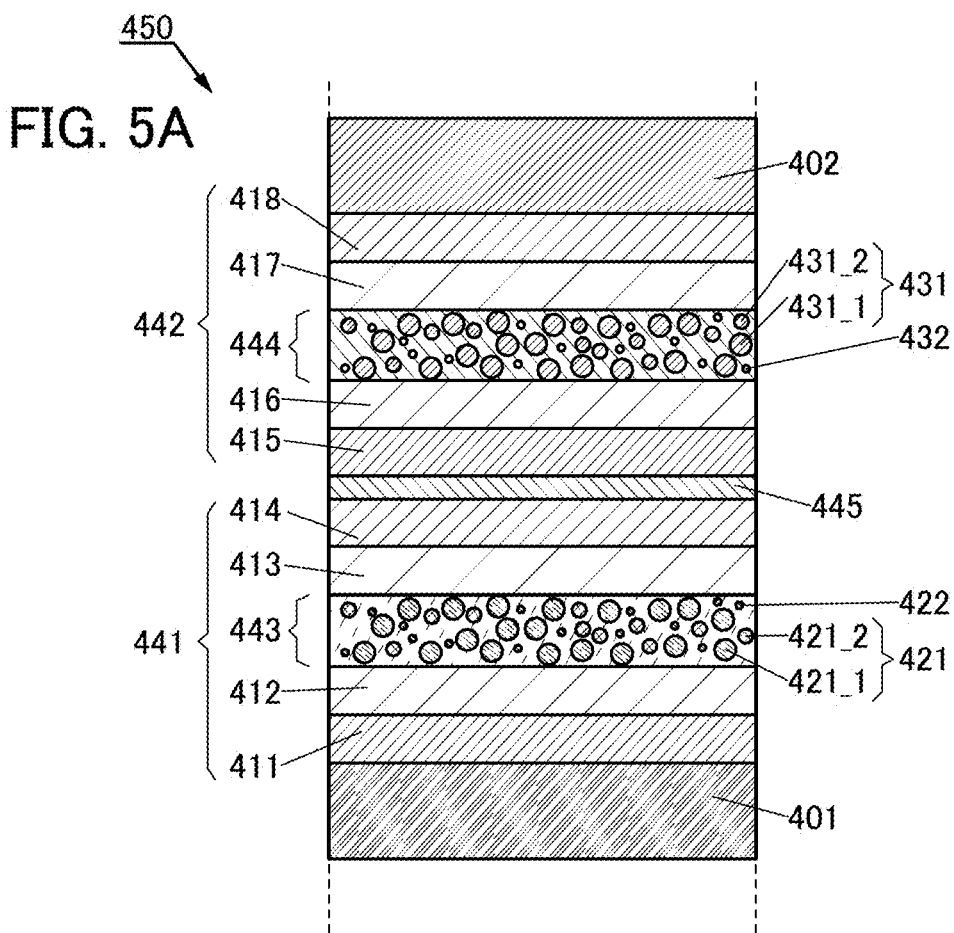
FIGS. 5A and 5B are a schematic cross-sectional view of a light-emitting element and a diagram illustrating the correlation of energy levels in a light-emitting layer.

FIG. 5A is a schematic cross-sectional view of a light-emitting element 450.

The light-emitting element 450 illustrated in FIG. 5A includes a plurality of light-emitting units (in FIG. 5A, a light-emitting unit 441 and a light-emitting unit 442) between a pair of electrodes (an electrode 401 and an electrode 402). One light-emitting unit has the same structure as the EL layer 100 illustrated in FIG. 1A. That is, the light-emitting element 150 in FIG. 1A includes one light-emitting unit, while the light-emitting element 450 includes the plurality of light-emitting units. Note that the electrode 401 functions as an anode and the electrode 402 functions as a cathode in the following description of the light-emitting element 450; however, the functions may be interchanged in the light-emitting element 450.

In the light-emitting element 450 illustrated in FIG. 5A, the light-emitting unit 441 and the light-emitting unit 442 are stacked, and a charge-generation layer 445 is provided between the light-emitting unit 441 and the light-emitting unit 442. Note that the light-emitting unit 441 and the light-emitting unit 442 may have the same structure or different structures. For example, it is preferable that the EL layer 100 illustrated in FIG. 1A be used in the light-emitting unit 441 and that a light-emitting layer containing a phosphorescent material as a light-emitting material be used in the light-emitting unit 442.

That is, the light-emitting element 450 includes a light-emitting layer 443 and a light-emitting layer 444. The light-emitting unit 441 includes a hole-injection layer 411, a hole-transport layer 412, an electron-transport layer 413, and an electron-injection layer 414 in addition to the light-emitting layer 443. The light-emitting unit 442 includes a hole-injection layer 415, a hole-transport layer 416, an electron-transport layer 417, and an electron-injection layer 418 in addition to the light-emitting layer 444.

The charge-generation layer 445 contains a composite material of an organic compound and an acceptor substance. For the composite material, the composite material that can be used for the hole-injection layer 111 described in Embodiment 1 may be used. As the organic compound, a variety of compounds such as an aromatic amine compound, a carbazole compound, an aromatic hydrocarbon, and a high molecular compound (such as an oligomer, a dendrimer, or a polymer) can be used. An organic compound having a hole mobility of $1 \times 10^{-6}$ cm$^2$/Vs or higher is preferably used. Note that any other substance may be used as long as the substance has a property of transporting more holes than electrons. Since the composite material of an organic compound and an acceptor substance has excellent carrier-injection and carrier-transport properties, low-voltage driving or low-current driving can be realized. Note that when a surface of a light-emitting unit on the anode side is in contact with the charge-generation layer 445 as that of the light-emitting unit 442, the charge-generation layer 445 can also serve as a hole-injection layer or a hole-transport layer of the light-emitting unit; thus, a hole-injection layer or a hole-transport layer does not need to be included in the light-emitting unit.

The charge-generation layer 445 may have a stacked-layer structure of a layer containing the composite material of an organic compound and an acceptor substance and a layer containing another material. For example, the charge-generation layer 445 may be formed using a combination of a layer containing the composite material of an organic compound and an acceptor substance with a layer containing one compound selected from among electron-donating substances and a compound having a high electron-transport property. Furthermore, the charge-generation layer 445 may be formed using a combination of a layer containing the composite material of an organic compound and an acceptor substance with a layer including a transparent conductive film.

The charge-generation layer 445 can be formed by an evaporation method (including a vacuum evaporation method), an inkjet method, a coating method, a gravure printing method, or the like.

The charge-generation layer 445 provided between the light-emitting unit 441 and the light-emitting unit 442 may have any structure as long as electrons can be injected to the light-emitting unit on one side and holes can be injected into the light-emitting unit on the other side when a voltage is applied between the electrode 401 and the electrode 402. For example, in FIG. 5A, the charge-generation layer 445 injects electrons into the light-emitting unit 441 and holes into the light-emitting unit 442 when a voltage is applied such that the potential of the electrode 401 is higher than that of the electrode 402.

The light-emitting element having two light-emitting units is described with reference to FIG. 5A; however, a similar structure can be applied to a light-emitting element in which three or more light-emitting units are stacked. With a plurality of light-emitting units partitioned by the charge-generation layer between a pair of electrodes as in the light-emitting element 450, it is possible to provide a light-emitting element which can emit light with high luminance with the current density kept low and has a long lifetime. A light-emitting element with low power consumption can be provided.

When the structure of the EL layer 100 is applied to at least one of the plurality of units, a light-emitting element with high emission efficiency can be provided.

The light-emitting layer 443 contains a host material 421 and a guest material 422. The light-emitting layer 444 contains a host material 431 and a guest material 432. The host material 421 includes an organic compound 421_1 and an organic compound 421_2. The host material 431 includes an organic compound 431_1 and an organic compound 431_2.

In this embodiment, the light-emitting layer 443 has a structure similar to that of the light-emitting layer 113 in FIG. 2A. That is, the host material 421 (the organic compound 421_1 and the organic compound 421_2) and the guest material 422 in the light-emitting layer 443 correspond to the host material 121 (the organic compound 121_1 and the organic compound 121_2) and the guest material 122 in the light-emitting layer 113, respectively. In the following description, the guest material 432 contained in the light-emitting layer 444 is a phosphorescent material. Note that the electrode 401, the electrode 402, the hole-injection layers 411 and 415, the hole-transport layers 412 and 416, the electron-transport layers 413 and 417, and the electron-injection layers 414 and 418 correspond to the electrode 101, the electrode 102, the hole-injection layer 111, the hole-transport layer 112, the electron-transport layer 115, and the electron-injection layer 116 in Embodiment 1, respectively. Therefore, detailed description thereof is omitted in this embodiment.

Emission Mechanism of Light-Emitting Layer 443

An emission mechanism of the light-emitting layer 443 is similar to that of the light-emitting layer 113 in FIG. 2B.

Emission Mechanism of Light-Emitting Layer 444

Next, an emission mechanism of the light-emitting layer 444 will be described below.

The organic compound 431_1 and the organic compound 431_2 which are contained in the light-emitting layer 444 form an exciplex. The organic compound 431_1 serves as a host material and the organic compound 431_2 serves as an assist material in the description here.

Although it is acceptable as long as the combination of the organic compound 431_1 and the organic compound 431_2 in the light-emitting layer 444 can form an exciplex, it is preferred that one organic compound be a material having a hole-transport property and the other organic compound be a material having an electron-transport property. Note that the combination of the organic compound 431_1 and the organic compound 431_2 may be similar to the combination of the organic compound 421_1 and the organic compound 421_2 which form an exciplex in the light-emitting layer 443.

Figure 5B:
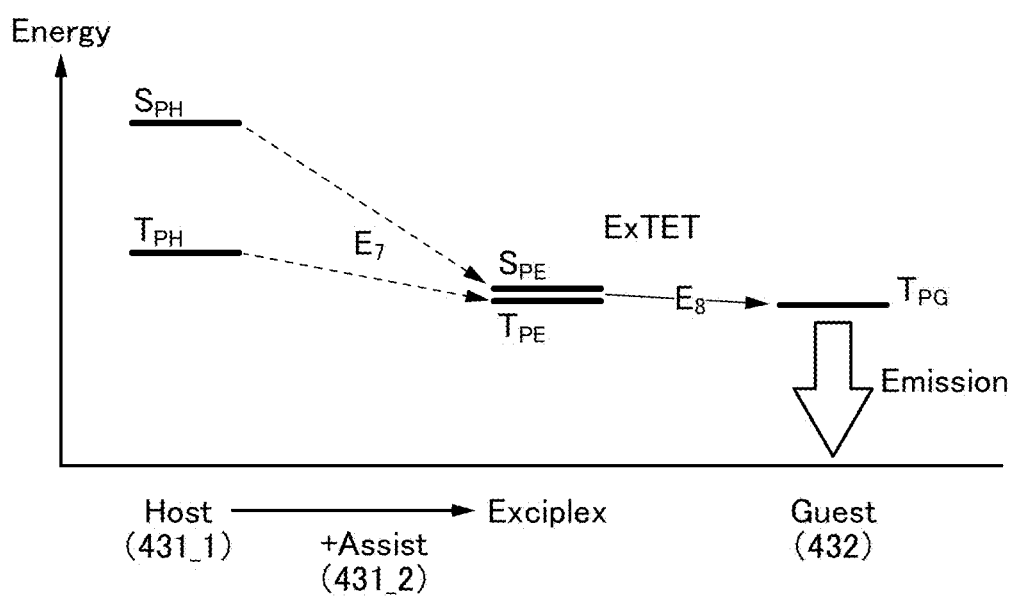

FIG. 5B illustrates the correlation of energy levels of the organic compound 431_1, the organic compound 431_2, and the guest material 432 in the light-emitting layer 444. The following explains what terms and signs in FIG. 5B represent:

Host (431_1): the host material (organic compound 431_1);
Assist (431_2): the assist material (organic compound 431_2);
Guest (432): the guest material 432 (phosphorescent material);
$S_{PH}$: the level of the lowest singlet excited state of the host material (organic compound 431_1);
$T_{PH}$: the level of the lowest triplet excited state of the host material (organic compound 431_1);
$T_{PG}$: the level of the lowest triplet excited state of the guest material 432 (the phosphorescent material);
$S_{PE}$: the level of the lowest singlet excited state of the exciplex; and
$T_{PE}$: the level of the lowest triplet excited state of the exciplex.

The level ($S_{PE}$) of the lowest singlet excited state of the exciplex, which is formed by the organic compound 431_1 and the organic compound 431_2, and the level ($T_{PE}$) of the lowest triplet excited state of the exciplex are close to each other (see $E_7$ in FIG. 5B).

Both energies of $S_{PE}$ and $T_{PE}$ of the exciplex are then transferred to the level ($T_{PG}$) of the lowest triplet excited state of the guest material 432 (the phosphorescent material); thus, light emission is obtained (see $E_8$ in FIG. 5B).

The above-described processes through the route $E_7$ and the route $E_8$ may be referred to as exciplex-triplet energy transfer (ExTET) in this specification and the like.

When one of the organic compounds 431_1 and 431_2 receiving holes and the other receiving electrons come close to each other, the exciplex is formed at once. Alternatively, when one compound is brought into an excited state, the one immediately takes in the other compound to form the exciplex. Therefore, most excitons in the light-emitting layer 444 exist as the exciplexes. The band gap of the exciplex is narrower than that of each of the organic compounds 431_1 and 431_2; therefore, the driving voltage of the light-emitting element can be lowered when the exciplex is formed.

When the light-emitting layer 444 has the above structure, light emission from the guest material 432 (the phosphorescent material) of the light-emitting layer 444 can be efficiently obtained.

Note that light emitted from the light-emitting layer 443 preferably has a peak on the shorter wavelength side than light emitted from the light-emitting layer 444. The luminance of a light-emitting element using the phosphorescent material emitting light with a short wavelength tends to degrade quickly. In view of the above, fluorescence is used for light emission with a short wavelength, so that a light-emitting element with less degradation of luminance can be provided.

Furthermore, the light-emitting layer 443 and the light-emitting layer 444 may be made to emit light with different emission wavelengths, so that the light-emitting element can be a multicolor light-emitting element. In that case, the emission spectrum is formed by combining light having different emission peaks, and thus has at least two peaks.

The above structure is also suitable for obtaining white light emission. When the light-emitting layer 443 and the light-emitting layer 444 emit light of complementary colors, white light emission can be obtained.

In addition, white light emission with a high color rendering property that is formed of three primary colors or four or more colors can be obtained by using a plurality of light-emitting substances emitting light with different wavelengths for one of the light-emitting layers 443 and 444 or both. In that case, one of the light-emitting layers 443 and 444 or both may be divided into layers and each of the divided layers may contain a different light-emitting material from the others.

Next, materials that can be used for the light-emitting layers 443 and 444 will be described.

Material that can be Used for Light-Emitting Layer 443

A material that can be used for the light-emitting layer 113 described in the above embodiment may be used as a material that can be used for the light-emitting layer 443.

Material that can be Used for Light-Emitting Layer 444

In the light-emitting layer 444, the host material (the organic compound 431_1 and the organic compound 431_2) is present in the highest proportion in weight ratio, and the guest material 432 (the phosphorescent material) is dispersed in the host material (the organic compound 431_1 and the organic compound 431_2).

Examples of the organic compound 431_1 (the host material) include a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, and the like. Other examples are an aromatic amine, a carbazole derivative, and the like.

As the organic compound 431_2 (the assist material), a substance which can form an exciplex together with the organic compound 431_1 is used. In that case, it is preferable that the organic compound 431_1, the organic compound 431_2, and the guest material 432 (the phosphorescent material) be selected such that the emission peak of the exciplex overlaps with an adsorption band, specifically an adsorption band on the longest wavelength side, of a triplet metal to ligand charge transfer (MLCT) transition of the phosphorescent material. This makes it possible to provide a light-emitting element with drastically improved emission efficiency. Note that in the case where a thermally activated delayed fluorescence material is used instead of the phosphorescent material, it is preferable that the adsorption band on the longest wavelength side be a singlet absorption band.

As the guest material 432 (the phosphorescent material), an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, and the like can be given. As the metal complex, a platinum complex having a porphyrin ligand or the like can be given.

As the guest material 432 included in the light-emitting layer 444, any material can be used as long as the material can convert triplet excitation energy into light emission. As an example of the material that can convert triplet excitation energy into light emission, a thermally activated delayed fluorescence material can be given in addition to the phosphorescent material. Therefore, the term "phosphorescent material" in the description can be replaced with the term "thermally activated delayed fluorescence material". Note that the thermally activated delayed fluorescence material is a material that can up-convert a triplet excited state into a singlet excited state (i.e., reverse intersystem crossing is possible) using a little thermal energy and efficiently exhibits light emission (fluorescence) from the singlet excited state. Thermally activated delayed fluorescence is efficiently obtained under the condition where the difference between the triplet excitation energy level and the singlet excitation energy level is more than 0 eV and less than or equal to 0.2 eV, preferably more than 0 eV and less than or equal to 0.1 eV.

There is no limitation on the emission colors of the light-emitting material included in the light-emitting layer 443 and the light-emitting material included in the light-emitting layer 444, and they may be the same or different. Light emitted from the light-emitting materials is mixed and extracted out of the element; therefore, for example, in the case where their emission colors are complementary colors, the light-emitting element can emit white light. In consideration of the reliability of the light-emitting element, the emission peak wavelength of the light-emitting material (the guest material 422) included in the light-emitting layer 443 is preferably shorter than that of the light-emitting material (the guest material 432) included in the light-emitting layer 444.

Note that the light-emitting layers 443 and 444 can be formed by an evaporation method (including a vacuum evaporation method), an inkjet method, a coating method, gravure printing, or the like.

Note that the structure described above in this embodiment can be combined with any of the structures described in the other embodiments as appropriate.

Embodiment 3

In this embodiment, a light-emitting element having a structure different from those described in Embodiment 1 and Embodiment 2 will be described below with reference to FIGS. 6A and 6B.

Structure Example of Light-Emitting Element

Figure 6A:
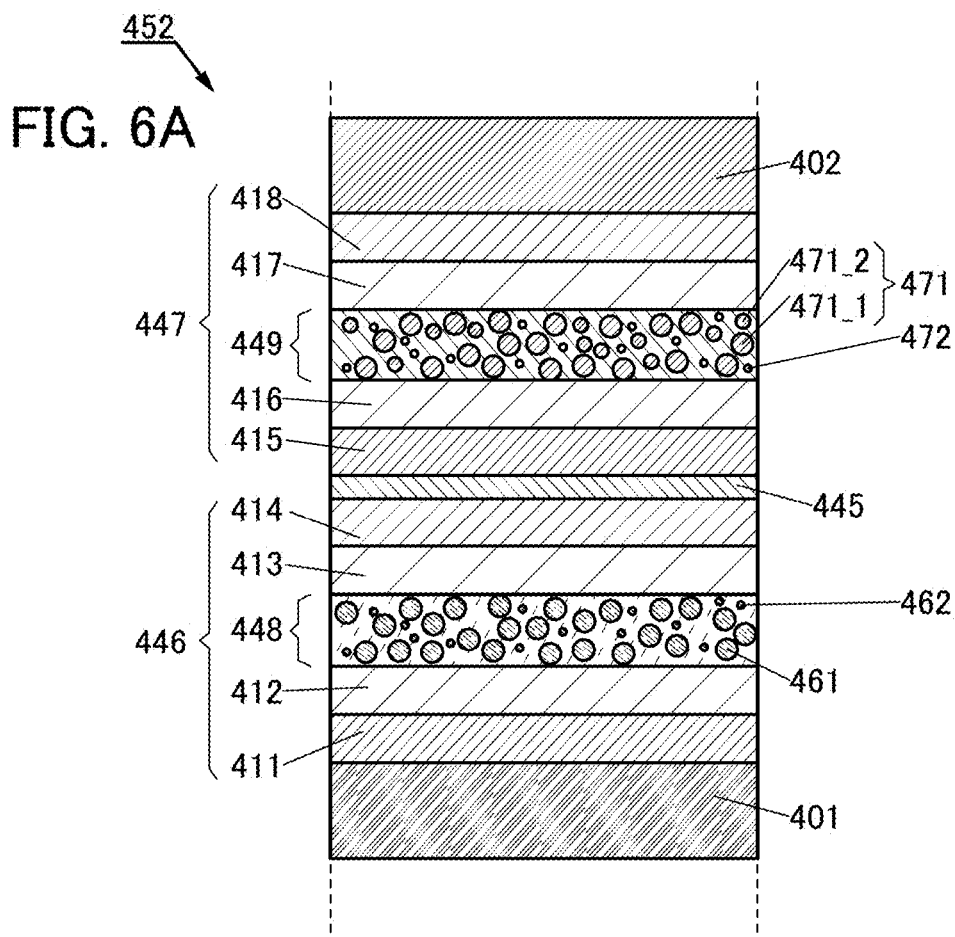
FIGS. 6A and 6B are a schematic cross-sectional view of a light-emitting element and a diagram illustrating the correlation of energy levels in a light-emitting layer.

FIG. 6A is a schematic cross-sectional view of a light-emitting element 452 of one embodiment of the present invention.

The light-emitting element 452 includes a plurality of light-emitting units (in FIG. 6A, a light-emitting unit 446 and a light-emitting unit 447) between an electrode 401 and an electrode 402. One light-emitting unit has the same structure as the EL layer 100 illustrated in FIG. 1A. That is, the light-emitting element 150 in FIG. 1A includes one light-emitting unit, while the light-emitting element 452 includes the plurality of light-emitting units. Note that the electrode 401 functions as an anode and the electrode 402 functions as a cathode in the following description of this embodiment; however, the functions may be interchanged in the light-emitting element 452.

In the light-emitting element 452 illustrated in FIG. 6A, the light-emitting unit 446 and the light-emitting unit 447 are stacked, and a charge-generation layer 445 is provided between the light-emitting unit 446 and the light-emitting unit 447. Note that the light-emitting unit 446 and the light-emitting unit 447 may have the same structure or different structures. For example, it is preferable that a light-emitting layer containing a fluorescent material as a light-emitting material be used in the light-emitting unit 446 and that the EL layer 100 illustrated in FIG. 1A be used in the light-emitting unit 447.

That is, the light-emitting element 452 includes a light-emitting layer 448 and a light-emitting layer 449. The light-emitting unit 446 includes a hole-injection layer 411, a hole-transport layer 412, an electron-transport layer 413, and an electron-injection layer 414 in addition to the light-emitting layer 448. The light-emitting unit 447 includes a hole-injection layer 415, a hole-transport layer 416, an electron-transport layer 417, and an electron-injection layer 418 in addition to the light-emitting layer 449.

The light-emitting element having two light-emitting units is described with reference to FIG. 6A; however, a similar structure can be applied to a light-emitting element in which three or more light-emitting units are stacked. With a plurality of light-emitting units partitioned by the charge-generation layer between a pair of electrodes as in the light-emitting element 452, it is possible to provide a light-emitting element which can emit light with high luminance with the current density kept low and has a long lifetime. A display device with low power consumption can be provided.

When the structure of the EL layer 100 is applied to at least one of the plurality of units, a light-emitting element with high emission efficiency can be provided.

The light-emitting layer 448 contains a host material 461 and a guest material 462. The light-emitting layer 449 contains a host material 471 and a guest material 472. The host material 471 includes an organic compound 471_1 and an organic compound 471_2.

In this embodiment, the light-emitting layer 449 has a structure similar to that of the light-emitting layer 113 in FIG. 2A. That is, the host material 471 (the organic compound 471_1 and the organic compound 471_2) and the guest material 472 in the light-emitting layer 449 correspond to the host material 121 (the organic compound 121_1 and the organic compound 121_2) and the guest material 122 in the light-emitting layer 113, respectively. In the following description, the guest material 462 contained in the light-emitting layer 448 is a fluorescent material.

Emission Mechanism of Light-Emitting Layer 448

First, an emission mechanism of the light-emitting layer 448 will be described below.

In the light-emitting layer 448, excitons are generated by recombination of carriers. Because the amount of the host material 461 is large as compared to the guest material 462, the host material 461 is brought into an excited state by the exciton generation. The ratio of singlet excitons to triplet excitons generated by carrier recombination (hereinafter referred to as exciton generation probability) is approximately 1:3.

Note that the term "exciton" refers to a carrier (electron and hole) pair. Since excitons have energy, a material where excitons are generated is brought into an excited state.

First, a case where the $T_1$ level of the host material 461 is higher than the $T_1$ level of the guest material 462 will be described below.

The triplet excitation energy of the host material 461 is transferred from the $T_1$ level of the host material 461 to the $T_1$ level of the guest material 462 (triplet energy transfer). However, the triplet excitation energy does not provide light emission in a visible light region because the guest material 462 is the fluorescent material. Thus, it is difficult to use the triplet excitation energy of the host material 461 for light emission. Therefore, when the $T_1$ level of the host material 461 is higher than the $T_1$ level of the guest material 462, it is difficult to use more than approximately 25% of injected carriers for light emission.

Figure 6B:
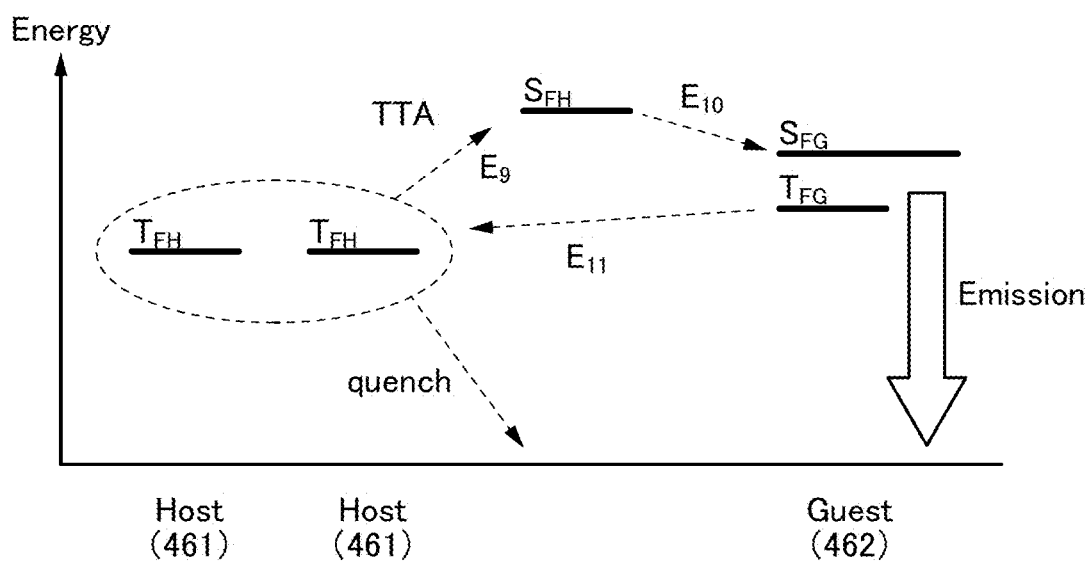

FIG. 6B illustrates the correlation of energy levels of the host material 461 and the guest material 462 in the light-emitting layer 448 of one embodiment of the present invention. The following explains what terms and signs in FIG. 6B represent:

Host: the host material 461;
Guest: the guest material 462 (fluorescent material);
$S_{FH}$: the level of the lowest singlet excited state of the host material 461 ($S_1$ level);
$T_{FH}$: the level of the lowest triplet excited state of the host material 461 ($T_1$ level);
$S_{FG}$: the level of the lowest singlet excited state of the guest material 462 (fluorescent material) ($S_1$ level); and
$T_{FG}$: the level of the lowest triplet excited state of the guest material 462 (fluorescent material) ($T_1$ level).

As illustrated in FIG. 6B, the $T_1$ level of the guest material 462 ($T_{FG}$ in FIG. 6B) is higher than the $T_1$ level of the host material 461 ($T_{FH}$ in FIG. 6B).

In addition, as illustrated in FIG. 6B, triplet excitons collide with each other by triplet-triplet annihilation (TTA) (see $E_9$ in FIG. 6B), and some of them are converted into singlet excitons having an energy at the level of the lowest singlet excited state of the host material 461 ($S_{FH}$). The singlet excitation energy of the host material 461 is transferred from the level of the lowest singlet excited state of the host material 461 ($S_{FH}$) to the level of the lowest singlet excited state of the guest material 462 (the fluorescent material) ($SF_G$) that is a level lower than $S_{FH}$ (see $E_{10}$ in FIG. 6B). Thus, the guest material 462 (the fluorescent material) is brought into the singlet excited state and accordingly emits light.

Because the $T_1$ level of the host material is lower than the $T_1$ level of the guest material, excitation energy at $T_{FG}$ is transferred to $T_{FH}$ without deactivation (see $E_{11}$ in FIG. 6B), which is utilized for TTA.

When the light-emitting layer 448 has the above structure, light emission from the guest material 462 of the light-emitting layer 448 can be efficiently obtained.

Note that the light-emitting layer 448 and the light-emitting layer 449 may be made to emit light with different emission wavelengths, so that the light-emitting element can be a multicolor light-emitting element. In that case, the emission spectrum is formed by combining light having different emission peaks, and thus has at least two peaks.

The above structure is also suitable for obtaining white light emission. When the light-emitting layer 448 and the light-emitting layer 449 emit light of complementary colors, white light emission can be obtained.

In addition, white light emission with a high color rendering property that is formed of three primary colors or four or more colors can be obtained by using a plurality of light-emitting substances emitting light with different wavelengths for one of the light-emitting layers 448 and 449 or both. In that case, one of the light-emitting layers 448 and 449 or both may be divided into layers and each of the divided layers may contain a different light-emitting material from the others.

Emission Mechanism of Light-Emitting Layer 449

An emission mechanism of the light-emitting layer 449 is similar to that of the light-emitting layer 113 in FIG. 2B.

Next, materials that can be used for the light-emitting layers 448 and 449 will be described.

Material that can be Used for Light-Emitting Layer 448

In the light-emitting layer 448, the host material 461 is present in the highest proportion in weight ratio, and the guest material 462 (the fluorescent material) is dispersed in the host material 461. The $S_1$ level of the host material 461 is preferably higher than the $S_1$ level of the guest material 462 (the fluorescent material), while the $T_1$ level of the host material 461 is preferably lower than the $T_1$ level of the guest material 462 (the fluorescent material).

An anthracene derivative or a tetracene derivative is preferably used as the host material 461. This is because these derivatives each have a high $S_1$ level and a low $T_1$ level. Specific examples include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), and 9-phenyl-10-{4-(9-phenyl-9H-fluoren-9-yl)biphenyl-4'-yl}anthracene (abbreviation: FLPPA). Besides, 5,12-diphenyltetracene, 5,12-bis(biphenyl-2-yl)tetracene, and the like can be given.

Examples of the guest material 462 (the fluorescent material) include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, a naphthalene derivative, and the like. A pyrene derivative is particularly preferable because it has a high emission quantum yield. Specific examples of the pyrene derivative include N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9-phenyl-9H-fluoren-9-yl)phenyl]-N,N'-diphenylpyrene-1,6-diamine (abbreviation: 1,6FLPAPrn), N,N'-bis(dibenzofuran-2-yl)-N,N'-diphenylpyrene-1,6-diamine (abbreviation: 1,6FrAPrn), N,N'-bis(dibenzothiophen-2-yl)-N,N'-diphenylpyrene-1,6-diamine (abbreviation: 1,6ThAPrn), and the like.

Material that can be Used for Light-Emitting Layer 449

A material that can be used for the light-emitting layer 113 described in the above embodiment may be used as a material that can be used for the light-emitting layer 449.

There is no limitation on the emission colors of the light-emitting material included in the light-emitting layer 448 and the light-emitting material included in the light-emitting layer 449, and they may be the same or different. Light emitted from the light-emitting materials is mixed and extracted out of the element; therefore, for example, in the case where their emission colors are complementary colors, the light-emitting element can emit white light. In consideration of the reliability of the light-emitting element, the emission peak wavelength of the light-emitting material (the guest material 462) included in the light-emitting layer 448 is preferably shorter than that of the light-emitting material (the guest material 472) included in the light-emitting layer 449.

Note that the light-emitting layers 448 and 449 can be formed by an evaporation method (including a vacuum evaporation method), an inkjet method, a coating method, gravure printing, or the like.

Note that the above-described structure can be combined with any of the structures in this embodiment and the other embodiments.

Embodiment 4

In this embodiment, a display device including a light-emitting element of one embodiment of the present invention will be described with reference to FIGS. 7A and 7B.

Figure 7A:
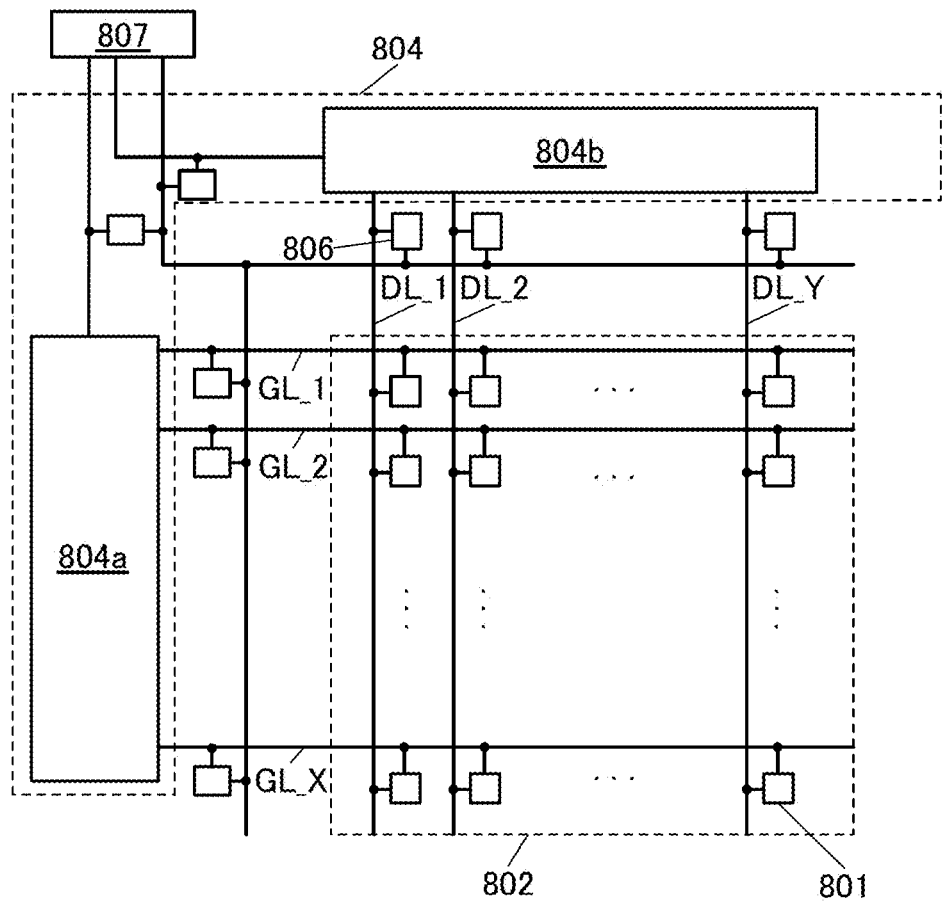
FIGS. 7A and 7B are a block diagram and a circuit diagram illustrating a display device.
Figure 7B:
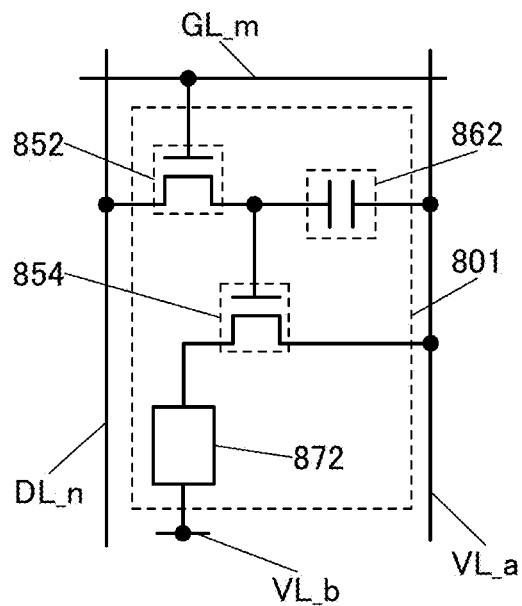

FIG. 7A is a block diagram illustrating the display device of one embodiment of the present invention, and FIG. 7B is a circuit diagram illustrating a pixel circuit of the display device of one embodiment of the present invention.

Display Device

The display device illustrated in FIG. 7A includes a region including pixels of display elements (the region is hereinafter referred to as a pixel portion 802), a circuit portion provided outside the pixel portion 802 and including circuits for driving the pixels (the portion is hereinafter referred to as a driver circuit portion 804), circuits having a function of protecting elements (the circuits are hereinafter referred to as protection circuits 806), and a terminal portion 807. Note that the protection circuits 806 are not necessarily provided.

A part or the whole of the driver circuit portion 804 is preferably formed over a substrate over which the pixel portion 802 is formed, in which case the number of components and the number of terminals can be reduced. When a part or the whole of the driver circuit portion 804 is not formed over the substrate over which the pixel portion 802 is formed, the part or the whole of the driver circuit portion 804 can be mounted by chip-on-glass (COG) or tape automated bonding (TAB).

The pixel portion 802 includes a plurality of circuits for driving display elements arranged in X rows (X is a natural number of 2 or more) and Y columns (Y is a natural number of 2 or more) (such circuits are hereinafter referred to as pixel circuits 801). The driver circuit portion 804 includes driver circuits such as a circuit for supplying a signal (scan signal) to select a pixel (the circuit is hereinafter referred to as a scan line driver circuit 804a) and a circuit for supplying a signal (data signal) to drive a display element in a pixel (the circuit is hereinafter referred to as a signal line driver circuit 804b).

The scan line driver circuit 804a includes a shift register or the like. Through the terminal portion 807, the scan line driver circuit 804a receives a signal for driving the shift register and outputs a signal. For example, the scan line driver circuit 804a receives a start pulse signal, a clock signal, or the like and outputs a pulse signal. The scan line driver circuit 804a has a function of controlling the potentials of wirings supplied with scan signals (such wirings are hereinafter referred to as scan lines GL_1 to GL_X). Note that a plurality of scan line driver circuits 804a may be provided to control the scan lines GL_1 to GL_X separately. Alternatively, the scan line driver circuit 804a has a function of supplying an initialization signal. Without being limited thereto, the scan line driver circuit 804a can supply another signal.

The signal line driver circuit 804*b* includes a shift register or the like. The signal line driver circuit 804*b* receives a signal (video signal) from which a data signal is derived, as well as a signal for driving the shift register, through the terminal portion 807. The signal line driver circuit 804*b* has a function of generating a data signal to be written to the pixel circuit 801 which is based on the video signal. In addition, the signal line driver circuit 804*b* has a function of controlling output of a data signal in response to a pulse signal produced by input of a start pulse signal, a clock signal, or the like. Furthermore, the signal line driver circuit 804*b* has a function of controlling the potentials of wirings supplied with data signals (such wirings are hereinafter referred to as data lines DL_1 to DL_Y). Alternatively, the signal line driver circuit 804*b* has a function of supplying an initialization signal. Without being limited thereto, the signal line driver circuit 804*b* can supply another signal.

The signal line driver circuit 804*b* includes a plurality of analog switches or the like, for example. The signal line driver circuit 804*b* can output, as the data signals, signals obtained by time-dividing the video signal by sequentially turning on the plurality of analog switches. The signal line driver circuit 804*b* may include a shift register or the like.

A pulse signal and a data signal are input to each of the plurality of pixel circuits 801 through one of the plurality of scan lines GL supplied with scan signals and one of the plurality of data lines DL supplied with data signals, respectively. Writing and holding of the data signal to and in each of the plurality of pixel circuits 801 are controlled by the scan line driver circuit 804*a*. For example, to the pixel circuit 801 in the m-th row and the n-th column (m is a natural number of less than or equal to X, and n is a natural number of less than or equal to Y), a pulse signal is input from the scan line driver circuit 804*a* through the scan line GL_m, and a data signal is input from the signal line driver circuit 804*b* through the data line DL_n in accordance with the potential of the scan line GL_m.

The protection circuit 806 shown in FIG. 7A is connected to, for example, the scan line GL between the scan line driver circuit 804*a* and the pixel circuit 801. Alternatively, the protection circuit 806 is connected to the data line DL between the signal line driver circuit 804*b* and the pixel circuit 801. Alternatively, the protection circuit 806 can be connected to a wiring between the scan line driver circuit 804*a* and the terminal portion 807. Alternatively, the protection circuit 806 can be connected to a wiring between the signal line driver circuit 804*b* and the terminal portion 807. Note that the terminal portion 807 means a portion having terminals for inputting power, control signals, and video signals to the display device from external circuits.

The protection circuit 806 is a circuit that electrically connects a wiring connected to the protection circuit to another wiring when a potential out of a certain range is applied to the wiring connected to the protection circuit.

As illustrated in FIG. 7A, the protection circuits 806 are provided for the pixel portion 802 and the driver circuit portion 804, so that the resistance of the display device to overcurrent generated by electrostatic discharge (ESD) or the like can be improved. Note that the configuration of the protection circuits 806 is not limited to that, and for example, a configuration in which the protection circuits 806 are connected to the scan line driver circuit 804*a* or a configuration in which the protection circuits 806 are connected to the signal line driver circuit 804*b* may be employed. Alternatively, the protection circuits 806 may be configured to be connected to the terminal portion 807.

In FIG. 7A, an example in which the driver circuit portion 804 includes the scan line driver circuit 804*a* and the signal line driver circuit 804*b* is shown; however, the structure is not limited thereto. For example, only the scan line driver circuit 804*a* may be formed and a separately prepared substrate where a signal line driver circuit is formed (e.g., a driver circuit substrate formed with a single crystal semiconductor film or a polycrystalline semiconductor film) may be mounted.

Structural Example of Pixel Circuit

Each of the plurality of pixel circuits 801 in FIG. 7A can have a structure illustrated in FIG. 7B, for example.

The pixel circuit 801 illustrated in FIG. 7B includes transistors 852 and 854, a capacitor 862, and a light-emitting element 872.

One of a source electrode and a drain electrode of the transistor 852 is electrically connected to a wiring to which a data signal is supplied (hereinafter referred to as a signal line DL_n). A gate electrode of the transistor 852 is electrically connected to a wiring to which a gate signal is supplied (hereinafter referred to as a scan line GL_m).

The transistor 852 has a function of controlling whether to write a data signal.

One of a pair of electrodes of the capacitor 862 is electrically connected to a wiring to which a potential is supplied (hereinafter referred to as a potential supply line VL_a), and the other is electrically connected to the other of the source electrode and the drain electrode of the transistor 852.

The capacitor 862 functions as a storage capacitor for storing written data.

One of a source electrode and a drain electrode of the transistor 854 is electrically connected to the potential supply line VL_a. Furthermore, a gate electrode of the transistor 854 is electrically connected to the other of the source electrode and the drain electrode of the transistor 852.

One of an anode and a cathode of the light-emitting element 872 is electrically connected to a potential supply line VL_b, and the other is electrically connected to the other of the source electrode and the drain electrode of the transistor 854.

As the light-emitting element 872, any of the light-emitting elements described in Embodiments 1 to 3 can be used.

Note that a high power supply potential VDD is supplied to one of the potential supply line VL_a and the potential supply line VL_b, and a low power supply potential VSS is supplied to the other.

In the display device including the pixel circuits 801 in FIG. 7B, the pixel circuits 801 are sequentially selected row by row by the scan line driver circuit 804*a* in FIG. 7A, for example, whereby the transistors 852 are turned on and a data signal is written.

When the transistors 852 are turned off, the pixel circuits 801 in which the data has been written are brought into a holding state. Furthermore, the amount of current flowing between the source electrode and the drain electrode of the transistor 854 is controlled in accordance with the potential of the written data signal. The light-emitting element 872 emits light with a luminance corresponding to the amount of flowing current. This operation is sequentially performed row by row; thus, an image is displayed.

A light-emitting element of one embodiment of the present invention can be used for an active matrix method in which an active element is included in a pixel of a display device or a passive matrix method in which an active element is not included in a pixel of a display device.

In the active matrix method, as an active element (a non-linear element), not only a transistor but also a variety of active elements (non-linear elements) can be used. For example, a metal insulator metal (MIM), a thin film diode (TFD), or the like can also be used. Since these elements can be formed with a smaller number of manufacturing steps, manufacturing cost can be reduced or yield can be improved. Alternatively, since the size of these elements is small, the aperture ratio can be improved, so that power consumption can be reduced or higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or yield can be improved. Alternatively, since an active element (a non-linear element) is not used, the aperture ratio can be improved, so that power consumption can be reduced or higher luminance can be achieved, for example.

The structure described in this embodiment can be combined with any of the structures described in the other embodiments as appropriate.

Embodiment 5

In this embodiment, a display device including a light-emitting element of one embodiment of the present invention and an electronic device in which the display device is provided with an input device will be described with reference to FIGS. 8A and 8B, FIGS. 9A to 9C, FIGS. 10A and 10B, FIGS. 11A and 11B, and FIG. 12.

Description 1 of Touch Panel

In this embodiment, a touch panel 2000 including a display device and an input device will be described as an example of an electronic device. In addition, an example in which a touch sensor is used as an input device will be described.

Figure 8A:
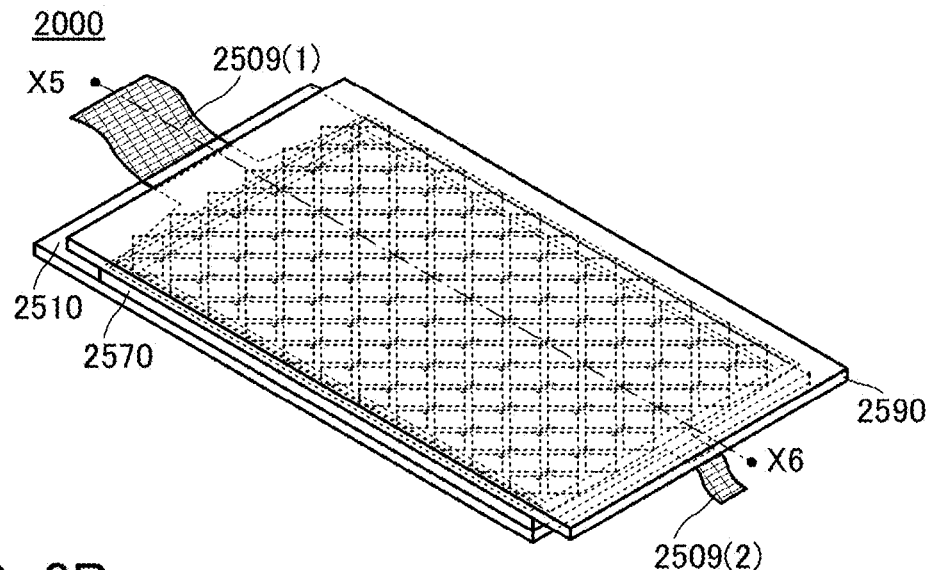
FIGS. 8A and 8B are perspective views of an example of a touch panel.
Figure 8B:
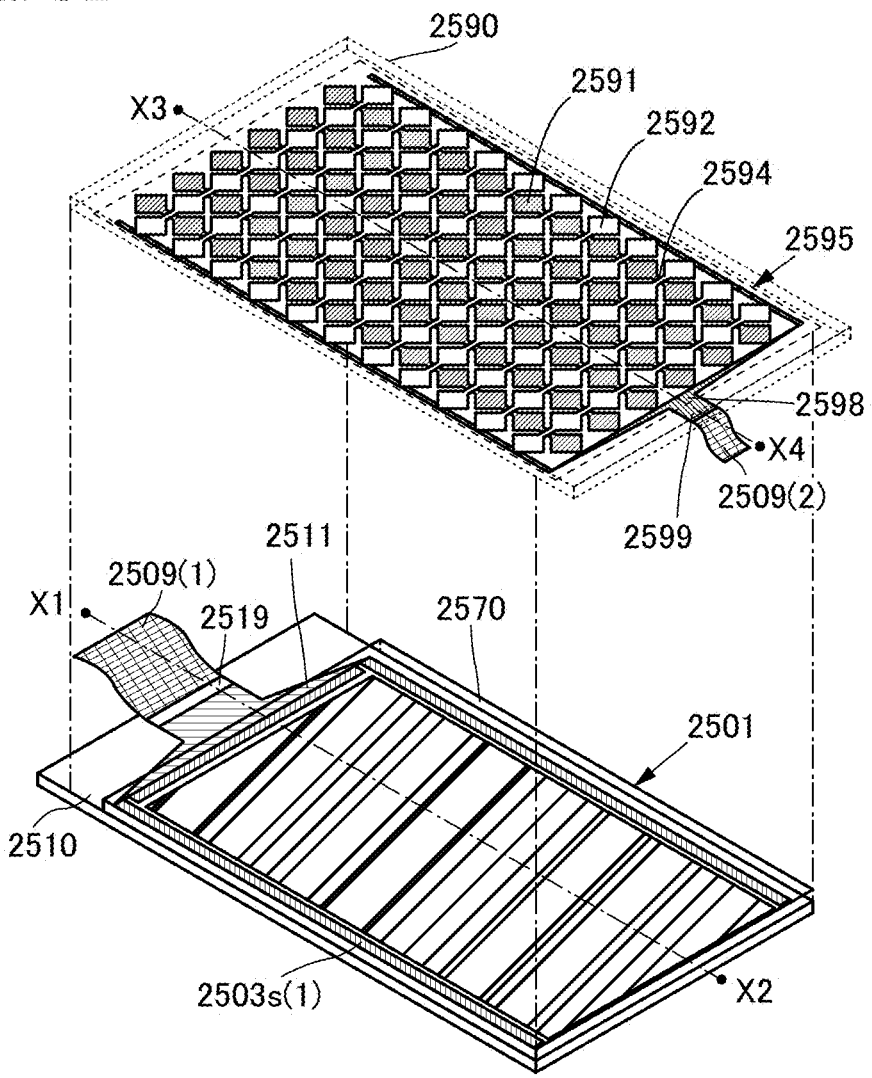

FIGS. 8A and 8B are perspective views of the touch panel 2000. Note that FIGS. 8A and 8B illustrate only main components of the touch panel 2000 for simplicity.

The touch panel 2000 includes a display device 2501 and a touch sensor 2595 (see FIG. 8B). The touch panel 2000 also includes a substrate 2510, a substrate 2570, and a substrate 2590. The substrate 2510, the substrate 2570, and the substrate 2590 each have flexibility. Note that one or all of the substrates 2510, 2570, and 2590 may be inflexible.

The display device 2501 includes a plurality of pixels over the substrate 2510 and a plurality of wirings 2511 through which signals are supplied to the pixels. The plurality of wirings 2511 are led to a peripheral portion of the substrate 2510, and parts of the plurality of wirings 2511 form a terminal 2519. The terminal 2519 is electrically connected to an FPC 2509(1). The plurality of wirings 2511 can supply signals from a signal line driver circuit 2503s(1) to the plurality of pixels.

The substrate 2590 includes the touch sensor 2595 and a plurality of wirings 2598 electrically connected to the touch sensor 2595. The plurality of wirings 2598 are led to a peripheral portion of the substrate 2590, and parts of the plurality of wirings 2598 form a terminal. The terminal is electrically connected to an FPC 2509(2). Note that in FIG. 8B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

Note that the touch sensor 2595 illustrated in FIG. 8B is an example of using a projected capacitive touch sensor.

Note that a variety of sensors that can sense proximity or touch of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 8A and 8B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

Display Device

Figure 9A:
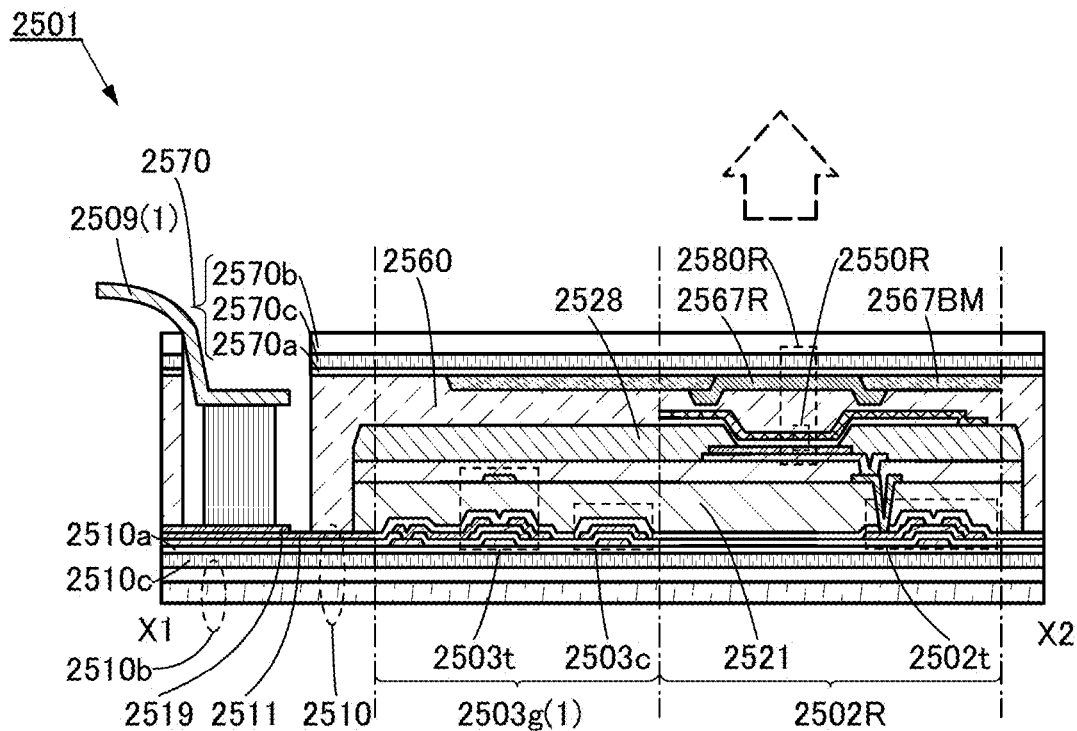
FIGS. 9A to 9C are cross-sectional views of examples of a display device and a touch sensor.

Next, the display device 2501 will be described in detail with reference to FIG. 9A. FIG. 9A corresponds to a cross-sectional view taken along dashed-dotted line X1-X2 in FIG. 8B.

The display device 2501 includes a plurality of pixels arranged in a matrix. Each of the pixels includes a display element and a pixel circuit for driving the display element.

In the following description, an example of using a light-emitting element that emits white light as a display element will be described; however, the display element is not limited to such an element. For example, light-emitting elements that emit light of different colors may be included so that the light of different colors can be emitted from adjacent pixels.

For the substrate 2510 and the substrate 2570, for example, a flexible material with a vapor permeability of lower than or equal to $1\times10^{-5}$ g·m$^{-2}$·day$^{-1}$, preferably lower than or equal to $1\times10^{-6}$ g·m$^{-2}$·day$^{-1}$ can be favorably used. Alternatively, materials whose thermal expansion coefficients are substantially equal to each other are preferably used for the substrate 2510 and the substrate 2570. For example, the coefficients of linear expansion of the materials are preferably lower than or equal to $1\times10^{-3}$/K, further preferably lower than or equal to $5\times10^{-5}$/K, and still further preferably lower than or equal to $1\times10^{-5}$/K.

Note that the substrate 2510 is a stacked body including an insulating layer 2510a for preventing impurity diffusion into the light-emitting element, a flexible substrate 2510b, and an adhesive layer 2510c for attaching the insulating layer 2510a and the flexible substrate 2510b to each other. The substrate 2570 is a stacked body including an insulating layer 2570a for preventing impurity diffusion into the light-emitting element, a flexible substrate 2570b, and an adhesive layer 2570c for attaching the insulating layer 2570a and the flexible substrate 2570b to each other.

For the adhesive layer 2510c and the adhesive layer 2570c, for example, polyester, polyolefin, polyamide (e.g., nylon, aramid), polyimide, polycarbonate, or acrylic, urethane, or epoxy can be used. Alternatively, a material that includes a resin having a siloxane bond can be used.

A sealing layer 2560 is provided between the substrate 2510 and the substrate 2570. The sealing layer 2560 preferably has a refractive index higher than that of air. In the case where light is extracted to the sealing layer 2560 side as illustrated in FIG. 9A, the sealing layer 2560 can also serve as an adhesive layer.

A sealant may be formed in the peripheral portion of the sealing layer 2560. With the use of the sealant, a light-emitting element 2550R can be provided in a region surrounded by the substrate 2510, the substrate 2570, the sealing layer 2560, and the sealant. Note that an inert gas (such as nitrogen or argon) may be used instead of the sealing layer 2560. A drying agent may be provided in the inert gas so as to adsorb moisture or the like. An ultraviolet curable resin or a heat curable resin may be used; for example, a polyvinyl chloride (PVC) based resin, an acrylic resin, a polyimide-based resin, an epoxy-based resin, a silicone-based resin, a polyvinyl butyral (PVB) based resin, or an ethylene vinyl acetate (EVA) based resin can be used. For example, an epoxy-based resin or a glass frit is preferably used as the sealant. As a material used for the sealant, a material which is impermeable to moisture or oxygen is preferably used.

The display device 2501 includes a pixel 2502R. The pixel 2502R includes a light-emitting module 2580R.

The pixel 2502R includes the light-emitting element 2550R and a transistor 2502t that can supply electric power to the light-emitting element 2550R. Note that the transistor 2502t functions as part of the pixel circuit. The light-emitting module 2580R includes the light-emitting element 2550R and a coloring layer 2567R.

The light-emitting element 2550R includes a lower electrode, an upper electrode, and an EL layer between the lower electrode and the upper electrode. As the light-emitting element 2550R, any of the light-emitting elements described in Embodiments 1 to 3 can be used, for example.

A microcavity structure may be employed between the lower electrode and the upper electrode so as to increase the intensity of light having a specific wavelength.

In the case where the sealing layer 2560 is provided on the light extraction side, the sealing layer 2560 is in contact with the light-emitting element 2550R and the coloring layer 2567R.

The coloring layer 2567R is positioned in a region overlapping with the light-emitting element 2550R. Accordingly, part of light emitted from the light-emitting element 2550R passes through the coloring layer 2567R and is emitted to the outside of the light-emitting module 2580R as indicated by an arrow in FIG. 9A.

The display device 2501 includes a light-blocking layer 2567BM on the light extraction side. The light-blocking layer 2567BM is provided so as to surround the coloring layer 2567R.

The coloring layer 2567R is a coloring layer having a function of transmitting light in a particular wavelength region. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an inkjet method, an etching method using a photolithography technique, or the like.

An insulating layer 2521 is provided in the display device 2501. The insulating layer 2521 covers the transistor 2502t. Note that the insulating layer 2521 has a function of planarizing unevenness caused by the pixel circuit. The insulating layer 2521 may have a function of suppressing impurity diffusion. This can prevent the reliability of the transistor 2502t or the like from being lowered by impurity diffusion.

The light-emitting element 2550R is formed over the insulating layer 2521. A partition 2528 is provided so as to overlap with an end portion of the lower electrode of the light-emitting element 2550R. Note that a spacer for controlling the distance between the substrate 2510 and the substrate 2570 may be formed over the partition 2528.

A scan line driver circuit 2503g(1) includes a transistor 2503t and a capacitor 2503c. Note that the driver circuit can be formed in the same process and over the same substrate as those of the pixel circuits.

The wirings 2511 through which signals can be supplied are provided over the substrate 2510. The terminal 2519 is provided over the wirings 2511. The FPC 2509(1) is electrically connected to the terminal 2519. The FPC 2509(1) has a function of supplying a video signal, a clock signal, a start signal, a reset signal, or the like. Note that the FPC 2509(1) may be provided with a printed wiring board (PWB).

Figure 9B:
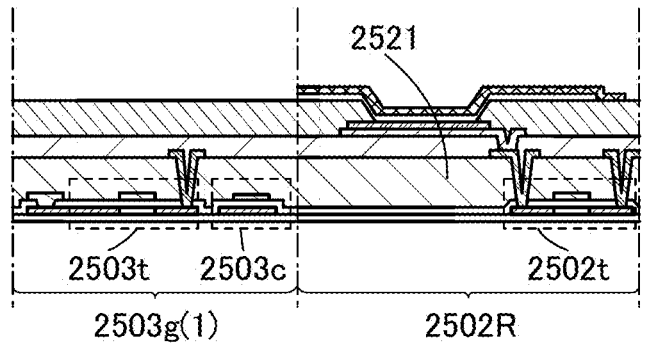

In the display device 2501, transistors with any of a variety of structures can be used. FIG. 9A illustrates an example of using bottom-gate transistors; however, the present invention is not limited to this example, and top-gate transistors may be used in the display device 2501 as illustrated in FIG. 9B.

In addition, there is no particular limitation on the polarity of the transistor 2502t and the transistor 2503t. For these transistors, n-channel and p-channel transistors may be used, or either n-channel transistors or p-channel transistors may be used, for example. Furthermore, there is no particular limitation on the crystallinity of a semiconductor film used for the transistors 2502t and 2503t. For example, an amorphous semiconductor film or a crystalline semiconductor film may be used. Examples of semiconductor materials include Group 13 semiconductors (e.g., a semiconductor including gallium), Group 14 semiconductors (e.g., a semiconductor including silicon), compound semiconductors (including oxide semiconductors), organic semiconductors, and the like. An oxide semiconductor that has an energy gap of 2 eV or more, preferably 2.5 eV or more, further preferably 3 eV or more is preferably used for one of the transistors 2502t and 2503t or both, so that the off-state current of the transistors can be reduced. Examples of the oxide semiconductors include an In—Ga oxide, an In-M-Zn oxide (M represents Al, gallium (Ga), yttrium (Y), zirconium (Zr), lanthanum (La), cerium (Ce), tin (Sn), hafnium (Hf), or neodymium (Nd)), and the like.

Touch Sensor

Figure 9C:
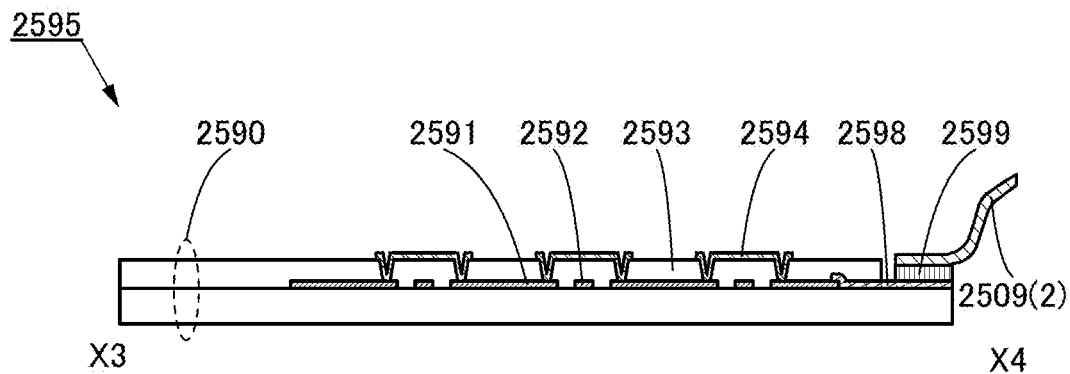

Next, the touch sensor 2595 will be described in detail with reference to FIG. 9C. FIG. 9C corresponds to a cross-sectional view taken along dashed-dotted line X3-X4 in FIG. 8B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various pattern forming techniques such as photolithography.

Examples of a material for the insulating layer 2593 are a resin such as an acrylic resin or an epoxy resin, a resin having a siloxane bond, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be favorably used as the wiring 2594 because the aperture ratio of the touch panel can be increased. Moreover, a material with higher conductivity than the conductivities of the electrodes 2591 and 2592 can be favorably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

Description 2 of Touch Panel

Figure 10A:
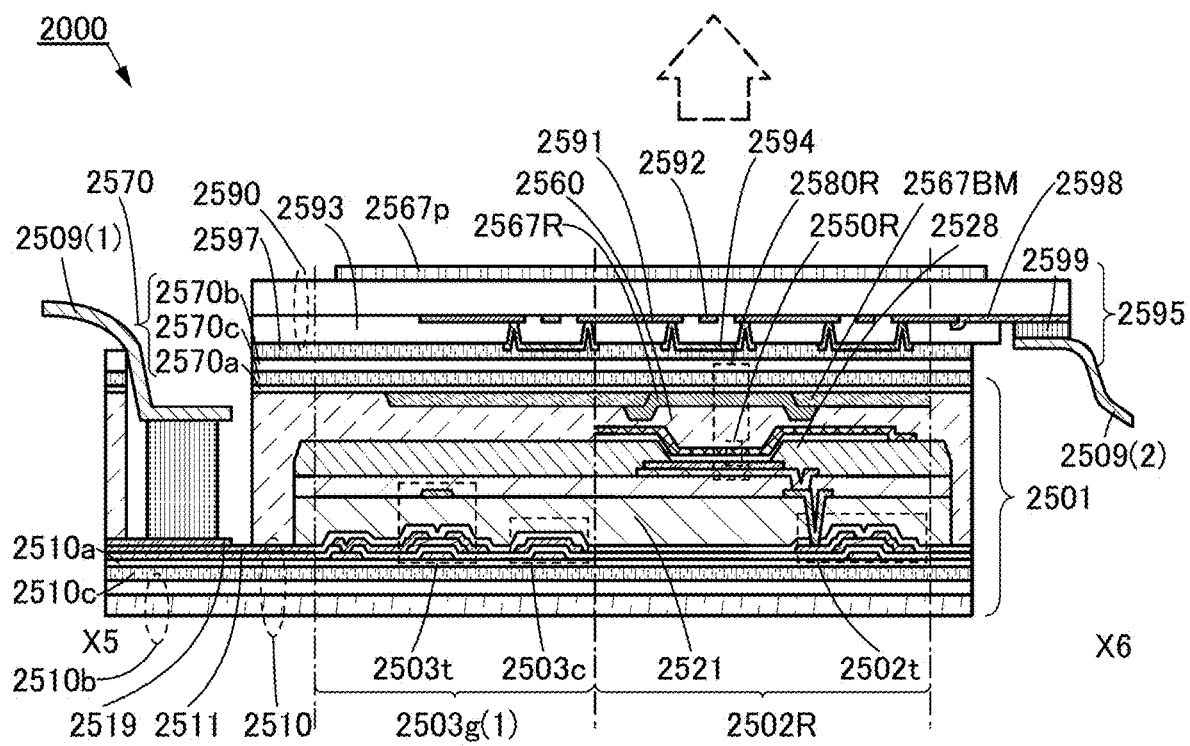
FIGS. 10A and 10B are each a cross-sectional view of an example of a touch panel.

Next, the touch panel 2000 will be described in detail with reference to FIG. 10A. FIG. 10A corresponds to a cross-sectional view taken along dashed-dotted line X5-X6 in FIG. 8A.

In the touch panel 2000 illustrated in FIG. 10A, the display device 2501 described with reference to FIG. 9A and the touch sensor 2595 described with reference to FIG. 9C are attached to each other.

The touch panel 2000 illustrated in FIG. 10A includes an adhesive layer 2597 and an anti-reflective layer 2567p in addition to the components described with reference to FIGS. 9A and 9C.

The adhesive layer 2597 is provided in contact with the wiring 2594. Note that the adhesive layer 2597 attaches the substrate 2590 to the substrate 2570 so that the touch sensor 2595 overlaps with the display device 2501. The adhesive layer 2597 preferably has a light-transmitting property. A heat curable resin or an ultraviolet curable resin can be used for the adhesive layer 2597. For example, an acrylic resin, an urethane-based resin, an epoxy-based resin, or a siloxane-based resin can be used.

The anti-reflective layer 2567p is positioned in a region overlapping with pixels. As the anti-reflective layer 2567p, a circularly polarizing plate can be used, for example.

Next, a touch panel having a structure different from that illustrated in FIG. 10A will be described with reference to FIG. 10B.

Figure 10B:
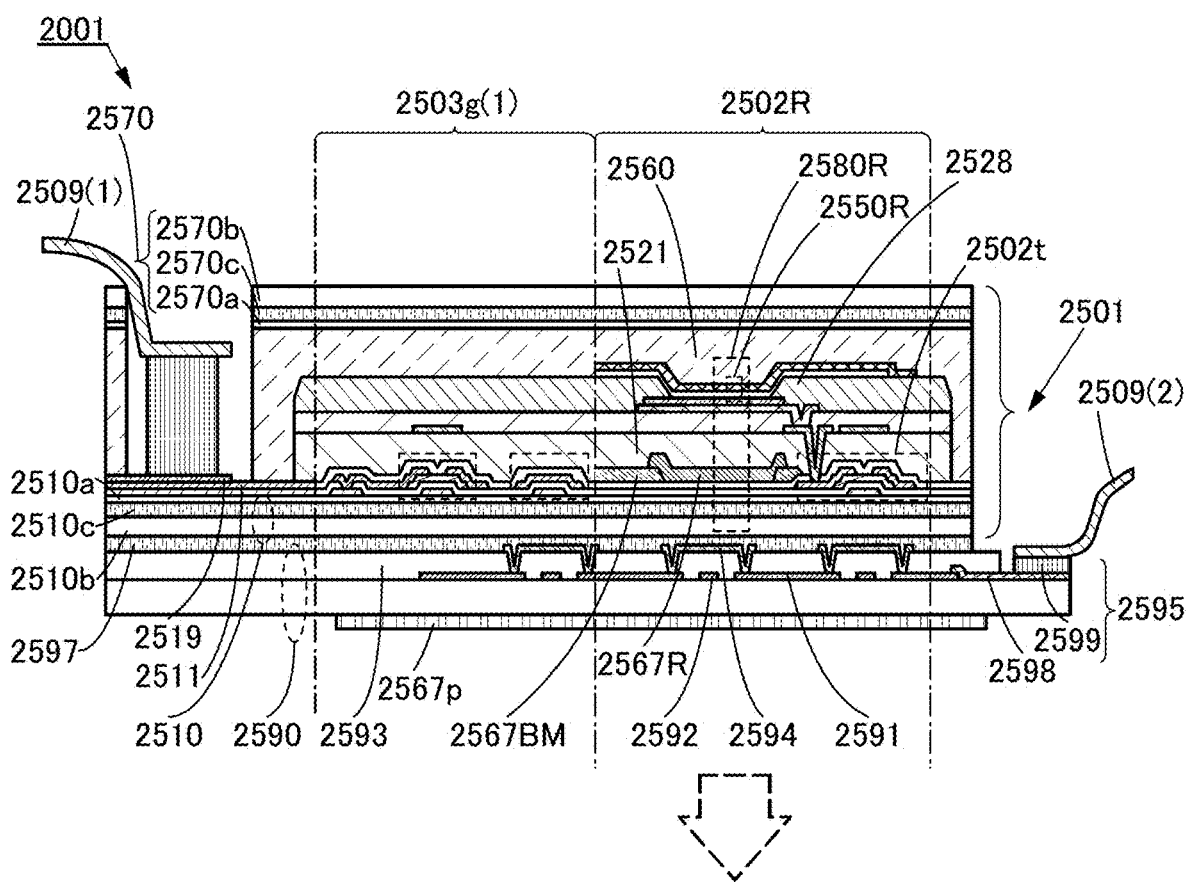

FIG. 10B is a cross-sectional view of a touch panel 2001. The touch panel 2001 illustrated in FIG. 10B differs from the touch panel 2000 illustrated in FIG. 10A in the position of the touch sensor 2595 relative to the display device 2501. Different parts are described in detail below, and the above description of the touch panel 2000 is referred to for the other similar parts.

The coloring layer 2567R is positioned in a region overlapping with the light-emitting element 2550R. The light-emitting element 2550R illustrated in FIG. 10B emits light to the side where the transistor 2502t is provided. Accordingly, part of light emitted from the light-emitting element 2550R passes through the coloring layer 2567R and is emitted to the outside of the light-emitting module 2580R as indicated by an arrow in FIG. 10B.

The touch sensor 2595 is provided on the substrate 2510 side of the display device 2501.

The adhesive layer 2597 is provided between the substrate 2510 and the substrate 2590 and attaches the touch sensor 2595 to the display device 2501.

As illustrated in FIG. 10A or 10B, light may be emitted from the light-emitting element to one of upper and lower sides, or both, of the substrate.

Method for Driving Touch Panel

Next, an example of a method for driving a touch panel will be described with reference to FIGS. 11A and 11B.

Figure 11A:
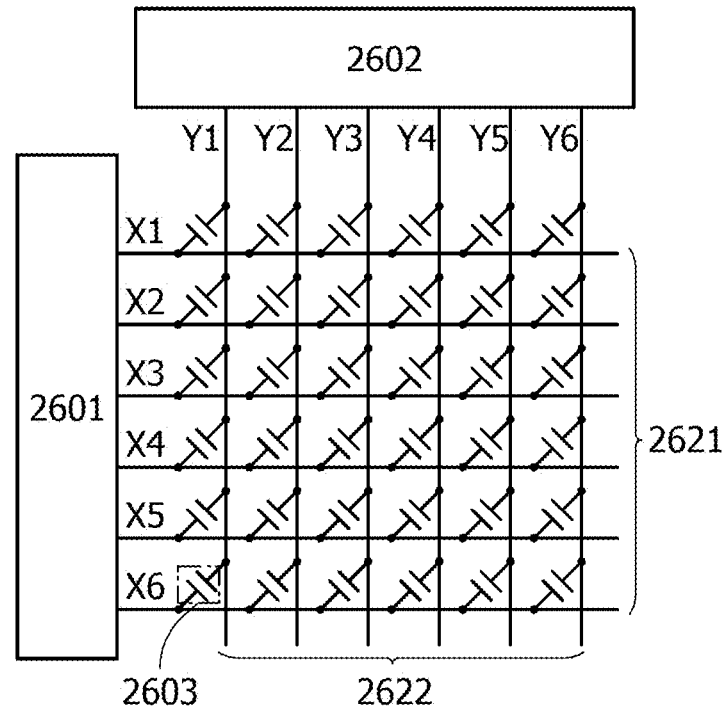
FIGS. 11A and 11B are a block diagram and a timing chart of a touch sensor.

FIG. 11A is a block diagram illustrating the structure of a mutual capacitive touch sensor. FIG. 11A illustrates a pulse voltage output circuit 2601 and a current sensing circuit 2602. Note that in FIG. 11A, six wirings X1 to X6 represent the electrodes 2621 to which a pulse voltage is applied, and six wirings Y1 to Y6 represent the electrodes 2622 that detect changes in current. FIG. 11A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 11B:
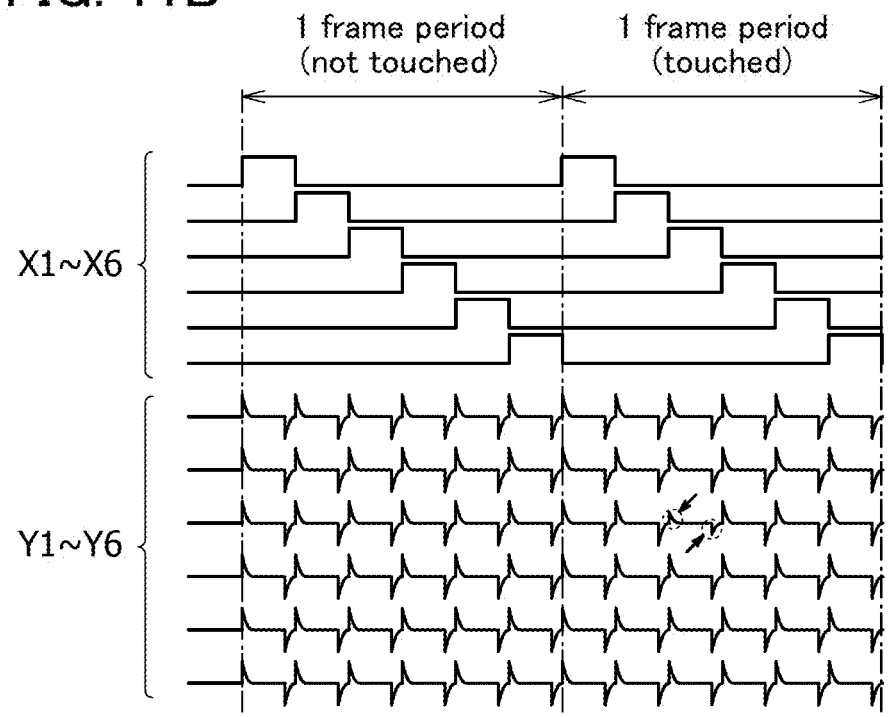

FIG. 11B is a timing chart showing input and output waveforms in the mutual capacitive touch sensor illustrated in FIG. 11A. In FIG. 11B, sensing of a sensing target is performed in all the rows and columns in one frame period. FIG. 11B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change in accordance with changes in the voltages of the wirings X1 to X6. The current value is decreased at the point of approach or contact of a sensing target and accordingly the waveform of the voltage value changes.

By detecting a change in mutual capacitance in this manner, the approach or contact of a sensing target can be sensed.

Sensor Circuit

Figure 12:
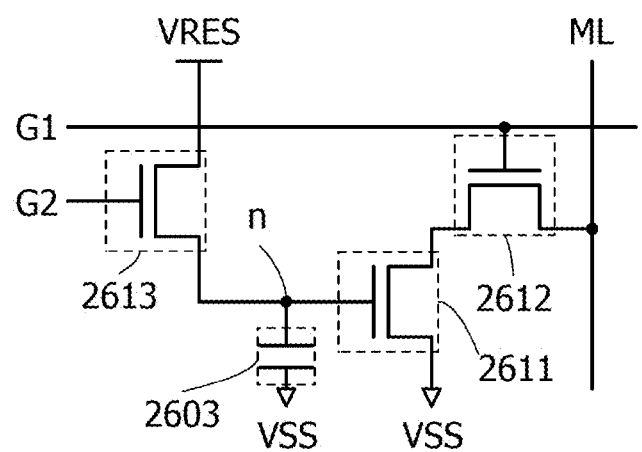
FIG. 12 is a circuit diagram of a touch sensor.

Although FIG. 11A illustrates a passive matrix type touch sensor in which only the capacitor 2603 is provided at the intersection of wirings as a touch sensor, an active matrix type touch sensor including a transistor and a capacitor may be used. FIG. 12 illustrates an example of a sensor circuit included in an active matrix type touch sensor.

The sensor circuit in FIG. 12 includes the capacitor 2603 and transistors 2611, 2612, and 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 12 will be described. First, a potential for turning on the transistor 2613 is supplied as the signal G2, and a potential with respect to the voltage VRES is thus applied to the node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, an oxide semiconductor layer is preferably used as a semiconductor layer in which a channel region is formed. In particular, such a transistor is preferably used as the transistor 2613 so that the potential of the node n can be held for a long time and the frequency of operation of resupplying VRES to the node n (refresh operation) can be reduced.

The structure described in this embodiment can be combined with any of the structures described in the other embodiments as appropriate.

Embodiment 6

In this embodiment, a display module and electronic devices including a light-emitting element of one embodiment of the present invention will be described with reference to FIG. 13 and FIGS. 14A to 14G.

Display Module

Figure 13:
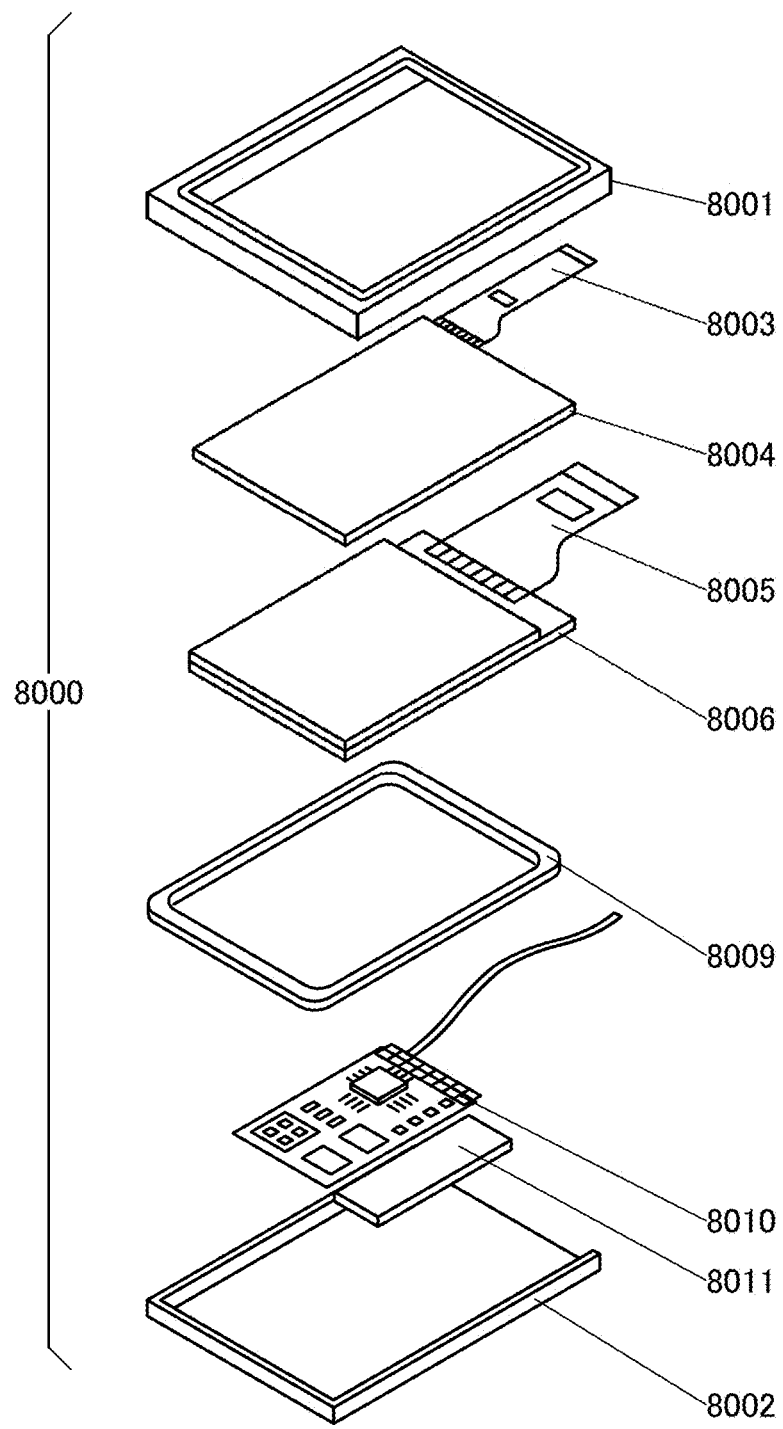
FIG. 13 is a perspective view of a display module.

In a display module 8000 in FIG. 13, a touch sensor 8004 connected to an FPC 8003, a display device 8006 connected to an FPC 8005, a frame 8009, a printed board 8010, and a battery 8011 are provided between an upper cover 8001 and a lower cover 8002.

The light-emitting element of one embodiment of the present invention can be used for the display device 8006, for example.

The shapes and sizes of the upper cover 8001 and the lower cover 8002 can be changed as appropriate in accordance with the sizes of the touch sensor 8004 and the display device 8006.

The touch sensor 8004 can be a resistive touch sensor or a capacitive touch sensor and may be formed to overlap with the display device 8006. A counter substrate (sealing substrate) of the display device 8006 can have a touch sensor function. A photosensor may be provided in each pixel of the display device 8006 so that an optical touch sensor is obtained.

The frame 8009 protects the display device 8006 and also serves as an electromagnetic shield for blocking electromagnetic waves generated by the operation of the printed board 8010. The frame 8009 may serve as a radiator plate.

The printed board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 can be additionally provided with a member such as a polarizing plate, a retardation plate, or a prism sheet.

Electronic Device

FIGS. 14A to 14G illustrate electronic devices. These electronic devices can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIGS. 14A to 14G can have a variety of functions, for example, a function of displaying a variety of data (a still image, a moving image, a text image, and the like) on the display portion, a touch sensor function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic devices illustrated in FIGS. 14A to 14G are not limited to those described above, and the electronic devices can have a variety of functions. Although not illustrated in FIGS. 14A to 14G, the electronic devices may include a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices illustrated in FIGS. 14A to 14G will be described in detail below.

Figure 14A:
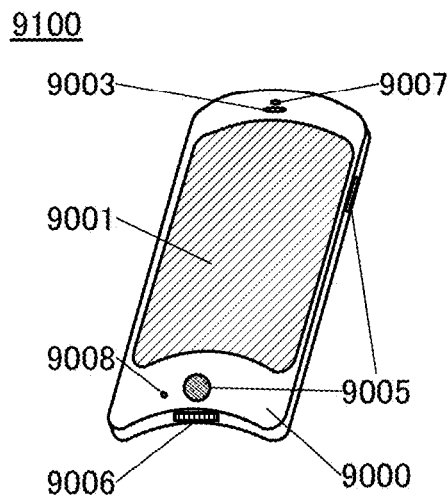
FIGS. 14A to 14G illustrate electronic devices.

FIG. 14A is a perspective view of a portable information terminal 9100. The display portion 9001 of the portable information terminal 9100 is flexible. Therefore, the display portion 9001 can be incorporated along a bent surface of a bent housing 9000. In addition, the display portion 9001 includes a touch sensor, and operation can be performed by touching the screen with a finger, a stylus, or the like. For example, when an icon displayed on the display portion 9001 is touched, an application can be started.

Figure 14B:
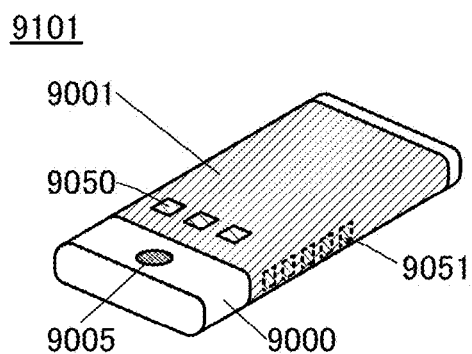

FIG. 14B is a perspective view of a portable information terminal 9101. The portable information terminal 9101 functions as, for example, one or more of a telephone set, a notebook, and an information browsing system. Specifically, the portable information terminal can be used as a smartphone. Note that the speaker 9003, the connection terminal 9006, the sensor 9007, and the like, which are not shown in FIG. 14B, can be positioned in the portable information terminal 9101 as in the portable information terminal 9100 shown in FIG. 14A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and the reception strength of an antenna. Instead of the information 9051, the operation buttons 9050 or the like may be displayed on the position where the information 9051 is displayed.

Figure 14C:
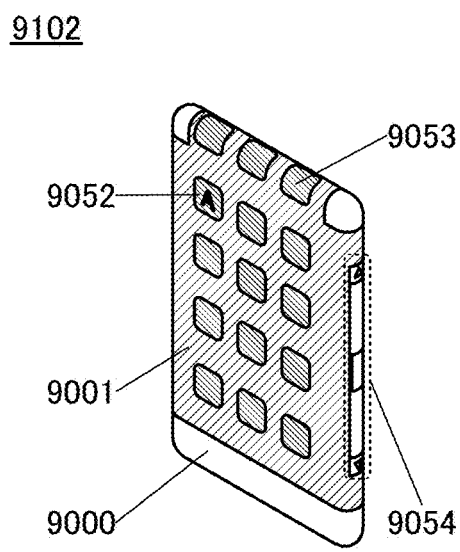

FIG. 14C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

Figure 14D:
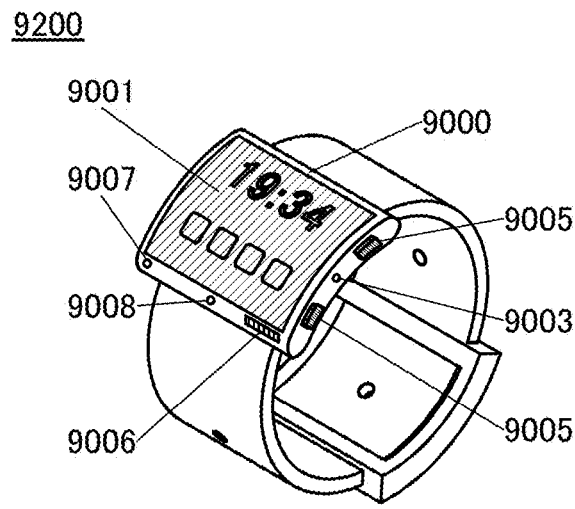

FIG. 14D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 14E:
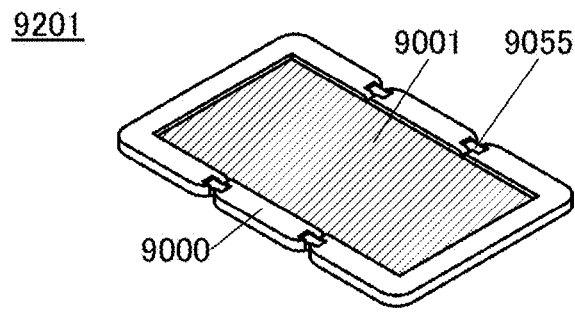
Figure 14F:
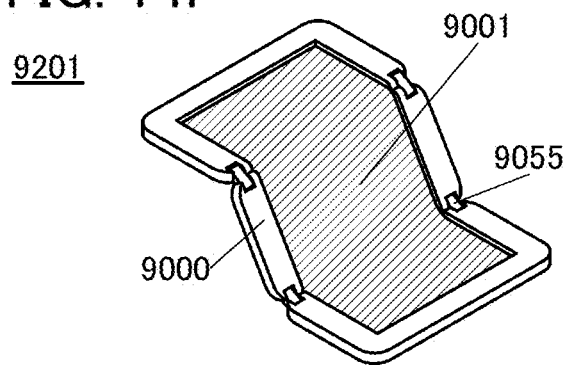
Figure 14G:
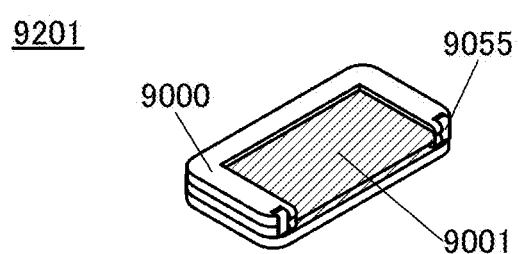

FIGS. 14E, 14F, and 14G are perspective views of a foldable portable information terminal 9201. FIG. 14E is a perspective view illustrating the portable information terminal 9201 that is opened. FIG. 14F is a perspective view illustrating the portable information terminal 9201 that is being opened or being folded. FIG. 14G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

The electronic devices described in this embodiment each include the display portion for displaying some sort of data. Note that the light-emitting element of one embodiment of the present invention can also be used for an electronic device which does not have a display portion. The structure in which the display portion of the electronic device described in this embodiment is flexible and display can be performed on the bent display surface or the structure in which the display portion of the electronic device is foldable is described as an example; however, the structure is not limited thereto and a structure in which the display portion of the electronic device is not flexible and display is performed on a plane portion may be employed.

The structure described in this embodiment can be combined with any of the structures described in the other embodiments as appropriate.

Embodiment 7

In this embodiment, examples of lighting devices in which the light-emitting element of one embodiment of the present invention is used will be described with reference to FIG. 15.

Figure 15:
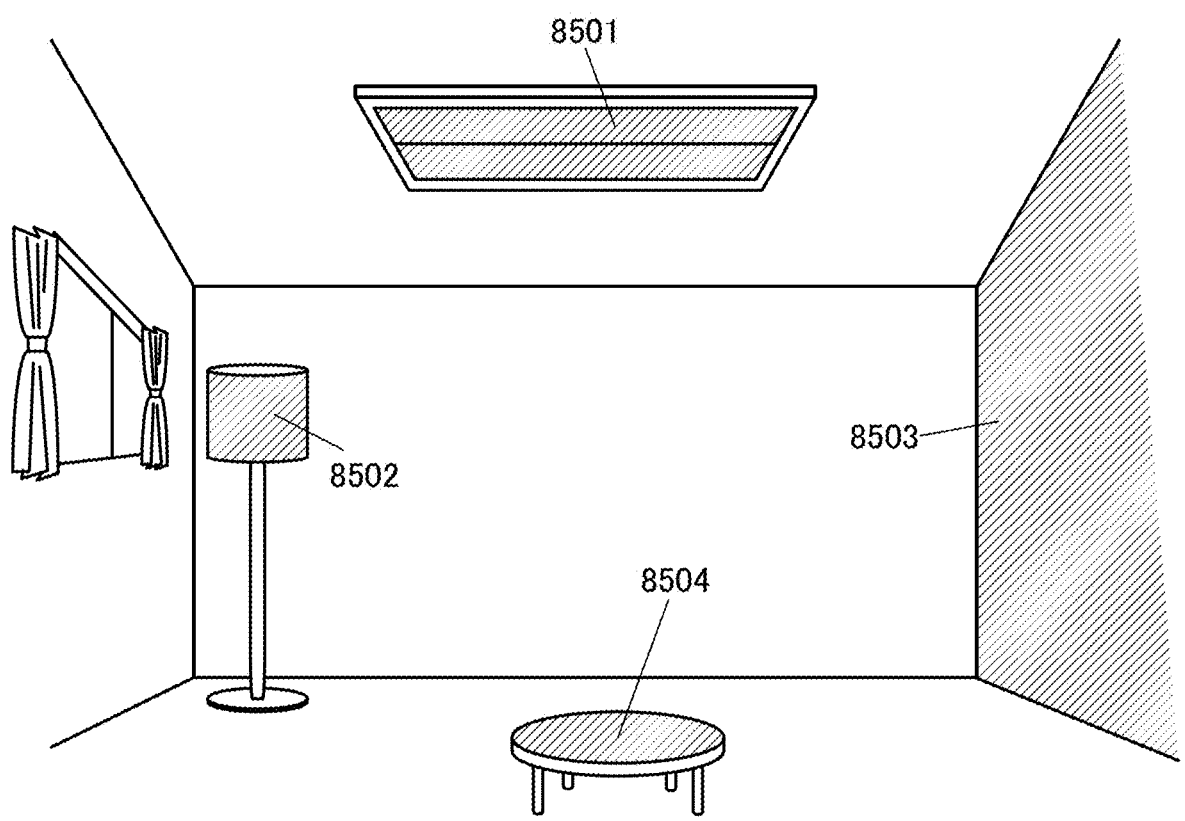
FIG. 15 illustrates lighting devices.

FIG. 15 illustrates an example in which the light-emitting element is used for an indoor lighting device 8501. Since the light-emitting element can have a larger area, a lighting device having a large area can also be formed. In addition, a lighting device 8502 in which a light-emitting region has a curved surface can also be formed with the use of a housing with a curved surface. A light-emitting element described in this embodiment is in the form of a thin film, which allows the housing to be designed more freely. Therefore, the lighting device can be elaborately designed in a variety of ways. Furthermore, a wall of the room may be provided with a large-sized lighting device 8503. Touch sensors may be provided in the lighting devices 8501, 8502, and 8503 to control the power on/off of the lighting devices.

Moreover, when the light-emitting element is used on the surface side of a table, a lighting device 8504 which has a function as a table can be obtained. When the light-emitting element is used as part of other furniture, a lighting device which has a function as the furniture can be obtained.

In this manner, a variety of lighting devices to which the light-emitting element is applied can be obtained. Note that such lighting devices are also embodiments of the present invention.

The structure described in this embodiment can be combined with any of the structures described in the other embodiments as appropriate.

Example 1

In this example, an example of fabricating light-emitting elements of one embodiment of the present invention and comparative light-emitting elements will be described. Light-emitting elements 1 to 7 were fabricated in this example.

Note that the light-emitting elements 1, 2, 5, and 7 are comparative light-emitting elements, and the light-emitting elements 3, 4, and 6 are light-emitting elements of one embodiment of the present invention. The light-emitting element 1 is a host-guest light-emitting element. The light-emitting elements 2, 5, and 7 are light-emitting elements which utilize exciplex emission. The light-emitting elements 3, 4, and 6 are light-emitting elements which utilize ExSET.

Figure 16:
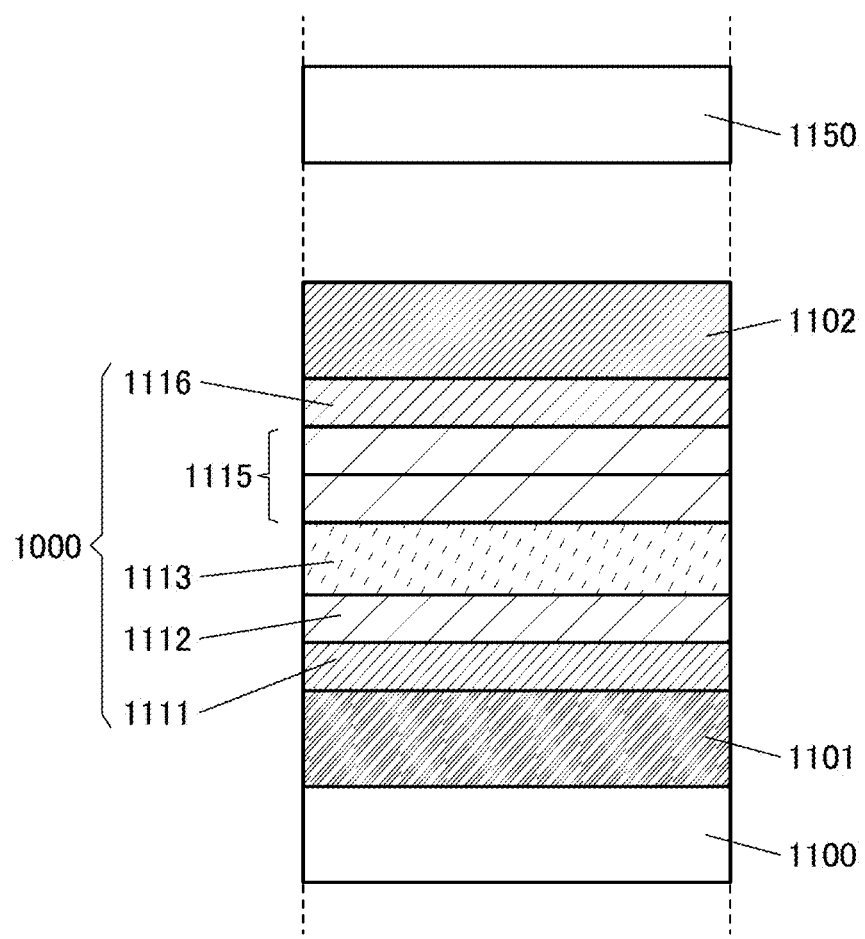
FIG. 16 is a cross-sectional view of a structure of a light-emitting element in an example.
Figure 17:
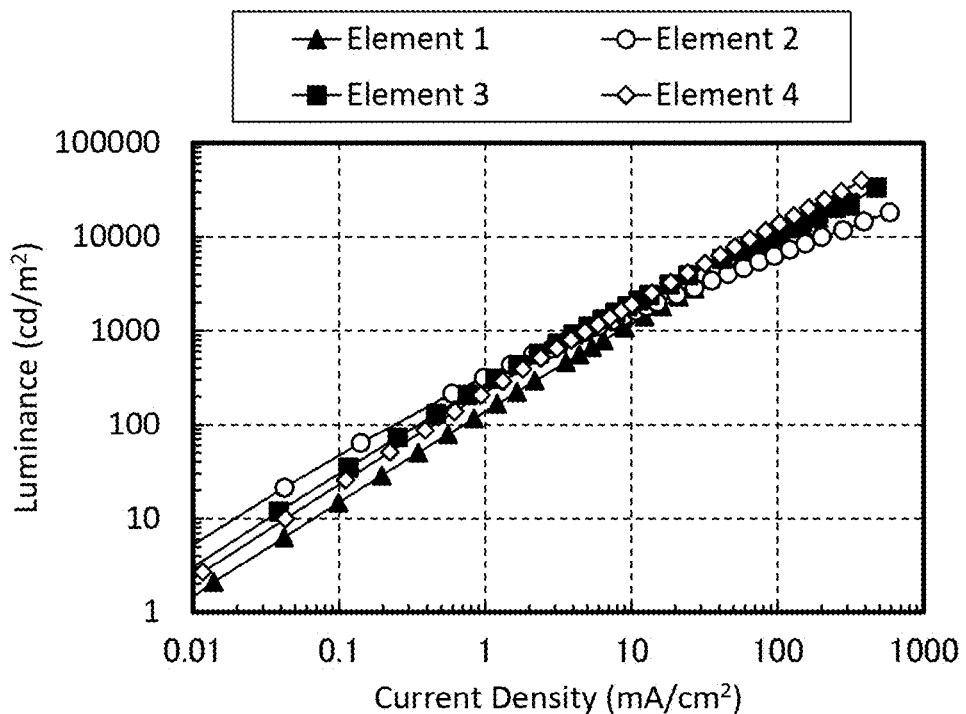
FIG. 17 shows luminance-current density characteristics of light-emitting elements 1 to 4 in an example.
Figure 18:
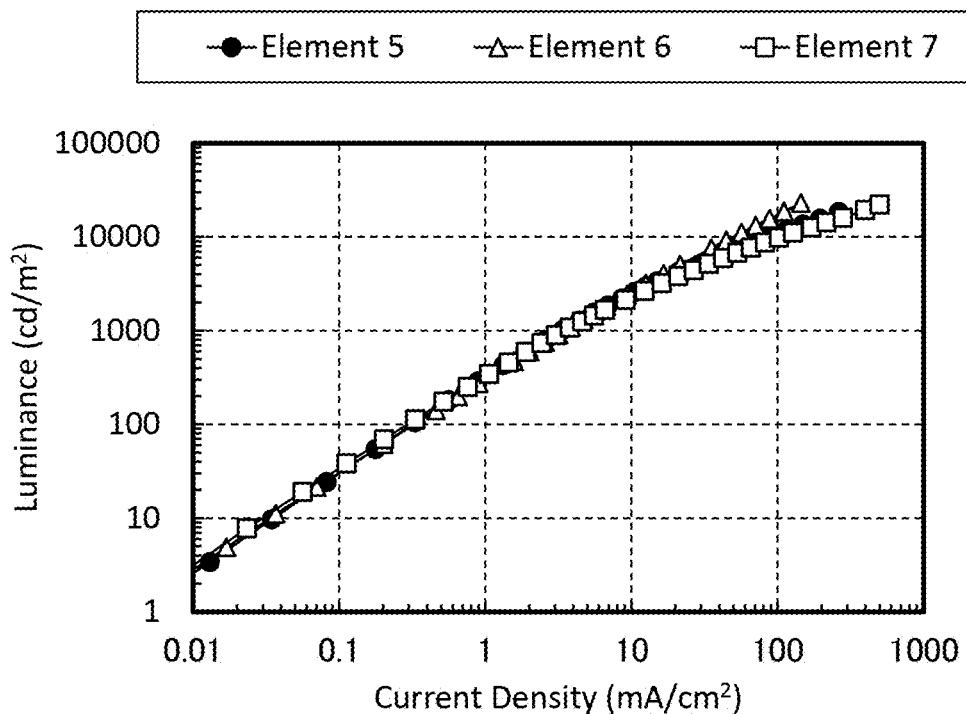
FIG. 18 shows luminance-current density characteristics of light-emitting elements 5 to 7 in an example.
Figure 19:
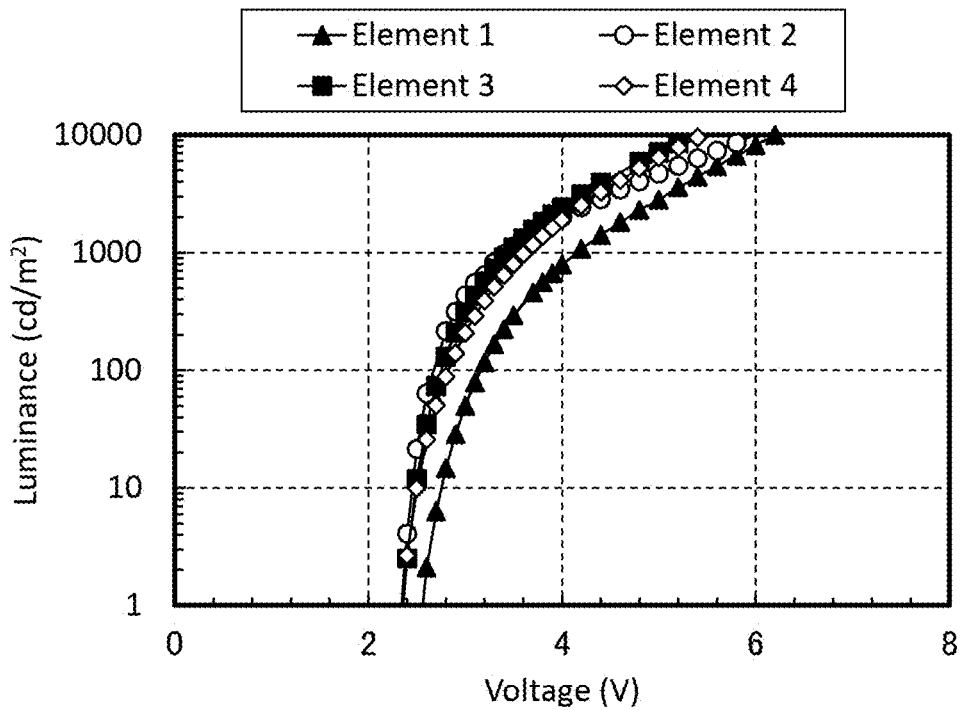
FIG. 19 shows luminance-voltage characteristics of the light-emitting elements 1 to 4 in the example.
Figure 20:
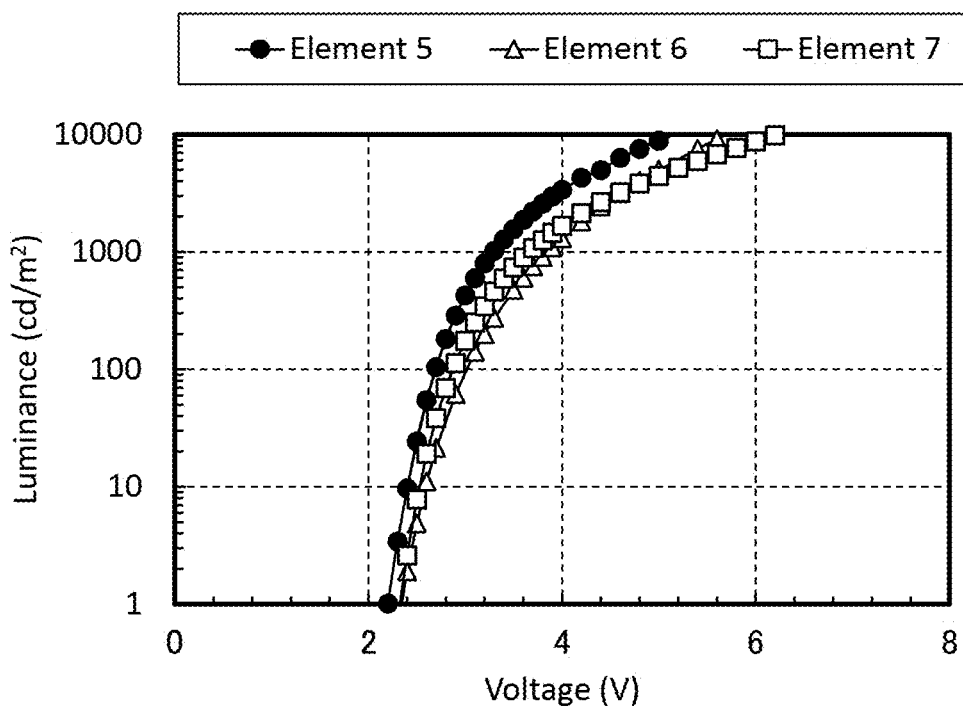
FIG. 20 shows luminance-voltage characteristics of the light-emitting elements 5 to 7 in the example.
Figure 21:
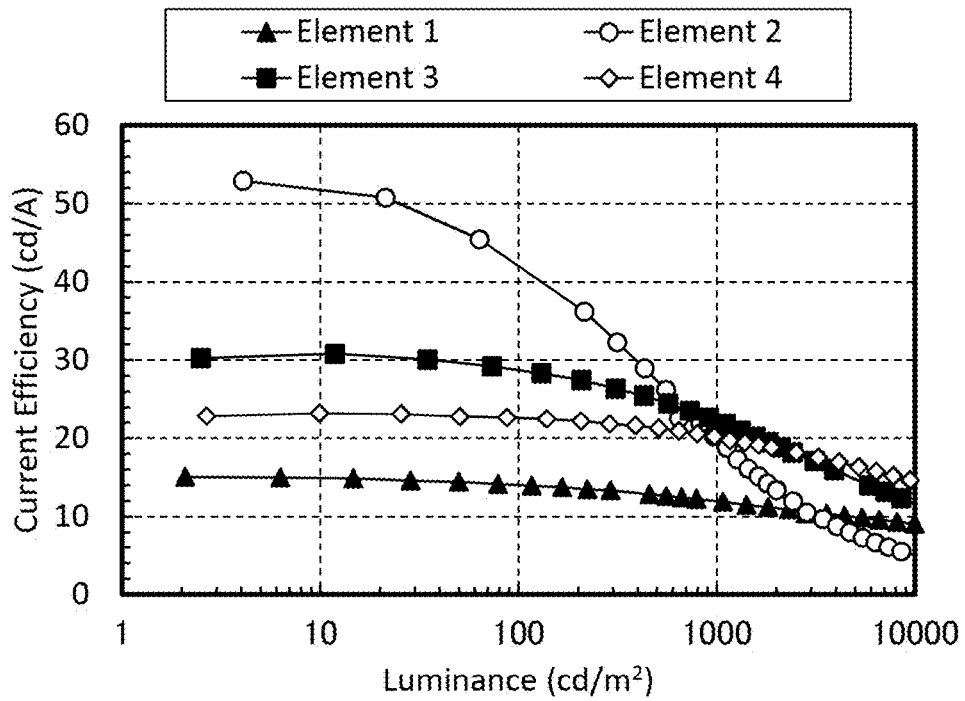
FIG. 21 shows current efficiency-luminance characteristics of the light-emitting elements 1 to 4 in the example.
Figure 22:
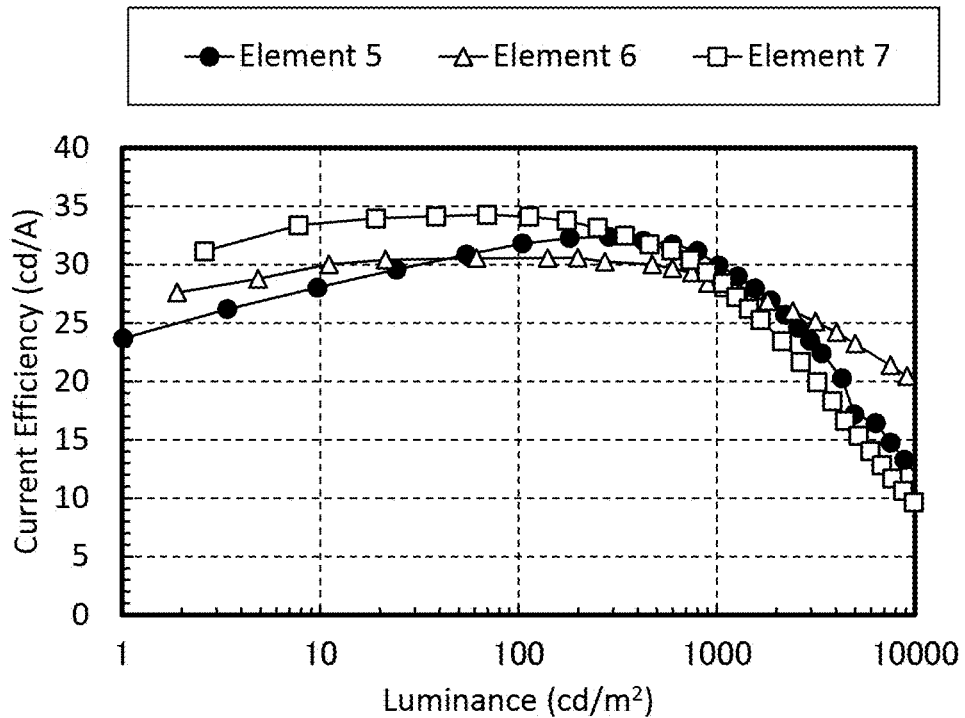
FIG. 22 shows current efficiency-luminance characteristics of the light-emitting elements 5 to 7 in the example.
Figure 23:
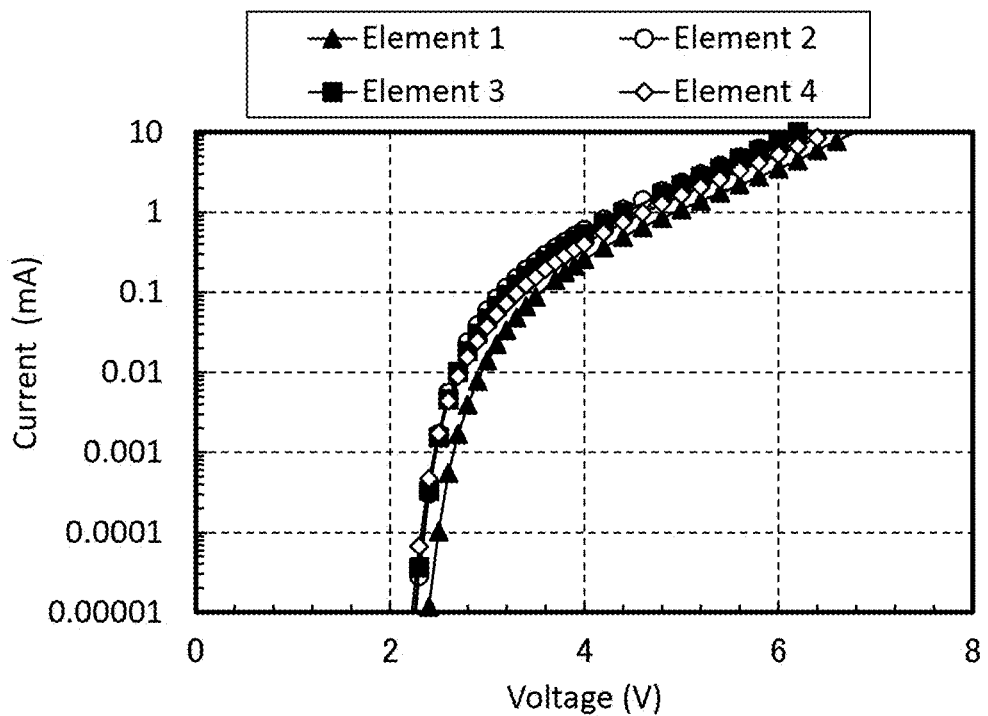
FIG. 23 shows current-voltage characteristics of the light-emitting elements 1 to 4 in the example.
Figure 24:
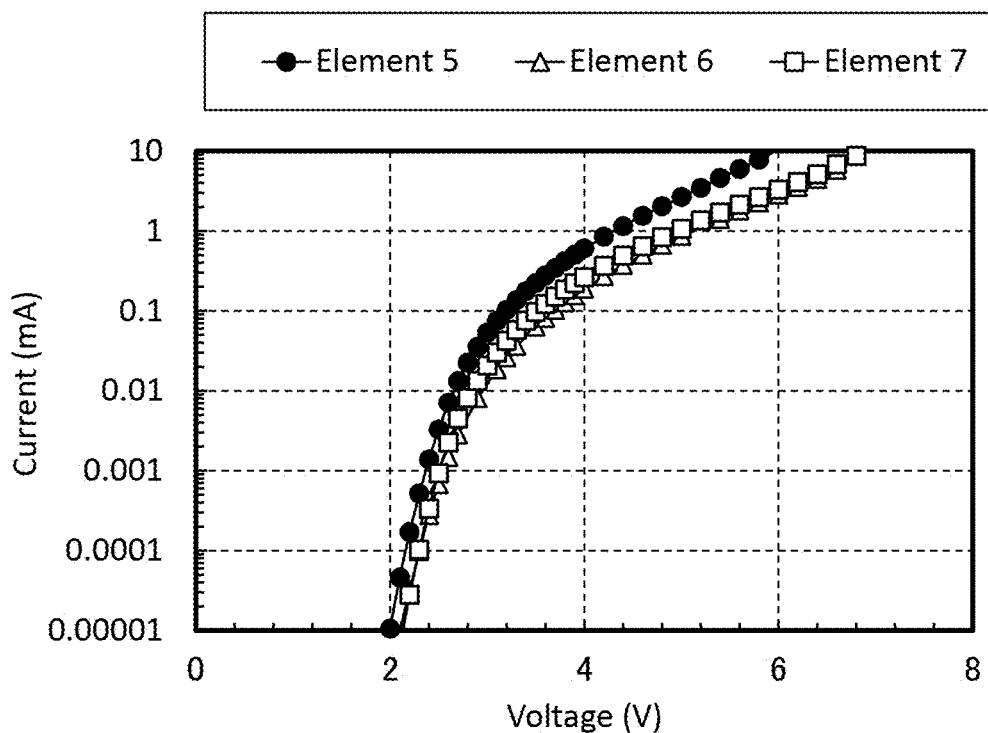
FIG. 24 shows current-voltage characteristics of the light-emitting elements 5 to 7 in the example.
Figure 25:
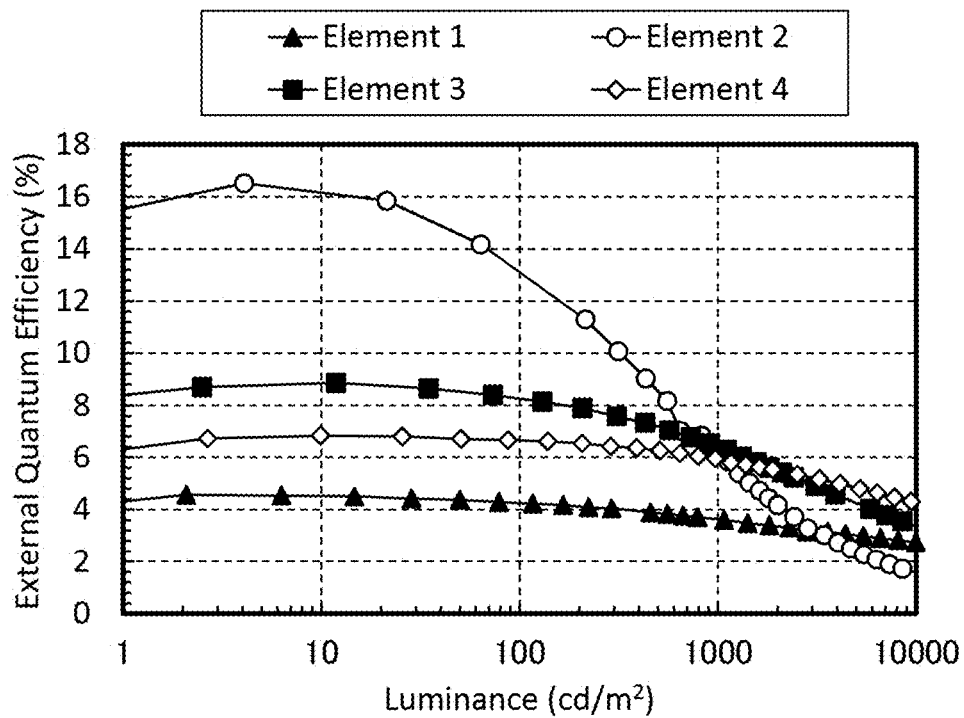
FIG. 25 shows external quantum efficiency-luminance characteristics of the light-emitting elements 1 to 4 in the example.
Figure 26:
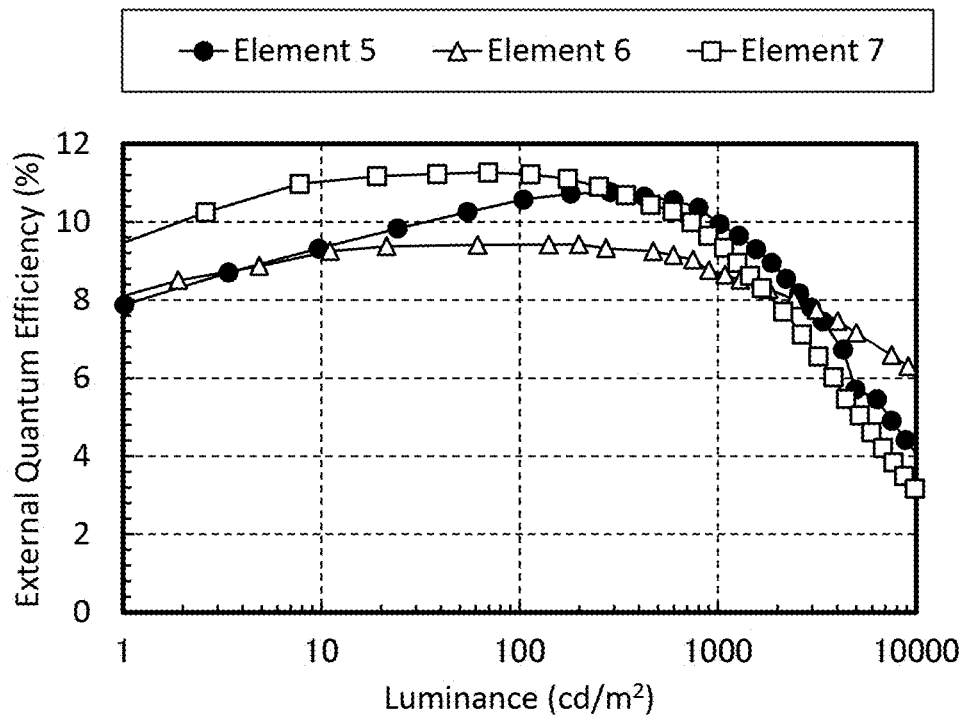
FIG. 26 shows external quantum efficiency-luminance characteristics of the light-emitting elements 5 to 7 in the example.

FIG. 16 is a schematic cross-sectional view of each of the light-emitting elements 1 to 7, and Tables 4 and 5 show details of the element structure. In addition, structures and abbreviations of compounds used here are given below.

[Chemical Formula 4]

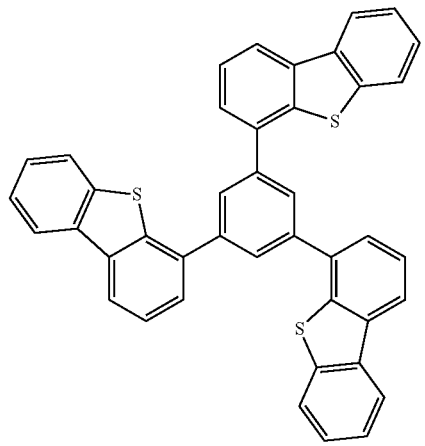

DBT3P-II

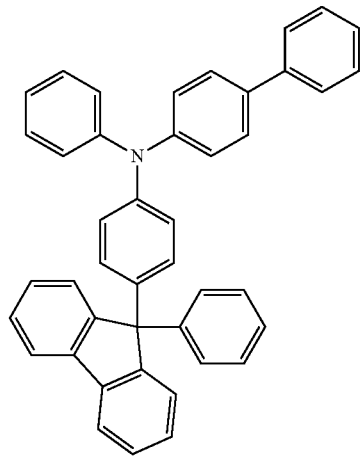

BPAFLP

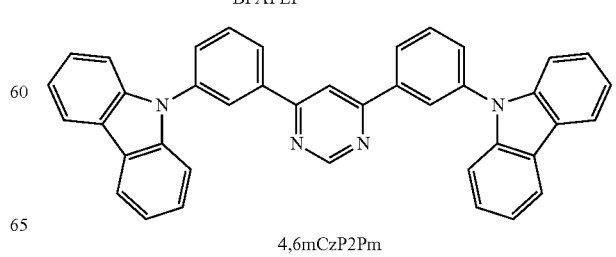

4,6mCzP2Pm

-continued

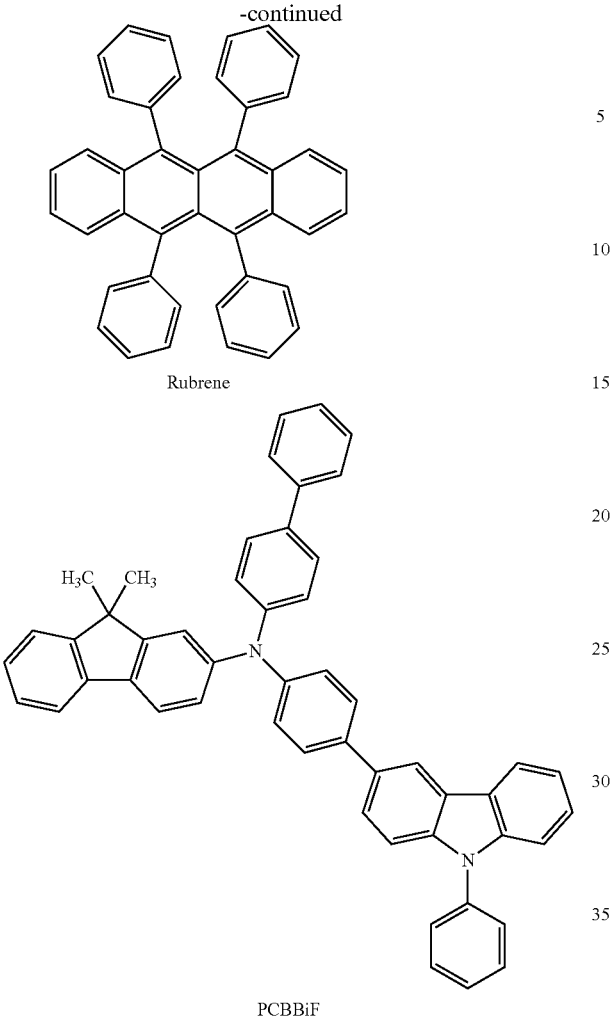

Rubrene

PCBBiF

[Chemical Formula 5]

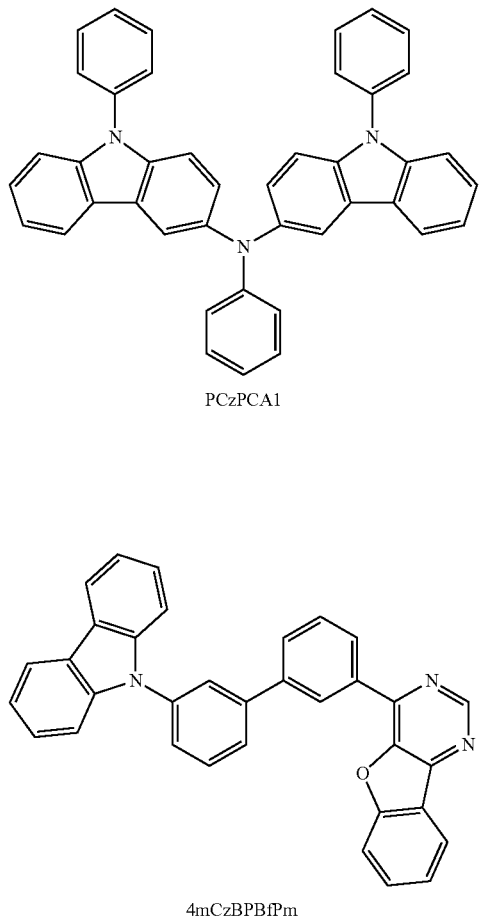

PCzPCA1

4mCzBPBfPm

TABLE 4

| | Layer | Reference numeral | Thickness (nm) | Material | Weight ratio |
|---|---|---|---|---|---|
| Light-emitting element 1 | Electrode | 1102 | 200 | Al | — |
| | Electron-injection layer | 1116 | 1 | LiF | — |
| | Electron-transport layer | 1115 | 15<br>10 | Bphen<br>4,6mCzP2Pm | —<br>— |
| | Light-emitting layer | 1113 | 40 | 4,6mCzP2Pm:Rubrene | 1:0.005 |
| | Hole-transport layer | 1112 | 20 | BPAFLP | — |
| | Hole-injection layer | 1111 | 20 | DBT3P-II:MoO$_3$ | 2:1 |
| | Electrode | 1101 | 110 | ITSO | — |
| Light-emitting element 2 | Electrode | 1102 | 200 | Al | — |
| | Electron-injection layer | 1116 | 1 | LiF | — |
| | Electron-transport layer | 1115 | 15<br>10 | Bphen<br>4,6mCzP2Pm | —<br>— |
| | Light-emitting layer | 1113 | 40 | 4,6mCzP2Pm:PCBBiF | 0.8:0.2 |

TABLE 4-continued

| | Layer | Reference numeral | Thickness (nm) | Material | Weight ratio |
|---|---|---|---|---|---|
| | Hole-transport layer | 1112 | 20 | BPAFLP | — |
| | Hole-injection layer | 1111 | 20 | DBT3P-II:MoOx | 2:1 |
| | Electrode | 1101 | 110 | ITSO | — |
| Light-emitting element 3 | Electrode | 1102 | 200 | Al | — |
| | Electron-injection layer | 1116 | 1 | LiF | — |
| | Electron-transport layer | 1115 | 15 | Bphen | — |
| | | | 10 | 4,6mCzP2Pm | — |
| | Light-emitting layer | 1113 | 40 | 4,6mCzP2Pm:PCBBiF:Rubrene | 0.8:0.2:0.005 |
| | Hole-transport layer | 1112 | 20 | BPAFLP | — |
| | Hole-injection layer | 1111 | 20 | DBT3P-II:MoO$_3$ | 2:1 |
| | Electrode | 1101 | 110 | ITSO | — |
| Light-emitting element 4 | Electrode | 1102 | 200 | Al | — |
| | Electron-injection layer | 1116 | 1 | LiF | — |
| | Electron-transport layer | 1115 | 15 | Bphen | — |
| | | | 10 | 4,6mCzP2Pm | — |
| | Light-emitting layer | 1113 | 40 | 4,6mCzP2Pm:PCBBiF:Rubrene | 0.8:0.2:0.01 |
| | Hole-transport layer | 1112 | 20 | BPAFLP | — |
| | Hole-injection layer | 1111 | 20 | DBT3P-II:MoO$_3$ | 2:1 |
| | Electrode | 1101 | 110 | ITSO | — |

TABLE 5

| | Layer | Reference numeral | Thickness (nm) | Material | Weight ratio |
|---|---|---|---|---|---|
| Light-emitting element 5 | Electrode | 1102 | 200 | Al | — |
| | Electron-injection layer | 1116 | 1 | LiF | — |
| | Electron-transport layer | 1115 | 10 | Bphen | — |
| | | | 20 | 4mCzBPBfPm | — |
| | Light-emitting layer | 1113 | 40 | 4mCzBPBfPm:PCzPCA1 | 0.8:0.2 |
| | Hole-transport layer | 1112 | 20 | BPAFLP | — |
| | Hole-injection layer | 1111 | 20 | DBT3P-II:MoO$_3$ | 2:1 |
| | Electrode | 1101 | 110 | ITSO | — |
| Light-emitting element 6 | Electrode | 1102 | 200 | Al | — |
| | Electron-injection layer | 1116 | 1 | LiF | — |
| | Electron-transport layer | 1115 | 10 | Bphen | — |
| | | | 20 | 4,6mCzP2Pm | — |
| | Light-emitting layer | 1113 | 40 | 4,6mCzP2Pm:PCzPCA1:Rubrene | 0.8:0.2:0.01 |

TABLE 5-continued

| Layer | | Reference numeral | Thickness (nm) | Material | Weight ratio |
|---|---|---|---|---|---|
| | Hole-transport layer | 1112 | 20 | BPAFLP | — |
| | Hole-injection layer | 1111 | 20 | DBT3P-II:MoO$_3$ | 2:1 |
| | Electrode | 1101 | 110 | ITSO | — |
| Light-emitting element 7 | Electrode | 1102 | 200 | Al | — |
| | Electron-injection layer | 1116 | 1 | LiF | — |
| | Electron-transport layer | 1115 | 10 20 | Bphen 4,6mCzP2Pm | — — |
| | Light-emitting layer | 1113 | 40 | 4,6mCzP2Pm:PCzPCA1 | 0.8:0.2 |
| | Hole-transport layer | 1112 | 20 | BPAFLP | — |
| | Hole-injection layer | 1111 | 20 | DBT3P-II:MoO$_3$ | 2:1 |
| | Electrode | 1101 | 110 | ITSO | — |

1-1. Method for Fabricating Light-Emitting Element 1

First, a film of indium tin oxide containing silicon oxide (abbreviation: ITSO) was formed as an electrode 1101 over a substrate 1100 by a sputtering method. Note that the thickness of the electrode 1101 was 110 nm, and the area of the electrode 1101 was 4 mm$^2$ (2 mm×2 mm).

Next, as pretreatment of evaporation of an organic compound layer, the electrode 1101 side of the substrate 1100 was washed with water, baking was performed at 200° C. for one hour, and then UV ozone treatment was performed on a surface of the electrode 1101 for 370 seconds.

After that, the substrate 1100 was transferred into a vacuum evaporation apparatus where the pressure had been reduced to approximately 1×10$^{-4}$ Pa, and was subjected to vacuum baking at 170° C. for 30 minutes in a heating chamber of the vacuum evaporation apparatus, and then the substrate 1100 was cooled down for about 30 minutes.

Next, the substrate 1100 was fixed to a holder in the vacuum evaporation apparatus so that a side on which the electrode 1101 was provided faced downward. In this example, a hole-injection layer 1111, a hole-transport layer 1112, a light-emitting layer 1113, an electron-transport layer 1115, an electron-injection layer 1116, and an electrode 1102 were sequentially formed by a vacuum evaporation method. The fabrication method will be described in detail below.

First, DBT3P-II and molybdenum oxide (abbreviation: MoO$_3$) were co-evaporated as the hole-injection layer 1111 over the electrode 1101 so that the weight ratio of DBT3P-II to molybdenum oxide was 2:1. Note that the thickness of the hole-injection layer 1111 was 20 nm.

Next, the hole-transport layer 1112 was formed over the hole-injection layer 1111. As the hole-transport layer 1112, BPAFLP was evaporated. Note that the thickness of the hole-transport layer 1112 was 20 nm.

Next, the light-emitting layer 1113 was formed over the hole-transport layer 1112. As the light-emitting layer 1113, 4,6mCzP2Pm and rubrene were co-evaporated so that the weight ratio of 4,6mCzP2Pm to rubrene was 1:0.005. Note that the thickness of the light-emitting layer 1113 was 40 nm. In the light-emitting layer 1113, 4,6mCzP2Pm is a host material and rubrene is a guest material.

Next, 4,6mCzP2Pm and bathophenanthroline (abbreviation: Bphen) were sequentially evaporated to thicknesses of 10 nm and 15 nm, respectively, as the electron-transport layer 1115 over the light-emitting layer 1113. Then, lithium fluoride (abbreviation: LiF) was evaporated to a thickness of 1 nm as the electron-injection layer 1116 over the electron-transport layer 1115.

Next, aluminum (Al) was evaporated as the electrode 1102 over the electron-injection layer 1116. Note that the thickness of the electrode 1102 was 200 nm.

The light-emitting element fabricated over the substrate 1100 as described above was sealed by being attached to a sealing substrate 1150 in a glove box in a nitrogen atmosphere so as not to be exposed to the air. Specifically, after a sealant was applied to surround the light-emitting element over the substrate 1100 and the substrate 1100 was attached to the sealing substrate 1150, irradiation with ultraviolet light having a wavelength of 365 nm at 6 J/cm$^2$ and heat treatment at 80° C. for one hour were performed.

Through the above process, the light-emitting element 1 was fabricated.

1-2. Method for Fabricating Light-Emitting Element 2

The light-emitting element 2 is different from the above-described light-emitting element 1 in the structure of the light-emitting layer 1113. The other components are the same as those of the light-emitting element 1.

As the light-emitting layer 1113 of the light-emitting element 2, 4,6mCzP2Pm and PCBBiF were co-evaporated so that the weight ratio of 4,6mCzP2Pm to PCBBiF was 0.8:0.2. Note that the thickness of the light-emitting layer 1113 was 40 nm. In the light-emitting layer 1113, 4,6mCzP2Pm is a host material and PCBBiF is an assist material.

1-3. Method for Fabricating Light-Emitting Element 3

The light-emitting element 3 is different from the above-described light-emitting element 1 in the structure of the light-emitting layer 1113. The other components are the same as those of the light-emitting element 1.

As the light-emitting layer 1113 of the light-emitting element 3, 4,6mCzP2Pm, PCBBiF, and rubrene were co-evaporated so that the weight ratio of 4,6mCzP2Pm to PCBBiF and rubrene was 0.8:0.2:0.005. Note that the thickness of the light-emitting layer 1113 was 40 nm. In the light-emitting layer 1113, 4,6mCzP2Pm is a host material, PCBBiF is an assist material, and rubrene is a guest material.

1-4. Method for Fabricating Light-Emitting Element 4

The light-emitting element 4 is different from the above-described light-emitting element 1 in the structure of the light-emitting layer 1113. The other components are the same as those of the light-emitting element 1.

As the light-emitting layer 1113 of the light-emitting element 4, 4,6mCzP2Pm, PCBBiF, and rubrene were co-evaporated so that the weight ratio of 4,6mCzP2Pm to PCBBiF and rubrene was 0.8:0.2:0.01. Note that the thickness of the light-emitting layer 1113 was 40 nm. In the light-emitting layer 1113, 4,6mCzP2Pm is a host material, PCBBiF is an assist material, and rubrene is a guest material. Note that the concentration of the guest material differs between the light-emitting element 3 and the light-emitting element 4.

1-5. Method for Fabricating Light-Emitting Element 5

The light-emitting element 5 is different from the above-described light-emitting element 1 in the structures of the light-emitting layer 1113 and the electron-transport layer 1115. The other components are the same as those of the light-emitting element 1.

As the light-emitting layer 1113 of the light-emitting element 5, 4-{3-[3'-(9H-carbazol-9-yl)]biphenyl-3-yl}benzofuro[3,2-d]pyrimidine (abbreviation: 4mCzBPBfPm) and 3-[N-(9-phenylcarbazol-3-yl)-N-phenylamino]-9-phenylcarbazole (abbreviation: PCzPCA1) were co-evaporated so that the weight ratio of 4mCzBPBfPm to PCzPCA1 was 0.8:0.2. Note that the thickness of the light-emitting layer 1113 was 40 nm. In the light-emitting layer 1113, 4mCzBPBfPm is a host material, and PCzPCA1 is an assist material.

As the electron-transport layer 1115 of the light-emitting element 5, 4mCzBPBfPm and Bphen were evaporated to thicknesses of 20 nm and 10 nm, respectively.

1-6. Method for Fabricating Light-Emitting Element 6

The light-emitting element 6 is different from the above-described light-emitting element 1 in the structures of the light-emitting layer 1113 and the electron-transport layer 1115. The other components are the same as those of the light-emitting element 1.

As the light-emitting layer 1113 of the light-emitting element 6, 4,6mCzP2Pm, PCzPCA1, and rubrene were co-evaporated so that the weight ratio of 4,6mCzP2Pm to PCzPCA1 and rubrene was 0.8:0.2:0.01. Note that the thickness of the light-emitting layer 1113 was 40 nm. In the light-emitting layer 1113, 4,6mCzP2Pm is a host material, PCzPCA1 is an assist material, and rubrene is a guest material.

As the electron-transport layer 1115 of the light-emitting element 6, 4,6mCzP2Pm and Bphen were evaporated to thicknesses of 20 nm and 10 nm, respectively.

1-7. Method for Fabricating Light-Emitting Element 7

The light-emitting element 7 is different from the above-described light-emitting element 1 in the structures of the light-emitting layer 1113 and the electron-transport layer 1115. The other components are the same as those of the light-emitting element 1.

As the light-emitting layer 1113 of the light-emitting element 7, 4,6mCzP2Pm and PCzPCA1 were co-evaporated so that the weight ratio of 4,6mCzP2Pm to PCzPCA1 was 0.8:0.2. Note that the thickness of the light-emitting layer 1113 was 40 nm. In the light-emitting layer 1113, 4,6mCzP2Pm is a host material and PCzPCA1 is an assist material.

As the electron-transport layer 1115 of the light-emitting element 7, 4,6mCzP2Pm and Bphen were evaporated to thicknesses of 20 nm and 10 nm, respectively.

Note that in all the above evaporation steps for the light-emitting elements 1 to 7, a resistive heating method was used as an evaporation method.

1-8. Characteristics of Light-Emitting Elements 1 to 7

FIGS. 17, 19, 21, 23, and 25 show luminance-current density characteristics, luminance-voltage characteristics, current efficiency-luminance characteristics, current-voltage characteristics, and external quantum efficiency-luminance characteristics, respectively, of the light-emitting elements 1 to 4. FIGS. 18, 20, 22, 24, and 26 show luminance-current density characteristics, luminance-voltage characteristics, current efficiency-luminance characteristics, current-voltage characteristics, and external quantum efficiency-luminance characteristics, respectively, of the light-emitting elements 5 to 7. Note that the measurements of the light-emitting elements were carried out at room temperature (in an atmosphere kept at 25° C.).

Table 6 shows element characteristics of the light-emitting elements 1 to 7 at maximum external quantum efficiencies.

TABLE 6

| | Voltage (V) | Current density (mA/cm$^2$) | Chromaticity (x, y) | Luminance (cd/m$^2$) | Current efficiency (cd/A) | External quantum efficiency (%) |
|---|---|---|---|---|---|---|
| Light-emitting element 1 | 2.6 | 0.014 | (0.48, 0.51) | 2.1 | 15 | 4.6 |
| Light-emitting element 2 | 2.4 | 0.0077 | (0.35, 0.58) | 4.1 | 53 | 17 |
| Light-emitting element 3 | 2.5 | 0.039 | (0.44, 0.54) | 12 | 31 | 8.9 |
| Light-emitting element 4 | 2.5 | 0.043 | (0.48, 0.51) | 9.9 | 23 | 6.8 |

TABLE 6-continued

| | Voltage (V) | Current density (mA/cm$^2$) | Chromaticity (x, y) | Luminance (cd/m$^2$) | Current efficiency (cd/A) | External quantum efficiency (%) |
|---|---|---|---|---|---|---|
| Light-emitting element 5 | 2.9 | 0.89 | (0.48, 0.51) | 290 | 32 | 11 |
| Light-emitting element 6 | 3.2 | 0.65 | (0.49, 0.50) | 200 | 31 | 9.4 |
| Light-emitting element 7 | 2.8 | 0.20 | (0.47, 0.52) | 69 | 34 | 11 |

Figure 27:
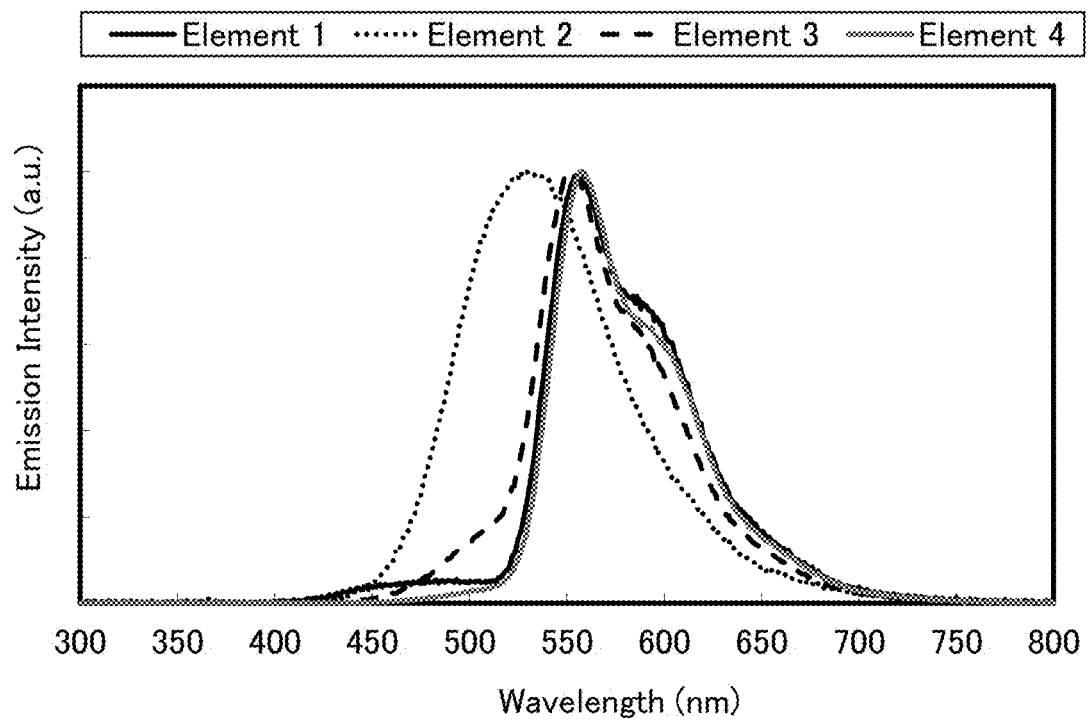
FIG. 27 shows electroluminescence spectra of the light-emitting elements 1 to 4 in the example.
Figure 28:
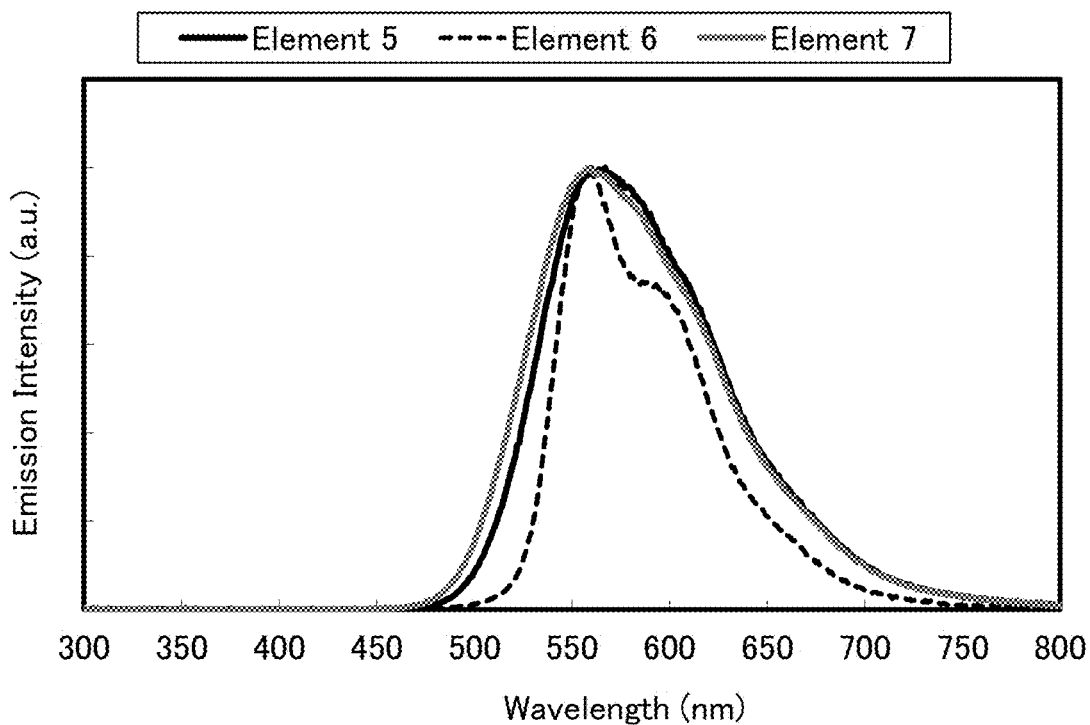
FIG. 28 shows electroluminescence spectra of the light-emitting elements 5 to 7 in the example.

FIG. 27 shows the electroluminescence spectra of the light-emitting elements 1 to 4 through which current flows at a current density of 2.5 mA/cm$^2$. FIG. 28 shows the electroluminescence spectra of the light-emitting elements 5 to 7 through which current flows at a current density of 2.5 mA/cm$^2$.

Note that the emission spectra of a thin film of 4,6mCzP2Pm alone and a thin film of PCBBiF alone were measured and found to have peaks at wavelengths of 439 nm and 436 nm, respectively. Meanwhile, as shown in FIG. 27, the electroluminescence spectrum of the light-emitting element 2 has a peak at a wavelength of 527 nm. That is, the electroluminescence spectrum of the light-emitting element 2 differs from the emission spectra of 4,6mCzP2Pm and PCBBiF, and corresponds to light emission which is exhibited by an exciplex formed by 4,6mCzP2Pm and PCBBiF.

The emission spectra of a thin film of 4mCzBPBfPm alone and a thin film of PCzPCA1 alone were measured and found to have peaks at wavelengths of 440 nm and 443 nm, respectively.

Meanwhile, as shown in FIG. 28, the electroluminescence spectrum of the light-emitting element 5 has a peak at a wavelength of 567 nm. That is, the electroluminescence spectrum of the light-emitting element 5 differs from the emission spectra of 4mCzBPBfPm and PCzPCA1, and corresponds to light emission which is exhibited by an exciplex formed by 4mCzBPBfPm and PCzPCA1. As shown in FIG. 28, the electroluminescence spectrum of the light-emitting element 7 has a peak at a wavelength of 558 nm. That is, the electroluminescence spectrum of the light-emitting element 7 differs from the emission spectra of 4,6mCzP2Pm and PCzPCA1, and corresponds to light emission which is exhibited by an exciplex formed by 4,6mCzP2Pm and PCzPCA1.

As shown in FIGS. 27 and 28, the light-emitting elements 1, 3, 4, and 6 show emission spectra exhibited by rubrene that is a guest material and have electroluminescence spectrum peaks at wavelengths of 557 nm, 553 nm, 559 nm, and 557 nm, respectively. Therefore, it is found that the light-emitting element 2 has high emission energy owing to its emission peak at a wavelength shorter than those of the light-emitting elements 3 and 4 and that the exciplex formed by 4,6mCzP2Pm and PCBBiF can be used as a host material in a light-emitting element which contains rubrene as a guest material. It can be said that the light-emitting elements 6 and 7 have comparable emission energy because they show emission peaks at substantially the same wavelengths; the electroluminescence spectra of the light-emitting elements 6 and 7 suggest that the exciplex formed by 4,6mCzP2Pm and PCzPCA1 can be used as a host material in a light-emitting element which contains rubrene as a guest material.

Phosphorescence spectra of 4,6mCzP2Pm, PCBBiF, and PCzPCA1 were measured and found to have peaks on the shortest wavelength side at wavelengths of 459 nm, 509 nm, and 495 nm, respectively, and phosphorescence emission energies calculated from the peak wavelengths were 2.70 eV, 2.44 eV, and 2.51 eV, respectively. Note that the phosphorescence spectra were measured using the method described in Embodiment 1. Note that an exciplex has a feature of having a singlet excitation energy level and a triplet excitation energy level that are close to each other; thus, the phosphorescence spectrum of an exciplex is regarded as being the same as the fluorescence spectrum (thermally activated delayed fluorescence spectrum).

As described in Embodiment 1, rubrene has a calculated triplet excitation energy level of 0.95 eV.

According to the above results, the phosphorescence spectra of 4,6mCzP2Pm and PCBBiF have peaks at shorter wavelengths than the phosphorescence spectrum of the exciplex formed by these materials, and the triplet excitation energy levels of 4,6mCzP2Pm and PCBBiF are higher than the triplet excitation energy level of the exciplex formed by these materials. The triplet excitation energy level of the exciplex is higher than the triplet excitation energy level of rubrene that is a guest material. Furthermore, the phosphorescence spectra of 4,6mCzP2Pm and PCzPCA1 have peaks at shorter wavelengths than the emission spectrum of the exciplex formed by these materials, and the triplet excitation energy levels of 4,6mCzP2Pm and PCBBiF are higher than the triplet excitation energy level of the exciplex formed by these materials. The triplet excitation energy level of the exciplex is higher than the triplet excitation energy level of rubrene that is a guest material. Therefore, 4,6mCzP2Pm, PCBBiF, and PCzPCA1 are suitable for a host material of a light-emitting element of one embodiment of the present invention.

As shown in FIGS. 17 to 26 and Table 6, the maximum external quantum efficiency of the light-emitting element 1 is 4.6%; the maximum external quantum efficiency of the light-emitting element 2 is 17%; the maximum external quantum efficiency of the light-emitting element 3 is 8.9%; the maximum external quantum efficiency of the light-emitting element 4 is 6.8%; the maximum external quantum efficiency of the light-emitting element 5 is 11%; the maximum external quantum efficiency of the light-emitting element 6 is 9.4%; and the maximum external quantum efficiency of the light-emitting element 7 is 11%.

Although the light-emitting elements 2, 5, and 7 have high maximum external quantum efficiencies, a phenomenon in which efficiency drastically drops in a high-luminance region (also referred to as roll-off) is caused. In contrast, the light-emitting elements 3, 4, and 6 of one embodiment of the present invention have higher maximum external quantum efficiencies than the light-emitting element 1, and show suppressed roll-off unlike in the light-emitting elements 2, 5, and 7. This is an excellent advantageous effect that can be achieved only by ExSET of one embodiment of the present invention.

Figure 29:
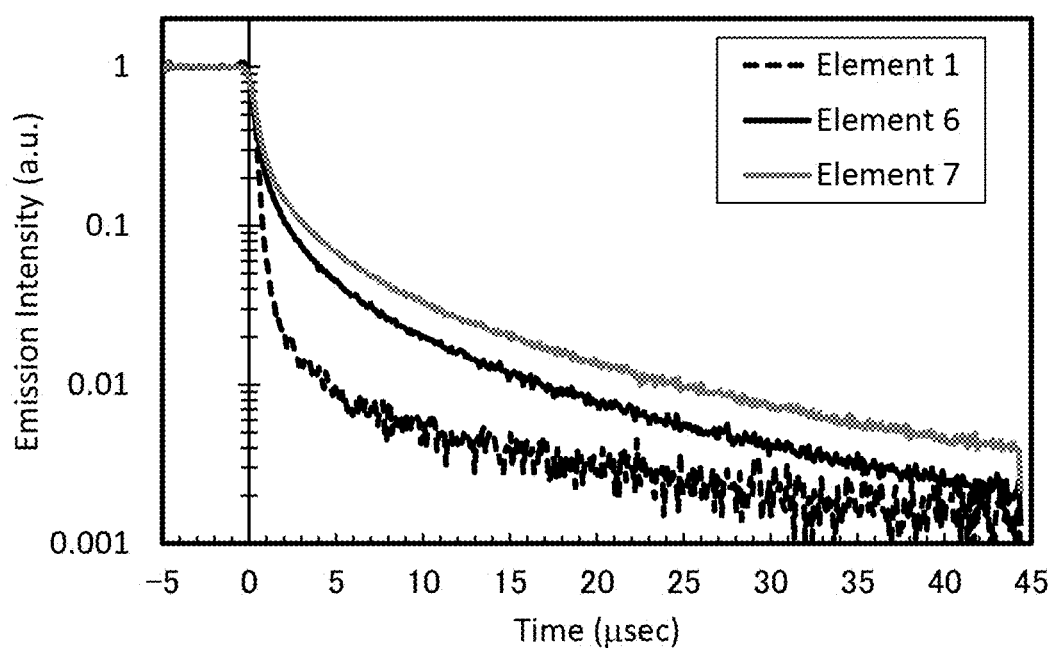
FIG. 29 shows transient EL characteristics of the light-emitting elements 1, 6, and 7 in the example.
Figure 30:
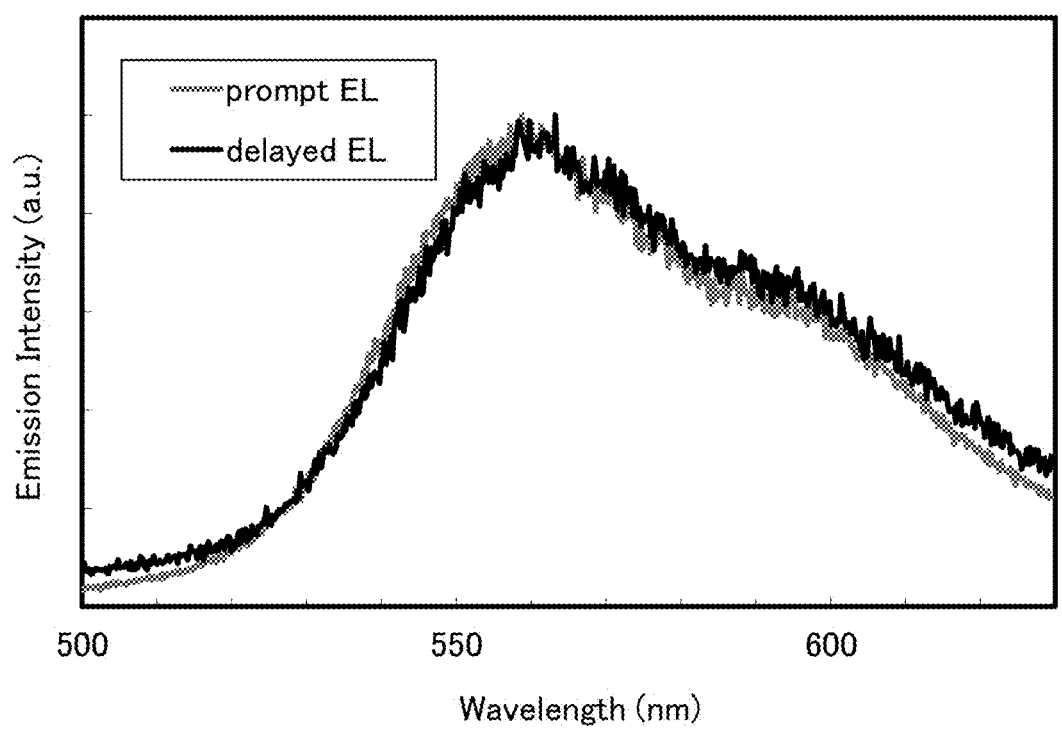
FIG. 30 shows a transient EL spectrum of the light-emitting element 6 in the example.
Figure 31:
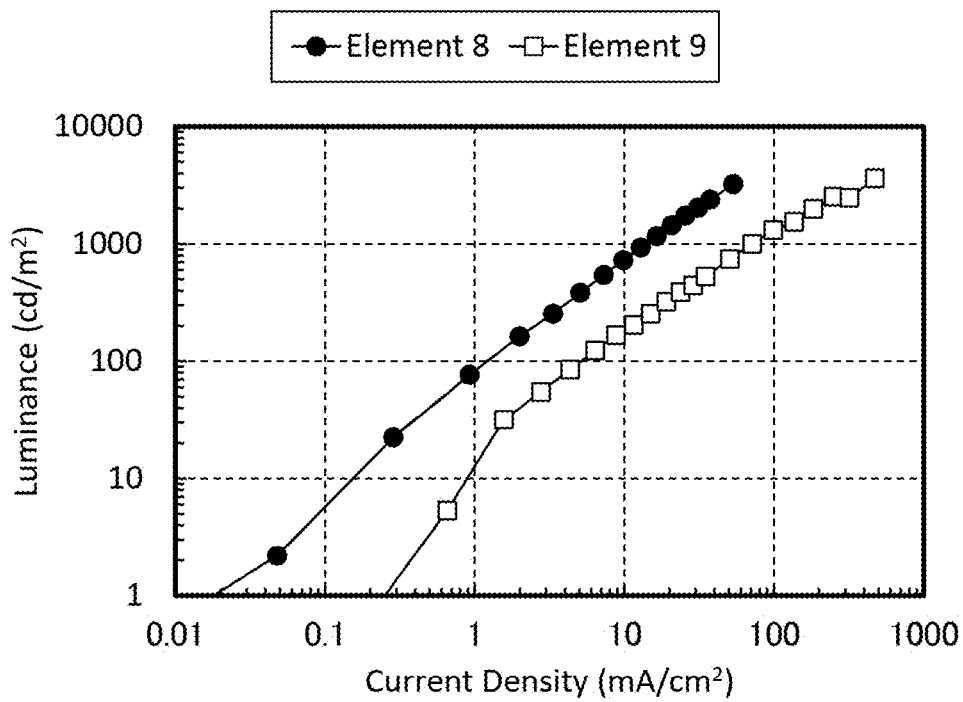
FIG. 31 shows luminance-current density characteristics of light-emitting elements 8 and 9 in an example.
Figure 32:
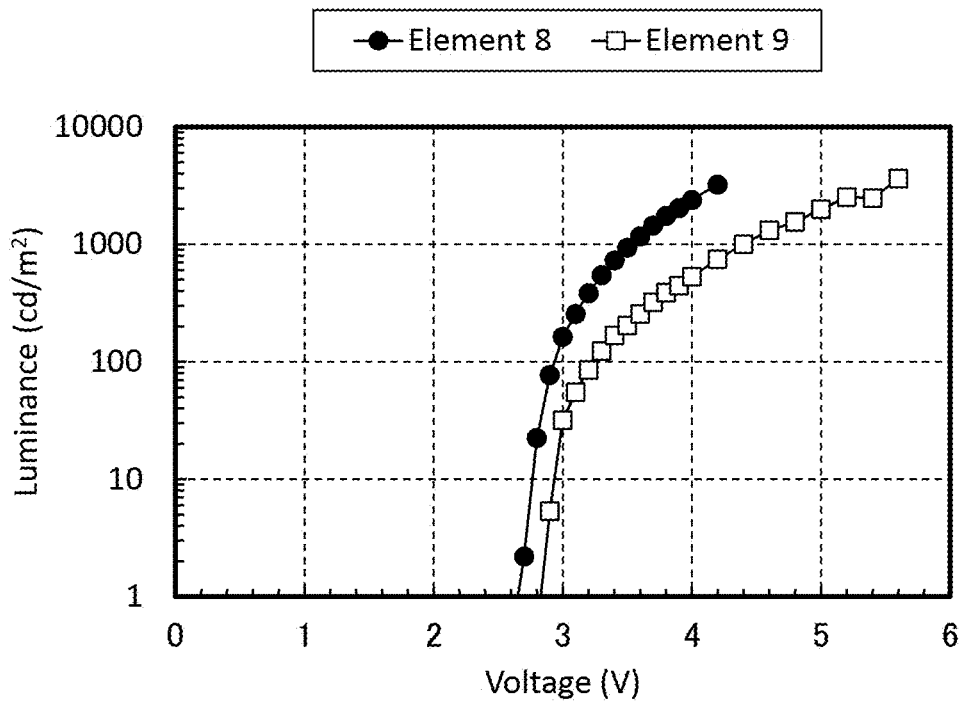
FIG. 32 shows luminance-voltage characteristics of the light-emitting elements 8 and 9 in the example.
Figure 33:
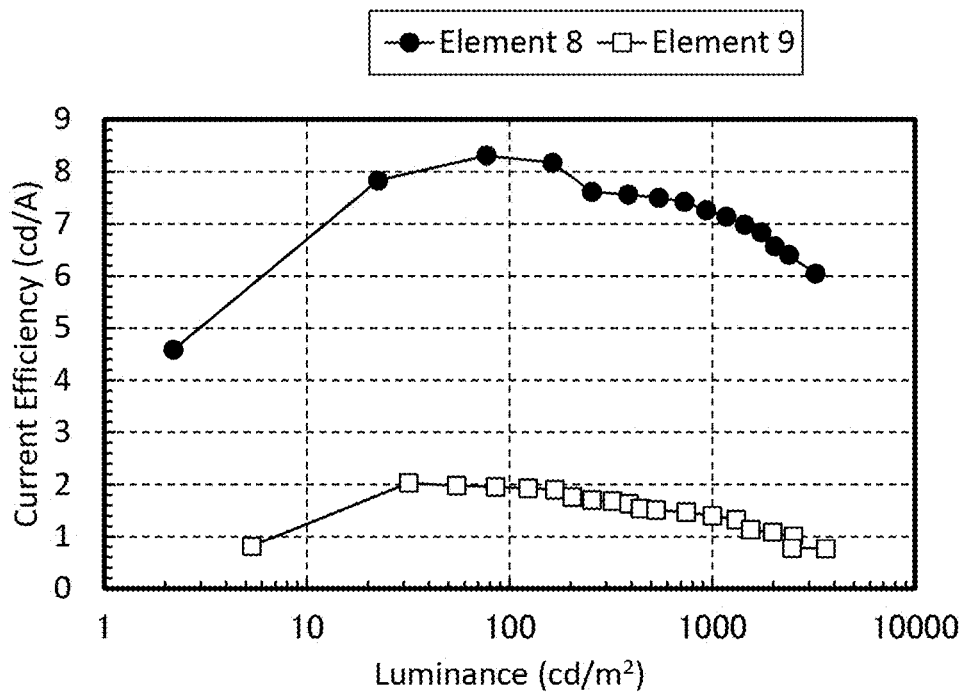
FIG. 33 shows current efficiency-luminance characteristics of the light-emitting elements 8 and 9 in the example.
Figure 34:
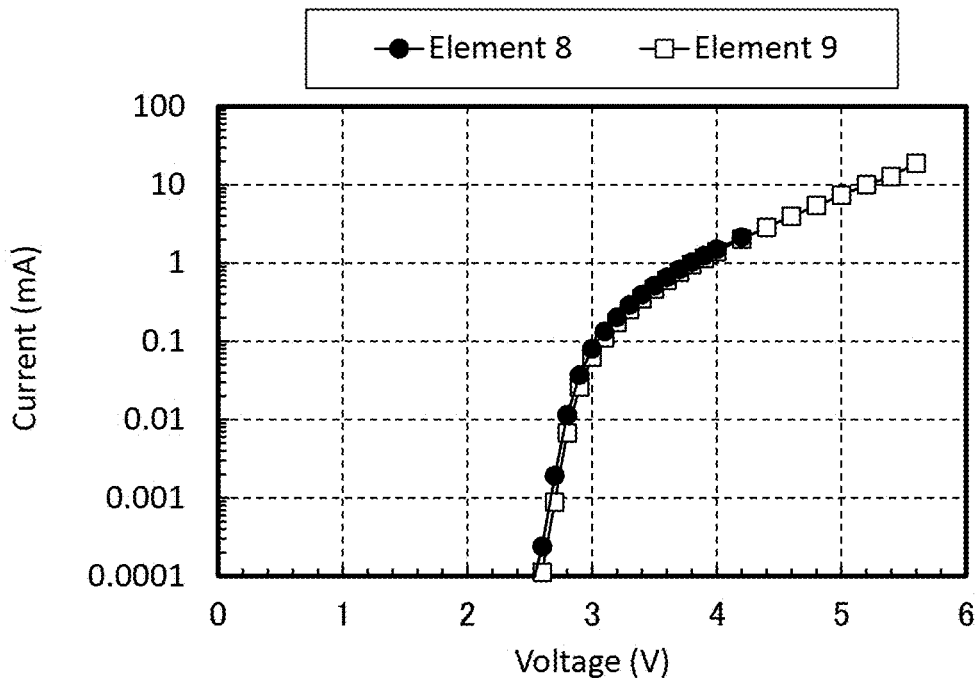
FIG. 34 shows current-voltage characteristics of the light-emitting elements 8 and 9 in the example.
Figure 35:
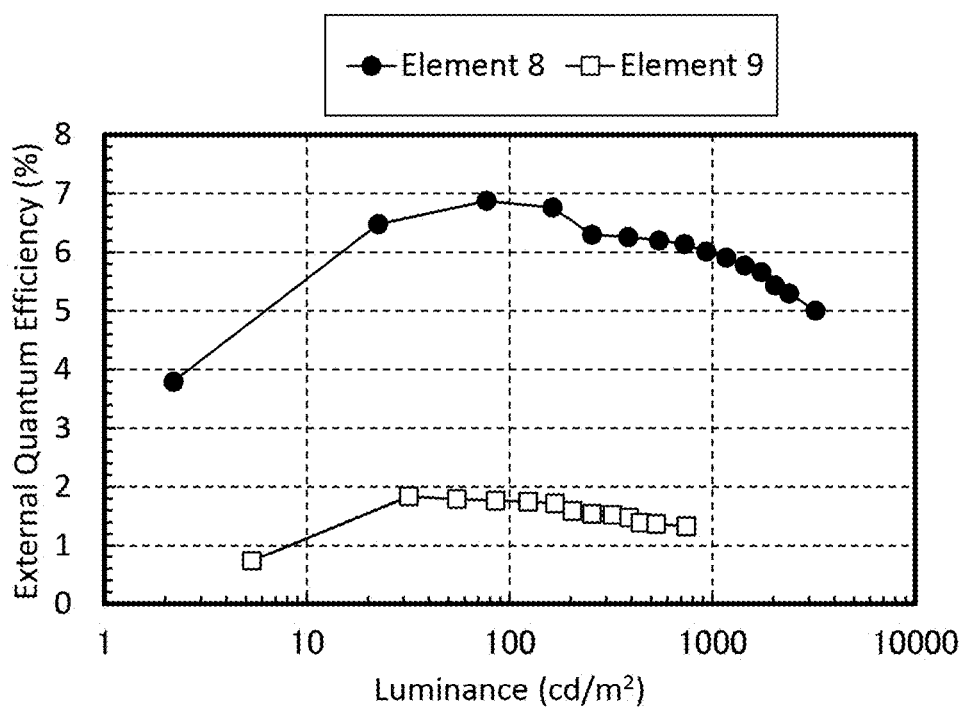
FIG. 35 shows external quantum efficiency-luminance characteristics of the light-emitting elements 8 and 9 in the example.

As shown in FIGS. 17 to 26 and Table 6, a comparison between the light-emitting elements 3, 4, and 6 of one embodiment of the present invention reveals that the light-emitting element 6 exhibits high emission efficiency, especially a high maximum external quantum efficiency of 9.4%, and has excellent characteristics. Then, transient EL measurement was performed on the light-emitting elements 1, 6, and 7 to examine whether the light-emitting element 6 utilizes ExSET. FIG. 29 shows the transient EL characteristics of the light-emitting elements 1, 6, and 7. FIG. 30 shows the transient EL spectrum of the light-emitting element 6.

1-9. Measurement of Transient EL Spectra of Light-Emitting Elements 1, 6, and 7

A picosecond fluorescence lifetime measurement system (manufactured by Hamamatsu Photonics K.K.) was used for the measurement. In this measurement, the transient EL characteristics of the light-emitting elements were measured as follows. A square wave pulse voltage was applied to the light-emitting element, and light which was attenuated from the falling of the voltage underwent time-resolved measurement using a streak camera. The measurement was performed at room temperature (25° C.).

In FIG. 29, the vertical axis represents emission intensity normalized to that in a state where carriers were steadily injected (when the pulse voltage is ON). The horizontal axis represents time elapsed after the folling of the pulse voltage.

It is found from the transient EL characteristics shown in FIG. 29 that the light-emitting elements 6 and 7 each have a longer lifetime than the light-emitting element 1 and exhibit delayed fluorescence based on reverse intersystem crossing.

In FIG. 30, prompt EL refers to a prompt component of the measured transient EL spectrum, and delayed EL refers to a delayed component. Note that the prompt component is an emission component during voltage application, and the delayed component is an emission component at 8 us to 45 us after voltage application.

As shown in FIG. 30, both the prompt and delayed EL spectra are roughly in accordance with the emission spectrum of rubrene that is a guest material. Thus, it is suggested that the energies of prompt excitons of $S_E$ (singlet excitons directly generated by recombination of injected carriers) and delayed excitons of $S_E$ generated by reverse intersystem crossing (singlet excitons generated by reverse intersystem crossing of triplet exitons) are both transferred to the $S_G$ of rubrene and contribute to light emission.

As described above, it has been confirmed that a light-emitting element of one embodiment of the present invention utilizes ExSET and therefore has high emission efficiency.

The structure described above in this example can be combined with any of the structures described in the other examples and embodiments as appropriate.

Example 2

In this example, an example of fabricating a light-emitting element of one embodiment of the present invention and a comparative light-emitting element will be described. Note that light-emitting elements 8 and 9 were fabricated in this example.

The light-emitting element 8 is a light-emitting element of one embodiment of the present invention which utilizes ExSET, and the light-emitting element 9 is a reference light-emitting element which utilizes exciplex emission. FIG. 16 is a schematic cross-sectional view of each of the light-emitting elements 8 and 9, and Table 7 shows details of the element structure. In addition, structures and abbreviations of compounds used here are given below. Except the compounds given below, compounds similar to those described in Example 1 were used.

[Chemical Formula 6]

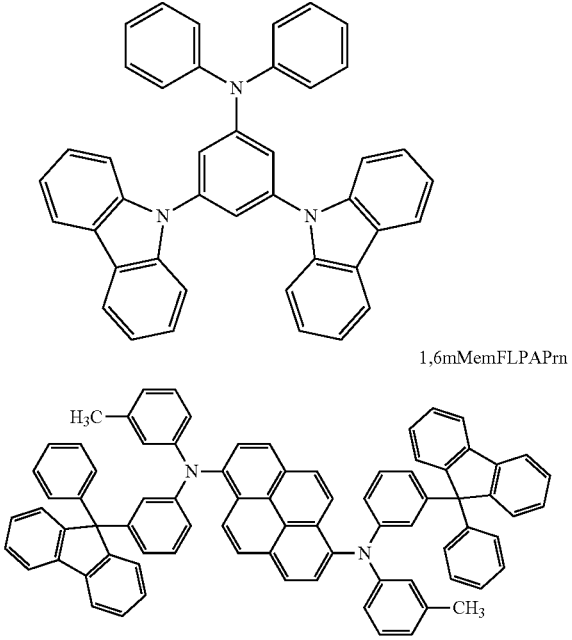

DPhAmCP 1,6mMemFLPAPrn

TABLE 7

| | Layer | Reference numeral | Thickness (nm) | Material | Weight ratio |
|---|---|---|---|---|---|
| Light-emitting element 8 | Electrode | 1102 | 200 | Al | — |
| | Electron-injection layer | 1116 | 1 | LiF | — |
| | Electron-transport layer | 1115 | 15 | Bphen | — |
| | | | 10 | 4mCzBPBfPm | — |
| | Light-emitting layer | 1113 | 30 | 4mCzBPBfPm:DPhAmCP:1,6mMemFLPAPrn | 0.8:0.2:0.005 |
| | Hole-transport layer | 1112 | 20 | DPhAmCP | — |
| | Hole-injection layer | 1111 | 15 | DBT3P-II:MoO$_3$ | 2:1 |

TABLE 7-continued

| Layer | | Reference numeral | Thickness (nm) | Material | Weight ratio |
|---|---|---|---|---|---|
| | Electrode | 1101 | 70 | ITSO | — |
| Light-emitting element 9 | Electrode | 1102 | 200 | Al | — |
| | Electron-injection layer | 1116 | 1 | LiF | — |
| | Electron-transport layer | 1115 | 15 10 | Bphen 4mCzBPBfPm | — — |
| | Light-emitting layer | 1113 | 30 | 4mCzBPBfPm:DPhAmCP | 0.8:0.2 |
| | Hole-transport layer | 1112 | 20 | DPhAmCP | — |
| | Hole-injection layer | 1111 | 15 | DBT3P-II:MoO$_3$ | 2:1 |
| | Electrode | 1101 | 70 | ITSO | — |

2-1. Method for Fabricating Light-Emitting Element 8

First, a film of ITSO was formed as an electrode 1101 over a substrate 1100 by a sputtering method. Note that the thickness of the electrode 1101 was 70 nm, and the area of the electrode 1101 was 4 mm$^2$ (2 mm×2 mm).

Next, as pretreatment of evaporation of an organic compound layer, the electrode 1101 side of the substrate 1100 was washed with water, baking was performed at 200° C. for one hour, and then UV ozone treatment was performed on a surface of the electrode 1101 for 370 seconds.

After that, the substrate 1100 was transferred into a vacuum evaporation apparatus where the pressure had been reduced to approximately 1×10$^{-4}$ Pa, and was subjected to vacuum baking at 170° C. for 30 minutes in a heating chamber of the vacuum evaporation apparatus, and then the substrate 1100 was cooled down for about 30 minutes.

Next, the substrate 1100 was fixed to a holder in the vacuum evaporation apparatus so that a side on which the electrode 1101 was provided faced downward. In this example, a hole-injection layer 1111, a hole-transport layer 1112, a light-emitting layer 1113, an electron-transport layer 1115, an electron-injection layer 1116, and an electrode 1102 were sequentially formed by a vacuum evaporation method. The fabrication method will be described in detail below.

First, DBT3P-II and molybdenum oxide were co-evaporated as the hole-injection layer 1111 over the electrode 1101 so that the weight ratio of DBT3P-II to molybdenum oxide was 2:1. Note that the thickness of the hole-injection layer 1111 was 15 nm.

Next, the hole-transport layer 1112 was formed over the hole-injection layer 1111. As the hole-transport layer 1112, 3,5-di(carbazol-9-yl)-N,N-diphenylaniline (abbreviation: DPhAmCP) was evaporated. Note that the thickness of the hole-transport layer 1112 was 20 nm.

Next, the light-emitting layer 1113 was formed over the hole-transport layer 1112. As the light-emitting layer 1113, 4mCzBPBfPm, DPhAmCP, and 1,6mMemFLPAPrn were co-evaporated so that the weight ratio of 4mCzBPBfPm to DPhAmCP and 1,6mMemFLPAPrn was 0.8:0.2:0.005. Note that the thickness of the light-emitting layer 1113 was 30 nm. In the light-emitting layer 1113, 4mCzBPBfPm is a host material, DPhAmCP is an assist material, and 1,6mMemFLPAPrn is a guest material.

Next, 4mCzBPBfPm and Bphen were sequentially evaporated to thicknesses of 10 nm and 15 nm, respectively, as the electron-transport layer 1115 over the light-emitting layer 1113. Then, LiF was evaporated to a thickness of 1 nm as the electron-injection layer 1116 over the electron-transport layer 1115.

Next, Al was evaporated as the electrode 1102 over the electron-injection layer 1116. Note that the thickness of the electrode 1102 was 200 nm.

The light-emitting element fabricated over the substrate 1100 as described above was sealed by being attached to a sealing substrate 1150 in a glove box in a nitrogen atmosphere so as not to be exposed to the air. Note that the sealing method is similar to that for the light-emitting element 1 described in Example 1.

Through the above process, the light-emitting element 8 was fabricated.

2-2. Method for Fabricating Light-Emitting Element 9

The light-emitting element 9 is different from the above-described light-emitting element 8 in the structure of the light-emitting layer 1113. The other components are the same as those of the light-emitting element 8.

As the light-emitting layer 1113 of the light-emitting element 9, 4mCzBPBfPm and DPhAmCP were co-evaporated so that the weight ratio of 4mCzBPBfPm to DPhAmCP was 0.8:0.2. Note that the thickness of the light-emitting layer 1113 was 40 nm. In the light-emitting layer 1113, 4mCzBPBfPm is a host material and DPhAmCP is an assist material.

Note that in all the above evaporation steps for the light-emitting elements 8 and 9, a resistive heating method was used as an evaporation method.

2-3. Characteristics of Light-Emitting Elements 8 and 9

FIGS. 31, 32, 33, 34, and 35 show luminance-current density characteristics, luminance-voltage characteristics, current efficiency-luminance characteristics, current-voltage characteristics, and external quantum efficiency-luminance characteristics, respectively, of the light-emitting elements 8 and 9. Note that the measurements of the light-emitting elements were carried out at room temperature (in an atmosphere kept at 25° C.).

Table 8 shows element characteristics of the light-emitting elements 8 and 9 at maximum external quantum efficiencies.

TABLE 8

| | Voltage (V) | Current density (mA/cm$^2$) | Chromaticity (x, y) | Luminance (cd/m$^2$) | Current efficiency (cd/A) | External quantum efficiency (%) |
|---|---|---|---|---|---|---|
| Light-emitting element 8 | 2.9 | 0.92 | (0.14, 0.17) | 77 | 8.3 | 6.9 |
| Light-emitting element 9 | 3.0 | 1.6 | (0.15, 0.14) | 32 | 2.0 | 1.8 |

Figure 36:
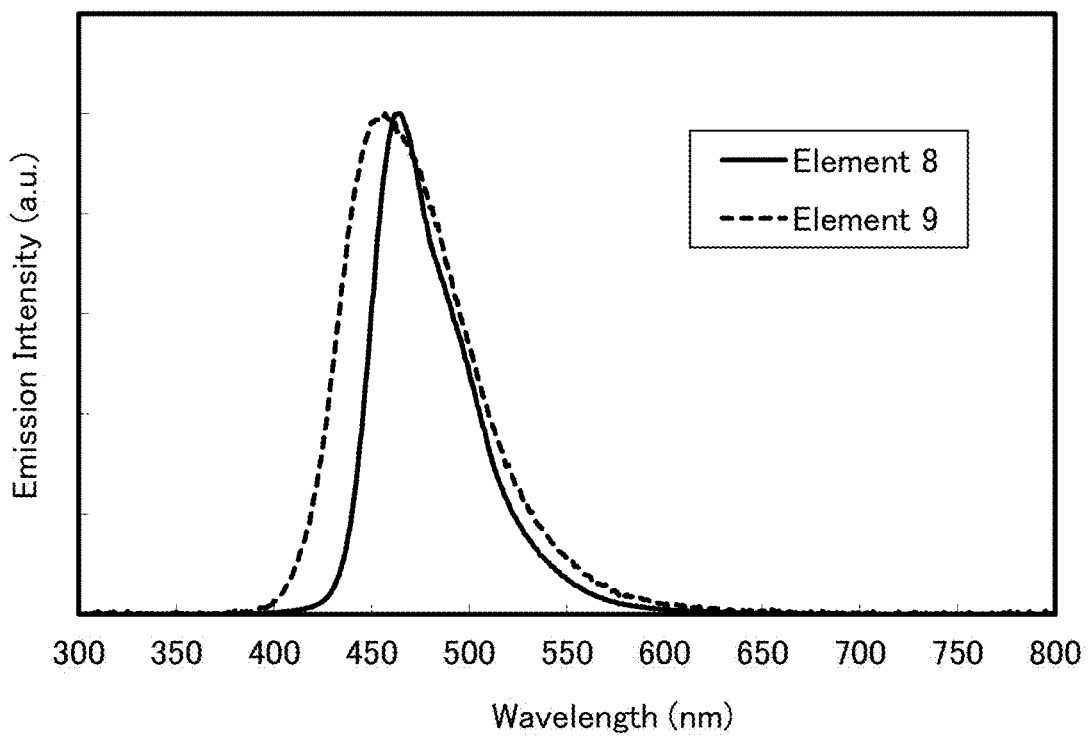
FIG. 36 shows electroluminescence spectra of the light-emitting element 8 and 9 in the example.

FIG. 36 shows the electroluminescence spectra of the light-emitting elements 8 and 9 through which current flows at a current density of 2.5 mA/cm$^2$.

As shown in FIG. 36, the light-emitting elements 8 and 9 have electroluminescence spectra in a blue wavelength range. Note that emission spectra of a thin film of 4mCzBPBfPm used as a host material and a thin film of DPhAmCP used as an assist material in the light-emitting elements 8 and 9 were measured and found to have peaks at wavelengths of 440 nm and 375 nm, respectively. Meanwhile, the electroluminescence spectrum of the light-emitting element 9 has a peak at a wavelength of 457 nm. That is, the electroluminescence spectrum of the light-emitting element 9 differs from the emission spectra of 4mCzBPBfPm and DPhAmCP, and corresponds to light emission which is exhibited by an exciplex formed by 4mCzBPBfPm and DPhAmCP.

The electroluminescence spectrum of the light-emitting element 8 has a peak at a wavelength of 465 nm and corresponds to the emission spectrum exhibited by 1,6mMemFLPAPrn that is a guest material. No light emission exhibited by the exciplex formed by 4mCzBPBfPm and DPhAmCP is observed. It is found that the light-emitting element 9 has high emission energy owing to its emission peak at a wavelength shorter than that of the light-emitting element 8. Accordingly, it can be said that excitation energy of the exciplex formed in the light-emitting element 8 is efficiently transferred to the guest material.

That is, a compound which has a condensed heterocyclic skeleton having a diazine skeleton, such as 4mCzBPBfPm, can be suitably used in a blue light-emitting element. In addition, a compound in which an aromatic amine skeleton is bonded to the 9-position of a carbazole skeleton, such as DPhAmCP, can be suitably used in a blue light-emitting element. Furthermore, an exciplex formed by the compound which has a condensed heterocyclic skeleton having a diazine skeleton, such as 4mCzBPBfPm, and the compound in which an aromatic amine skeleton is bonded to the 9-position of a carbazole skeleton, such as DPhAmCP, can be suitably used as a host material in a blue light-emitting element.

As shown in FIGS. 31 to 35 and Table 8, the light-emitting element 8 of one embodiment of the present invention exhibits high emission efficiency, especially a high maximum external quantum efficiency of 6.9%, as a blue light-emitting element. In addition, the light-emitting element 8 shows suppressed roll-off in a high-luminance region. This is an excellent advantageous effect that can be achieved only by ExSET of one embodiment of the present invention.

As described above, it has been confirmed that a light-emitting element of one embodiment of the present invention utilizes ExSET and therefore has high emission efficiency.

The structure described above in this example can be combined with any of the structures described in the other examples and embodiments as appropriate.

This application is based on Japanese Patent Application serial no. 2014-175163 filed with Japan Patent Office on Aug. 29, 2014, Japanese Patent Application serial no. 2014-240985 filed with Japan Patent Office on Nov. 28, 2014, and Japanese Patent Application serial no. 2015-108786 filed with Japan Patent Office on May 28, 2015, the entire contents of which are hereby incorporated by reference.

What is claimed is:

1. A light-emitting device comprising:
    a first electrode;
    a light-emitting layer over the first electrode, the light-emitting layer comprising:
        a first compound capable of exhibiting thermally activated delayed fluorescence at room temperature, and
        a second compound; and
        a light-emitting material capable of exhibiting fluorescence,
    a second electrode over the light-emitting layer,
    wherein the first compound comprises a condensed heterocyclic ring having three six-membered rings,
    wherein the light-emitting material comprises an anthracene ring,
    wherein a triplet excitation energy level of the first compound is higher than a triplet excitation energy level of the light-emitting material,
    wherein a singlet excitation energy level of the first compound is higher than a singlet excitation energy level of the light-emitting material,
    wherein an emission spectrum of the first compound comprises a region overlapping with an absorption band having a longest wavelength in an absorption spectrum of the light-emitting material, and
    wherein light emitted from the light-emitting layer comprises light emitted from the light-emitting material.

2. The light-emitting device according to claim 1, wherein the light emitted from the light-emitting layer further comprises light emitted from the first compound.

3. The light-emitting device according to claim 1, wherein the condensed heterocyclic ring comprises nitrogen.

4. The light-emitting device according to claim 1, wherein the condensed heterocyclic ring comprises oxygen.

5. The light-emitting device according to claim 1, further comprising a charge-generation layer over the light-emitting layer, and a first light-emitting unit over the charge-generation layer,
    wherein the light-emitting layer is included in a second light-emitting unit.

6. The light-emitting device according to claim 1, wherein a difference between the singlet excitation energy level and the triplet excitation energy level of the first compound is more than 0 eV and less than or equal to 0.2 eV.

7. An electronic device comprising the light-emitting device according to claim 1.

8. A light-emitting device comprising:
    a first electrode;
    a first light-emitting layer over the first electrode, the light-emitting layer comprising:

a first compound capable of exhibiting thermally activated delayed fluorescence at room temperature, and
a second compound; and
a light-emitting material capable of exhibiting fluorescence,
a second electrode over the first light-emitting layer,
wherein the first compound comprises an acridine skeleton,
wherein the light-emitting material comprises an anthracene ring,
wherein a triplet excitation energy level of the first compound is higher than a triplet excitation energy level of the light-emitting material,
wherein a singlet excitation energy level of the first compound is higher than a singlet excitation energy level of the light-emitting material,
wherein an emission spectrum of the first compound comprises a region overlapping with an absorption band having a longest wavelength in an absorption spectrum of the light-emitting material, and
wherein light emitted from the first light-emitting layer comprises light emitted from the light-emitting material.

9. The light-emitting device according to claim 8, wherein a difference between the singlet excitation energy level and the triplet excitation energy level of the first compound is more than 0 eV and less than or equal to 0.2 eV.

10. The light-emitting device according to claim 8,
wherein the light-emitting device comprises a first light-emitting unit comprising the first light-emitting layer, a charge-generation layer over the first light-emitting unit, and a second light-emitting unit comprising a second light-emitting layer.

11. The light-emitting device according to claim 10, wherein the second light-emitting layer has a same structure as the first light-emitting layer.

12. The light-emitting device according to claim 8, wherein the light emitted from the first light-emitting layer further comprises light emitted from the first compound.

13. An electronic device comprising the light-emitting device according to claim 8.

14. A light-emitting device comprising:
a first electrode;
a light-emitting layer over the first electrode, the light-emitting layer comprising:
a first compound capable of exhibiting thermally activated delayed fluorescence at room temperature, and
a second compound; and
a light-emitting material capable of exhibiting fluorescence,
a second electrode over the light-emitting layer,
wherein the first compound comprises a π-electron rich heteroaromatic ring and a π-electron deficient heteroaromatic ring,
wherein the light-emitting material comprises an anthracene ring,
wherein a triplet excitation energy level of the first compound is higher than a triplet excitation energy level of the light-emitting material,
wherein a singlet excitation energy level of the first compound is higher than a singlet excitation energy level of the light-emitting material,
wherein an emission spectrum of the first compound comprises a region overlapping with an absorption band having a longest wavelength in an absorption spectrum of the light-emitting material, and
wherein light emitted from the light-emitting layer comprises light emitted from the light-emitting material.

15. The light-emitting device according to claim 14, wherein the π-electron deficient heteroaromatic ring is a triazine ring or a triazole ring.

16. The light-emitting device according to claim 14, wherein the light emitted from the light-emitting layer further comprises light emitted from the first compound.

17. The light-emitting device according to claim 14, wherein the π-electron rich heteroaromatic ring and the π-electron deficient heteroaromatic ring are directly bonded to each other.

18. The light-emitting device according to claim 14, wherein a difference between the singlet excitation energy level and the triplet excitation energy level of the first compound is more than 0 eV and less than or equal to 0.2 eV.

19. An electronic device comprising the light-emitting device according to claim 14.

* * * * *